US008530897B2

(12) United States Patent
Koyama et al.

(10) Patent No.: US 8,530,897 B2
(45) Date of Patent: Sep. 10, 2013

(54) DISPLAY DEVICE INCLUDING AN INVERTER CIRCUIT HAVING A MICROCRYSTALLINE LAYER

(75) Inventors: Jun Koyama, Kanagawa (JP); Hidekazu Miyairi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 210 days.

(21) Appl. No.: 12/629,978

(22) Filed: Dec. 3, 2009

(65) Prior Publication Data

US 2010/0148177 A1 Jun. 17, 2010

(30) Foreign Application Priority Data

Dec. 11, 2008 (JP) .................. 2008-315525

(51) Int. Cl.
*H01L 29/786* (2006.01)

(52) U.S. Cl.
USPC 257/59; 257/72; 257/E21.414; 257/E29.291; 257/E29.294

(58) Field of Classification Search
USPC .......... 257/57, 66, E21.411, 59, 72, E21.313, 257/E29.291, E29.294
See application file for complete search history.

(56) References Cited

U.S. PATENT DOCUMENTS

| 4,409,134 | A |   | 10/1983 | Yamazaki |   |
|---|---|---|---|---|---|
| 4,615,102 | A |   | 10/1986 | Suzuki et al. |   |
| 5,744,823 | A |   | 4/1998 | Harkin et al. |   |
| 5,849,612 | A | * | 12/1998 | Takahashi et al. | ............ 438/151 |
| 6,028,472 | A |   | 2/2000 | Nagumo |   |
| 6,747,627 | B1 |   | 6/2004 | Koyama et al. |   |
| 6,943,764 | B1 |   | 9/2005 | Koyama et al. |   |
| 7,067,844 | B2 |   | 6/2006 | Yamazaki |   |
| 7,375,375 | B2 | * | 5/2008 | Yamazaki et al. | ............... 257/59 |
| 7,952,392 | B2 |   | 5/2011 | Koyama et al. |   |
| 2001/0017372 | A1 |   | 8/2001 | Koyama |   |
| 2002/0044111 | A1 | * | 4/2002 | Yamazaki et al. | ............... 345/83 |
| 2005/0012097 | A1 |   | 1/2005 | Yamazaki |   |
| 2008/0080221 | A1 |   | 4/2008 | Koo et al. |   |
| 2009/0001375 | A1 |   | 1/2009 | Yamazaki et al. |   |
| 2009/0002591 | A1 |   | 1/2009 | Yamazaki et al. |   |
| 2009/0047760 | A1 | * | 2/2009 | Yamazaki et al. | ............ 438/158 |
| 2009/0261328 | A1 |   | 10/2009 | Miyairi et al. |   |
| 2009/0321737 | A1 |   | 12/2009 | Isa et al. |   |
| 2010/0079425 | A1 |   | 4/2010 | Yamazaki et al. |   |
| 2010/0085081 | A1 |   | 4/2010 | Ofuji et al. |   |
| 2010/0110623 | A1 |   | 5/2010 | Koyama et al. |   |

FOREIGN PATENT DOCUMENTS

JP 2005-049832 2/2005

* cited by examiner

*Primary Examiner* — John C Ingham
(74) *Attorney, Agent, or Firm* — Nixon Peabody LLP; Jeffrey L. Costellia

(57) ABSTRACT

A display device including an inverter circuit and a switch is provided. The inverter circuit includes a first thin film transistor and a second thin film transistor which have the same conductivity type. The first thin film transistor and the second thin film transistor each include: a gate insulating layer in contact with a gate electrode; a microcrystalline semiconductor layer in contact with the gate insulating layer; a mixed layer in contact with the microcrystalline semiconductor layer; a layer which includes an amorphous semiconductor and is in contact with the mixed layer; and a wiring. A conical or pyramidal microcrystalline semiconductor region and an amorphous semiconductor region filling a space except the conical or pyramidal microcrystalline semiconductor region are included in the mixed layer.

20 Claims, 32 Drawing Sheets

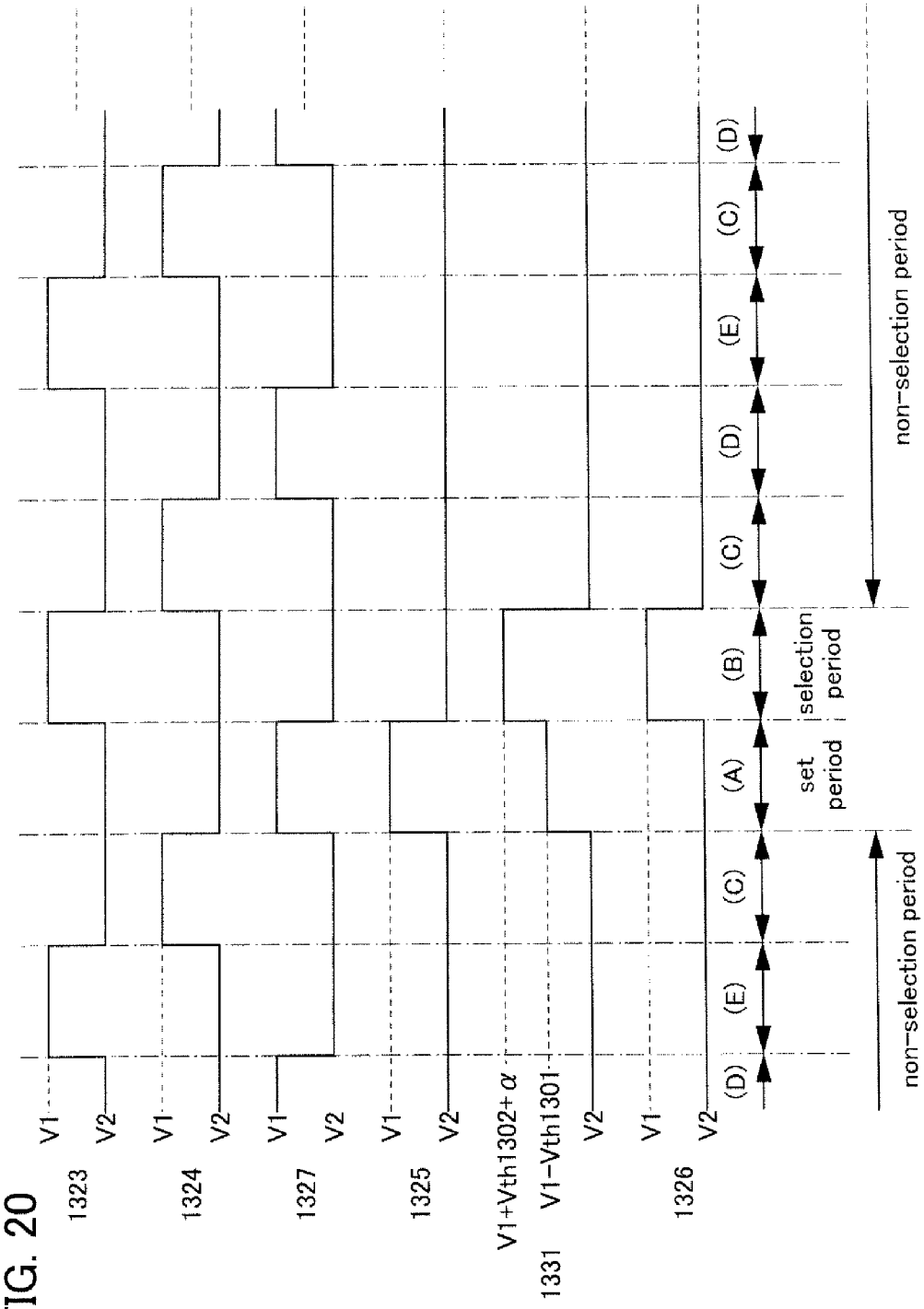

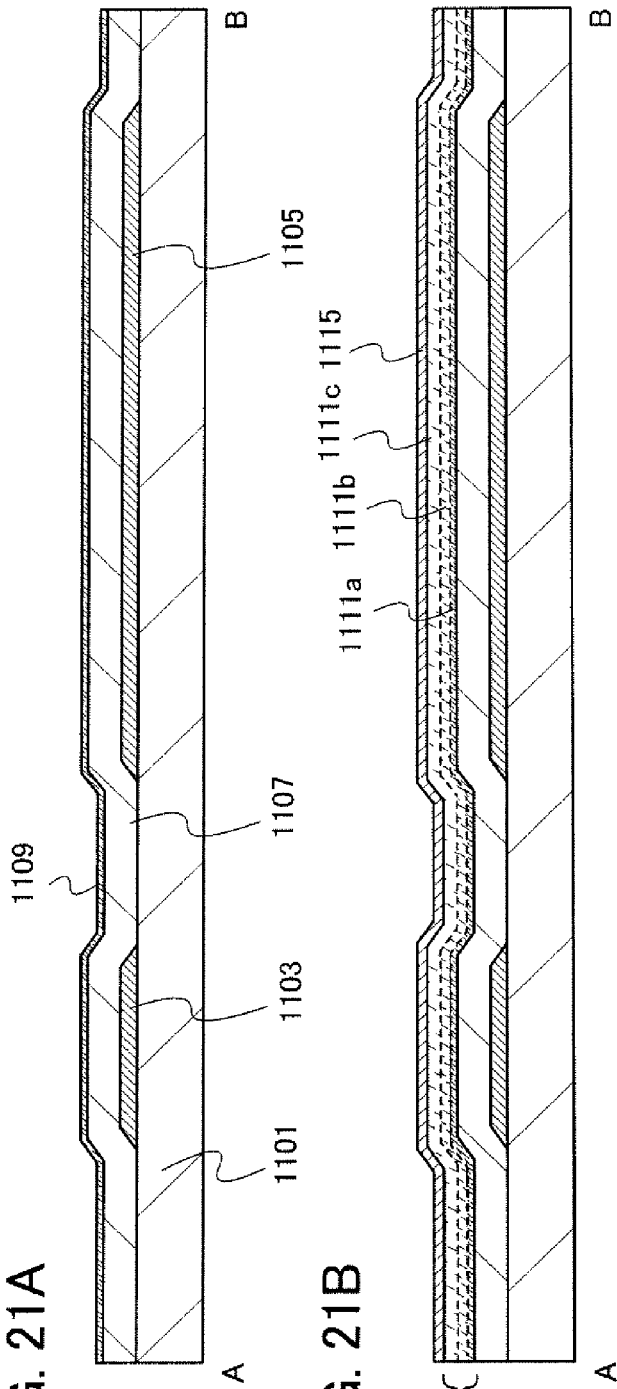

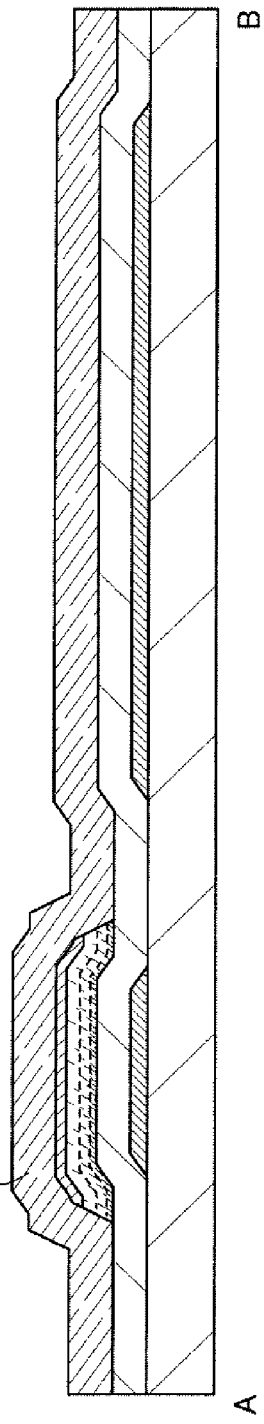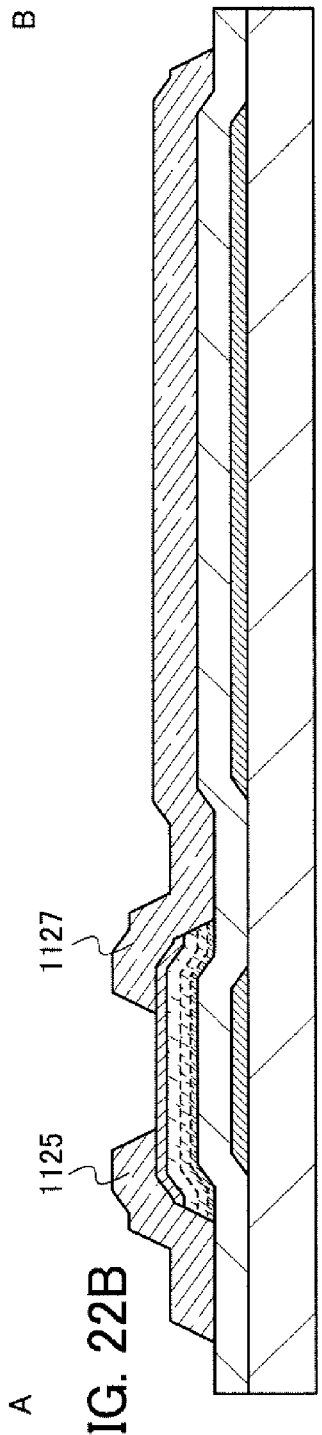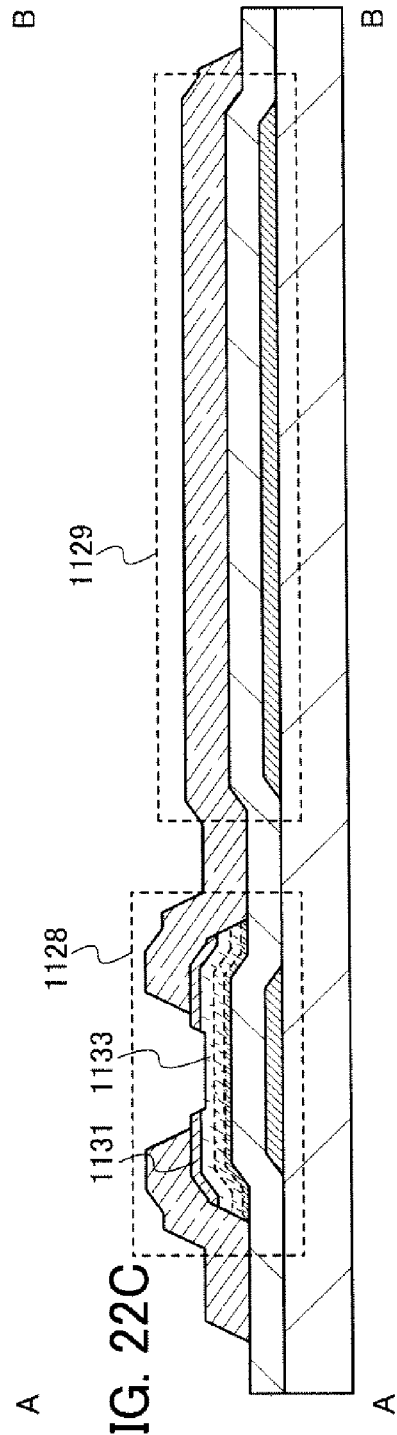

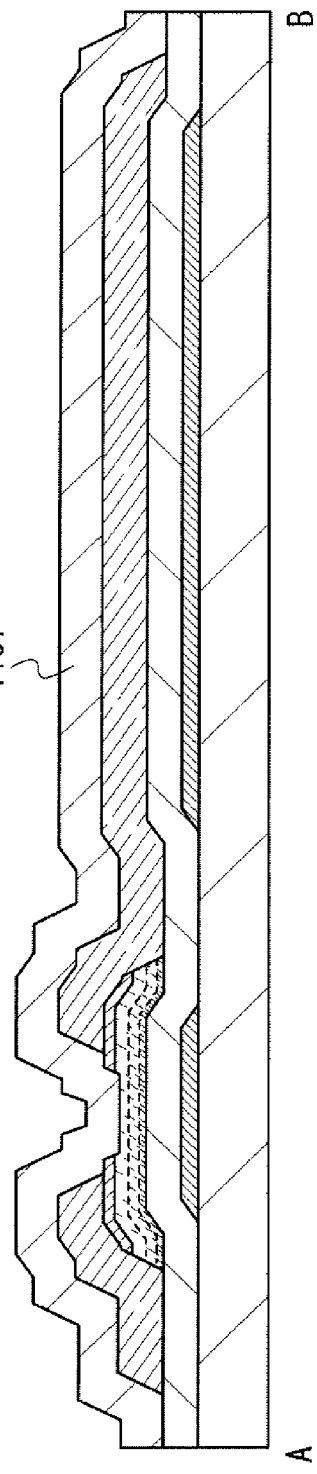
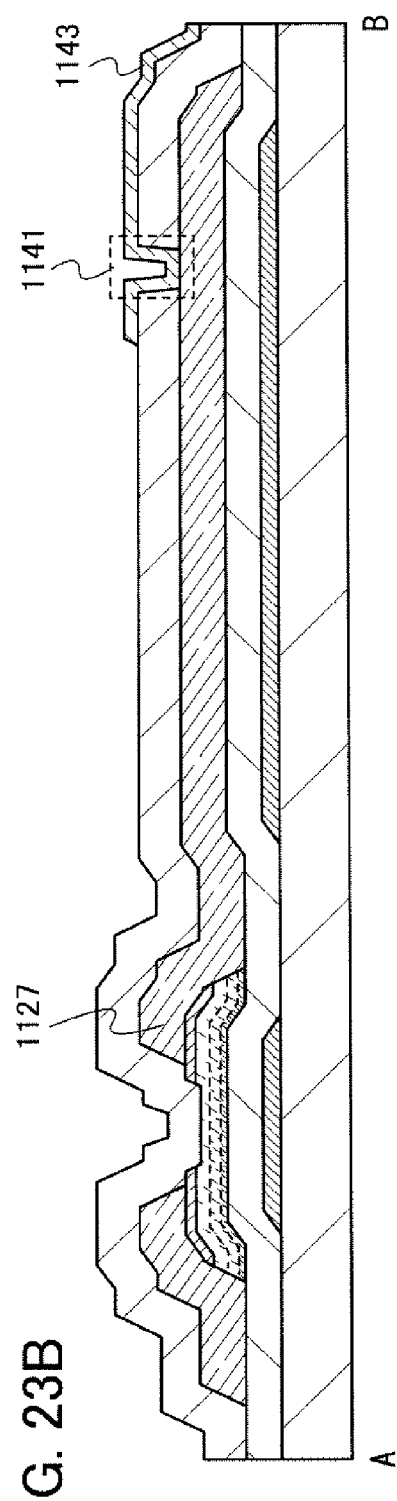
FIG. 23A
FIG. 23B

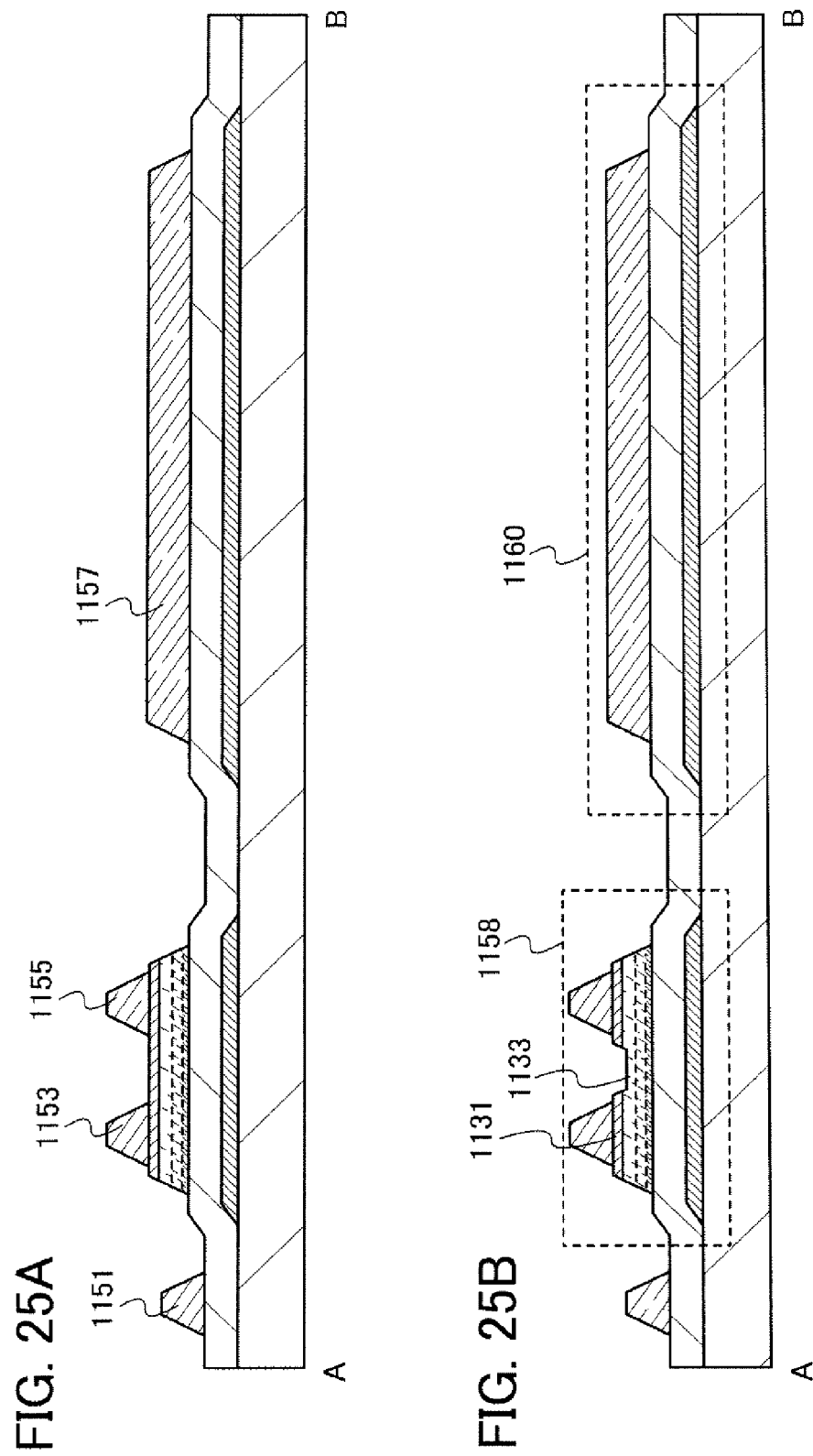

FIG. 28A1
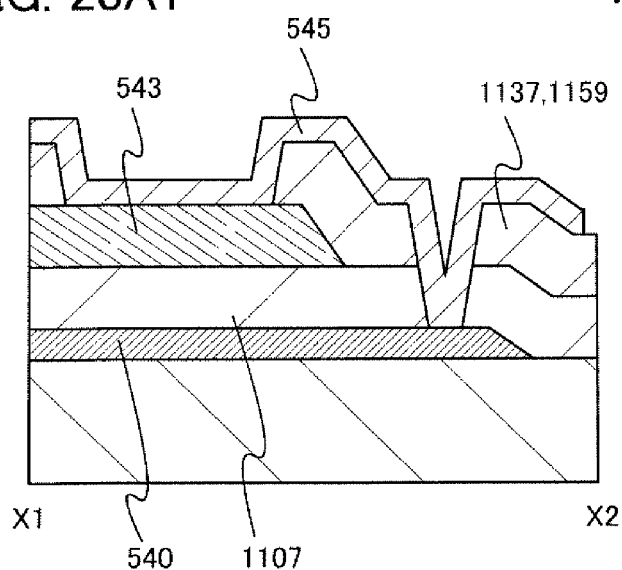
FIG. 28A2
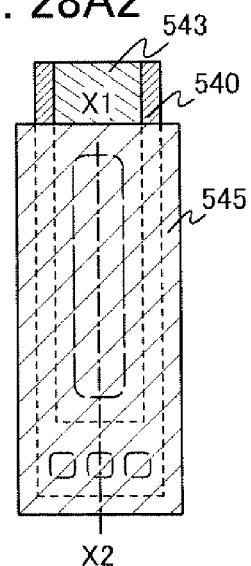
FIG. 28B1
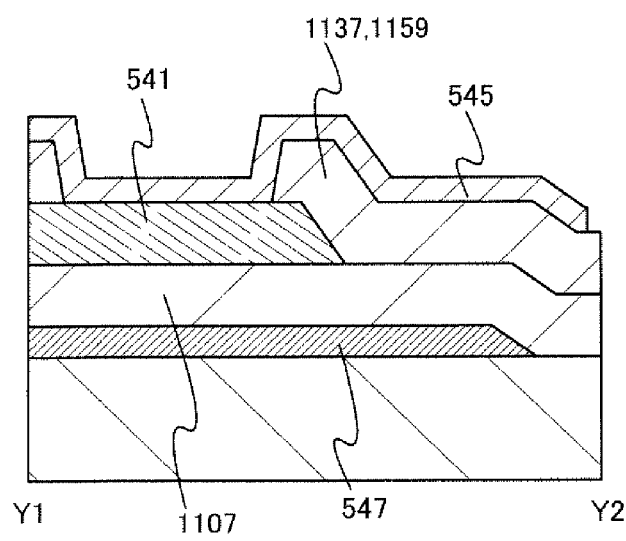
FIG. 28B2
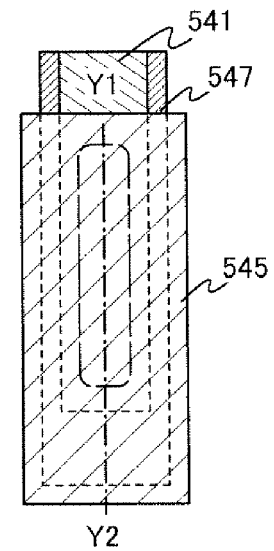

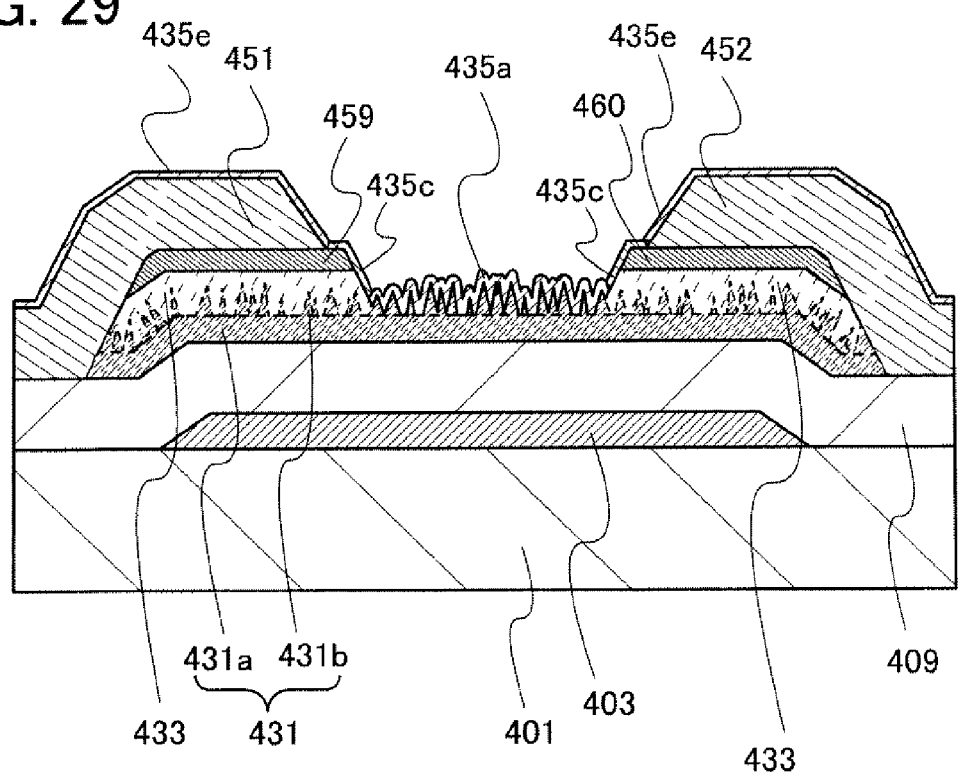

DISPLAY DEVICE INCLUDING AN INVERTER CIRCUIT HAVING A MICROCRYSTALLINE LAYER

BACKGROUND OF THE INVENTION

1. Field of the Invention

The present invention relates to a display device including an inverted staggered thin film transistor in each of a driver circuit and a pixel portion.

2. Description of the Related Art

As one kind of field-effect transistor, a thin film transistor in which a channel formation region is formed using a semiconductor layer formed over a substrate having an insulating surface is known. Techniques in which amorphous silicon, microcrystalline silicon, or polycrystalline silicon is used for the semiconductor layer used in the thin film transistor have been disclosed. A typical application of thin film transistors is a liquid crystal television device, in which thin film transistors have been put to practical use as a switching transistor for each pixel that constitutes a display screen.

Further, for reduction in cost of a display device, there is a display device whose number of external components is reduced and in which thin turn transistors formed using amorphous silicon or microcrystalline silicon are used for a gate driver (see Patent Document 1).

REFERENCE

Patent Document

[Patent Document 1] Japanese Published Patent Application No. 2005-049832

A thin film transistor in which a channel formation region is formed using an amorphous silicon layer has problems such as low field effect mobility and low on current. Further, when the thin film transistor is used for a long term, there are problems in that the thin film transistor is deteriorated, the threshold voltage is shifted, and on current is lowered.

In view of the above, in the case where a driver circuit such as a gate driver is formed using thin film transistors in each of which an amorphous silicon layer is used for a channel formation region, the width of the channel formation region is widened, and the area occupied by the thin film transistors is enlarged. Thus, sufficient on current is maintained even when on current is lowered due to the shift of the threshold voltage.

Alternatively, the number of the thin film transistors included in the driver circuit is increased and an operating period of each of the thin film transistors is shortened, so that deterioration of the thin film transistors is reduced and sufficient on current is maintained.

Therefore, in a display device whose driver circuit is formed using thin film transistors in each of which an amorphous silicon layer is used for a channel formation region, the area occupied by the driver circuit is large, narrowing the frame size of the display device is prevented, and the area of a pixel portion which is a display region is reduced.

On the other hand, a thin film transistor in which a channel formation region is formed using a microcrystalline silicon layer has a problem in that, whereas the field effect mobility is higher than that of the thin film transistor using an amorphous silicon layer, the off current is high, and thus sufficient switching characteristics cannot be obtained.

A thin film transistor in which a polycrystalline silicon layer is used for a channel formation region has much higher field effect mobility and higher on current than the aforementioned two kinds of thin film transistors. Therefore, the thin film transistor in which a polycrystalline silicon layer is used for a channel formation region can be used as not only a switching transistor provided in a pixel but also a transistor for a driver circuit which is demanded to operate at high speed.

However, the thin film transistor in which a polycrystalline silicon layer is used for the channel formation region has a problem in that the manufacturing cost becomes higher than that of the thin film transistor using an amorphous silicon layer due to the necessity for a step of crystallizing a semiconductor layer. For example, the laser annealing technique involved in the process for manufacturing a polycrystalline silicon layer has a problem in that the irradiated area with a laser beam is small and large-screen liquid crystal panels cannot be produced efficiently.

In view of the above, an object of an embodiment of the present invention is to reduce manufacturing cost of a display device. Another object of an embodiment of the present invention is to provide a display device whose frame size can be narrowed and which is excellent in display characteristics of an image.

SUMMARY OF THE INVENTION

One illustrative embodiment of the present invention is a display device including a plurality of inverter circuits and a plurality of switches. The inverter circuit includes: a first thin film transistor whose gate terminal and first terminal are connected to a wiring supplying high power supply potential; and a second thin film transistor whose first terminal is connected to a second terminal of the first thin film transistor, whose second terminal is connected to a wiring supplying lower power supply potential, and whose gate terminal is supplied with an input signal. The first thin film transistor and the second thin film transistor have the same conductivity type. The first thin film transistor and the second thin film transistor each include: a gate insulating layer in contact with a gate electrode; a microcrystalline semiconductor layer in contact with the gate insulating layer; a mixed layer in contact with the microcrystalline semiconductor layer; a layer which includes an amorphous semiconductor and is in contact with the mixed layer; a pair of impurity semiconductor layers formed over the layer which includes an amorphous semiconductor; and a wiring formed over the pair of impurity semiconductor layers. A conical or pyramidal microcrystalline semiconductor region and an amorphous semiconductor region filling a space except the conical or pyramidal microcrystalline semiconductor region are included in the mixed layer.

Another illustrative embodiment of the present invention is a display device in which the first thin film transistor and the second thin film transistor with the above structure each include: a gate insulating layer in contact with a gate electrode; a microcrystalline semiconductor region in contact with the gate insulating layer; a region which includes an amorphous semiconductor and is in contact with the microcrystalline semiconductor region; a pair of impurity semiconductor layers formed over the region which includes an amorphous semiconductor; and a wiring formed over the pair of impurity semiconductor layers. A surface of the microcrystalline semiconductor region, on a side in contact with the region which includes an amorphous semiconductor, has asperity.

Another illustrative embodiment of the present invention is a display device including the driver circuit and a pixel provided with a thin film transistor driven by the driver circuit.

The pixel and the driver circuit are formed over the same substrate. Note that the substrate is a glass substrate or a plastic substrate.

Note that on/off of the switch is controlled by a clock signal or an inverted clock signal.

The first thin film transistor and the second thin film transistor are preferably enhancement type thin film transistors.

Note that on current refers to current which flows between a source electrode and a drain electrode when a transistor is turned on. For example, in the case of an n-channel transistor, the on current refers to current which flows between the source electrode and the drain electrode when a gate voltage of the transistor is higher than the threshold voltage of the transistor.

In addition, off current refers to current which flows between the source electrode and the drain electrode when the transistor is turned off. For example, in the case of an n-channel transistor, the off current refers to current which flows between the source electrode and the drain electrode when a gate voltage of the transistor is lower than the threshold voltage of the transistor.

Note that a display device in this specification means an image display device, a light-emitting device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

Display characteristics of an image can be improved, and the frame size of a display device can be narrowed. Manufacturing cost of the display device can be reduced.

BRIEF DESCRIPTION OF THE DRAWINGS

FIG. 20 is a diagram illustrating a display device according to an embodiment of the present invention.

FIGS. 21A to 21C are cross-sectional views illustrating a method for manufacturing a display device according to an embodiment of the present invention.

FIGS. 22A to 22C are cross-sectional views illustrating a method for manufacturing a display device according to an embodiment of the present invention.

FIGS. 23A and 23B are cross-sectional views illustrating a method for manufacturing a display device according to an embodiment of the present invention.

FIGS. 25A and 25B are cross-sectional views illustrating a method for manufacturing a display device according to an embodiment of the present invention.

FIGS. 28A1 and 28B1 are cross-sectional views and FIGS. 28A2 and 28B2 are top views illustrating a method for manufacturing a display device according to an embodiment of the present invention.

FIG. 29 is a cross-sectional view illustrating a display device according to an embodiment of the present invention.

DETAILED DESCRIPTION OF THE INVENTION

Figure 1:
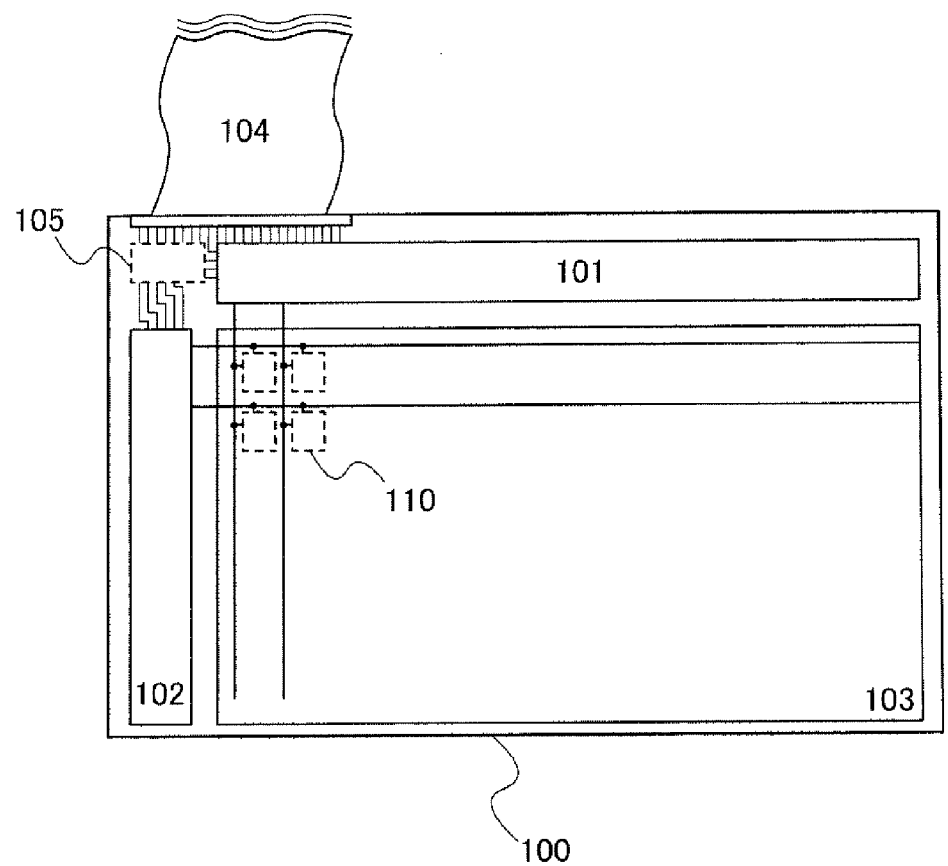
FIG. 1 is a diagram illustrating a display device according to an embodiment of the present invention.

Embodiments of the present invention to be disclosed will be described in detail with reference to the drawings. Note that the disclosed invention is not limited to the following description, and it will be easily understood by those skilled in the art that various changes and modifications can be made without departing from the spirit and scope of the present invention. Therefore, the disclosed invention is not interpreted as being limited to the description of embodiments below. In a structure of the disclosed invention, the same portions or portions having similar functions are denoted by the same reference numerals in different drawings, and description thereof will be omitted.

Embodiment 1

In this embodiment, n-channel thin film transistors forming a driver circuit are used as unipolar thin film transistors each including a microcrystalline semiconductor. As driver circuits for driving a pixel portion, an example of a source line driver circuit and/or an example of a gate line driver circuit are/is described, so that advantages of this embodiment will be described.

FIG. 1 illustrates an overall schematic view of a display device. A source line driver circuit 101, a gate line driver circuit 102, and a pixel portion 103 are formed together over a substrate 100. In the pixel portion 103, a portion surrounded by a dotted frame 110 corresponds to one pixel. FIG. 1 illustrates a structure in which the gate line driver circuit 102 is provided at one end portion; however, a plurality of gate line driver circuits 102 may be provided. In pixels of the display device, display elements are controlled by thin film transistors (hereinafter referred to as TFTs). Signals (such as a clock signal and a start pulse) for driving the source line driver circuit 101 and the gate line driver circuit 102 are input from the outside through a flexible printed circuit (FPC) 104. Note that a circuit 105 such as a logic circuit, a power supply circuit, or an oscillation circuit may be provided over the substrate, and signals for controlling the driver circuit may be generated over the substrate to supply the signals to the source line driver circuit 101 and the gate line driver circuit 102.

The source line driver circuit 101 and the gate line driver circuit 102 for driving the pixel portion are each formed using an inverter circuit, a capacitor, a switch using an element such as a TFT, a resistor, and the like. In the case where two n-channel TFTs are combined to form an inverter circuit as a driver circuit including a unipolar TFT, the following types of combinations are given: a combination of an enhancement type transistor and a depletion type transistor (hereinafter, a circuit formed by such a combination is referred to as an "EDMOS circuit"), a combination of enhancement type transistors (hereinafter, a circuit formed by such a combination is referred to as an "EEMOS circuit"), and a combination of an enhancement type transistor and a resistor (hereinafter, a circuit formed by such a combination is referred to as an ERMOS circuit). On the other hand, an enhancement type transistor is suitable for a thin film transistor which is provided in a pixel portion formed over the same substrate as the driver circuit. This is because the threshold voltage of an enhancement type transistor is positive; thus, the amount of current which flows by voltage applied between a gate and a source can be decreased as compared with a depletion type transistor, and power consumption of a display device can be reduced.

Therefore, it is suitable to use an EEMOS circuit including enhancement type TFTs like the pixel portion as an inverter circuit in the driver circuit for driving the pixel portion. With use of the EEMOS circuit as the inverter circuit for the driver circuit, only one kind of transistor is used for forming the pixel portion and the driver circuit; therefore, a manufacturing process can be shortened.

Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

Note that in this specification, when it is described that "A and B are connected", the case where A and B are electrically connected is included in addition to the case where A and B are directly connected. Here, when it is described that "A and B are electrically connected", the case where A and B have the same or substantially the same nodes with an object interposed therebetween when the object having any electrical function is interposed between A and B is included.

In specific, the state where A and B are electrically connected includes the cases where, considering operation of circuit, A and B may be regarded as the same node without any problem: A and B are connected through a switching element such as a transistor so that A and B have approximately the same potential due to conduction of the switching element; and A and B are connected through a resistor and a potential difference between the both ends of the resistor does not adversely affect the operation of the circuit including A and B.

Note that a display device refers to a device having a display element such as a light-emitting element or a liquid crystal element. In addition, a display device may include a peripheral driver circuit for driving a plurality of pixels. The peripheral driver circuit for driving a plurality of pixels is formed over the same substrate as the plurality of pixels. Note that a display device may include a flexible printed circuit (FPC). Note that a display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like.

Note that one pixel corresponds to one component that can control luminance. Therefore, for example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel.

Note that in this specification, terms such as "first", "second", "third", and "N-th" (N is a natural number) are used in order to avoid confusion among components and do not limit the components numerically.

Next, examples of a circuit diagram, a top view, and a cross-sectional view of a gate line driver circuit and a source line driver circuit in each of which an EEMOS circuit is used as an inverter circuit will be described.

Next, a structure of a source line driver circuit in which an EEMOS circuit is used as an inverter circuit will be described.

Figure 2:
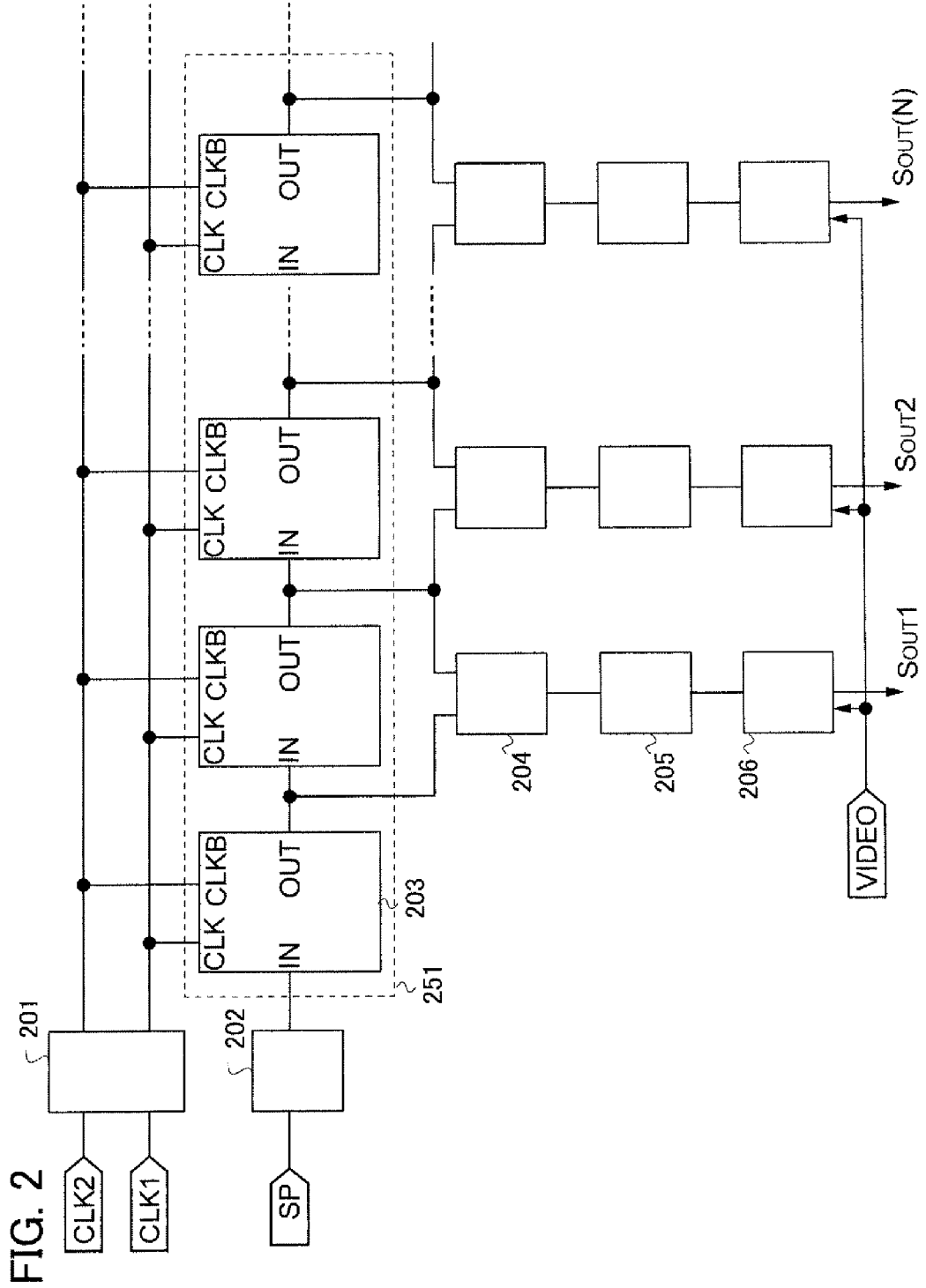
FIG. 2 is a diagram illustrating a display device according to an embodiment of the present invention.

FIG. 2 is a diagram illustrating a circuit configuration of the source line driver circuit 101 included in the display device illustrated in FIG. 1. The source line driver circuit includes a clock signal level shifter 201, a start pulse level shifter 202, a pulse output circuit 203 which constitutes a shift register 251, a NAND circuit 204, a buffer 205, and a sampling switch 206. Signals input from the outside are a first clock signal (CLK1), a second clock signal (CLK2), a start pulse (SP), and an analog video signal (Video). Among the signals input from the outside, the amplitude of the first clock signal (CLK1), the second clock signal (CLK2), and the start pulse (SP, or also referred to as an input signal) is converted by the clock signal level shifter 201 or the start pulse level shifter 202 immediately after they have been input from the outside as signals with low voltage amplitude, and then the signals are input to the driver circuit as signals with high voltage amplitude. Further, in the source line driver circuit in the display device of this embodiment, as one example, a sampling pulse which is output from a pulse output circuit of one stage in the shift register drives the sampling switch 206 to sample analog video signals of source signal lines Sout1 to Sout(N) at the same time. Note that another signal for switching a scanning direction, or the like may be additionally input. Although this embodiment shows an example in which clock signals having two phases, such as a first clock signal (CLK1) and a second clock signal (CLK2), are used for driving the driver circuit, another structure may be employed in which signals other than the clock signals having two phases are input to drive the driver circuit.

Figure 3A:
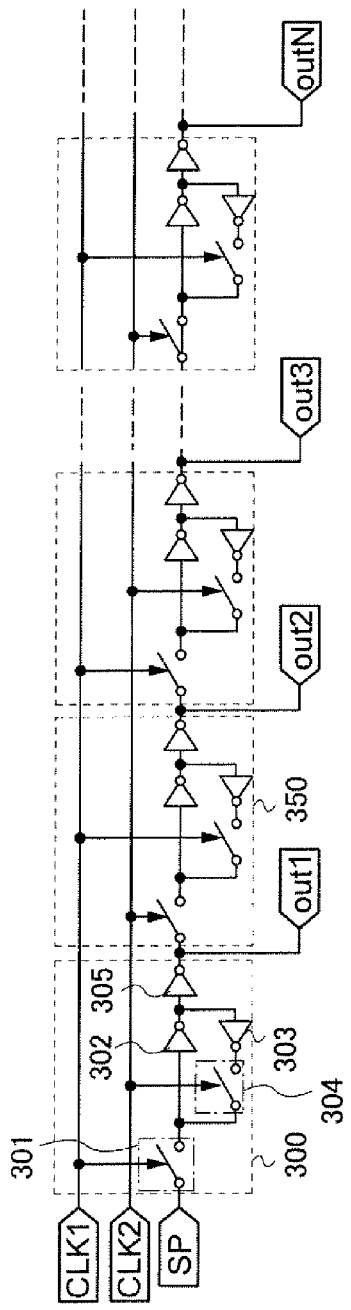
FIGS. 3A and 3B are diagrams illustrating a display device according to an embodiment of the present invention.
Figure 3B:
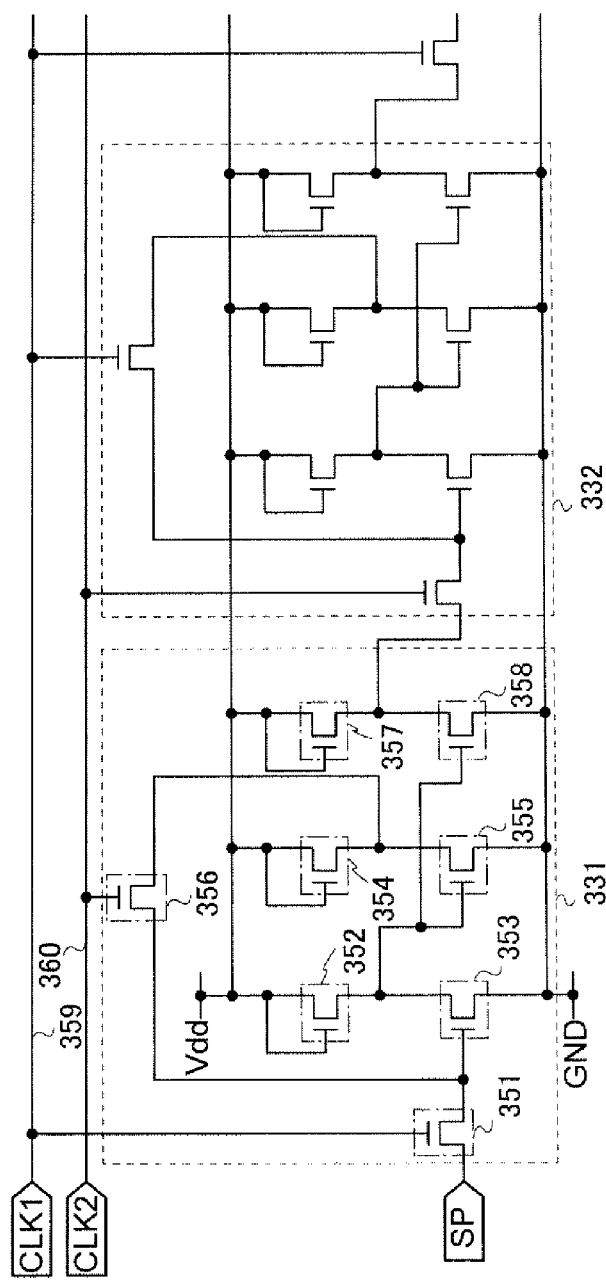

FIGS. 3A and 3B illustrate a structure of a plurality of pulse output circuits 203 included in the shift register 251. Note that, one example of a shift register formed using a static circuit is described in this embodiment. A pulse output circuit 300 includes, as one example, a first switch 301 connected to a terminal to which a start pulse SP is input; a first inverter circuit 302 that inverts a signal input through the first switch 301 and outputs the inverted signal; a second inverter circuit 303 and a third inverter circuit 305 that invert a signal inverted by the first inverter circuit 302 and outputs the inverted signal; and a second switch 304 connected to a terminal to which a signal inverted by the second inverter circuit 303 is input. In the circuit diagram illustrated in FIG. 3A, a block indicated by a dotted line 350 corresponds to a pulse output circuit that outputs a sampling pulse for one stage. The shift register in FIG. 3A includes N-stage (N is a natural number, 1<N) pulse output circuits. Output signals out1 to outN are output from an output terminal of the third inverter circuit 305 in each of the N-stage pulse output circuits. Note that in the pulse output circuit of the second stage (the even-numbered stage), which is next to the aforementioned first stage (the odd-numbered stage), a wiring to which the first clock signal is input and a wiring to which the second clock signal is input are connected to the second switch 304 and the first switch 301, respectively. That is, the connection in the second stage is changed from that in the first stage between the first switch 301 and the second switch 304. In the third stage and thereafter, the connection of the wirings to which the first clock signal and the second clock signal are input is alternately switched between the first switch 301 and the second switch 304.

FIG. 3B illustrates in detail a circuit configuration of the pulse output circuit. The pulse output circuit includes TFTs 351, 352, 353, 354, 355, 356, 357, and 358. A pulse output circuit 331 of an odd-numbered stage and a pulse output circuit 332 of an even-numbered stage are connected to a wiring 359 for supplying the first clock signal CLK1 and a wiring 360 for supplying the second clock signal CLK2. In the pulse output circuit 331 of a first stage, a first terminal of the TFT 351 is connected to a terminal to which the start pulse SP is input, a gate terminal of the TFT 351 is connected to the wiring 359, and a second terminal of the TFT 351 is connected to a gate terminal of the TFT 353 and a second terminal of the TFT 356. A first terminal and a gate terminal of the TFT 352 are connected to a wiring to which high power supply potential VDD is supplied, and a second terminal of the TFT 352 is connected to a first terminal of the TFT 353, a gate terminal of the TFT 355, and a gate terminal of the TFT 358. A second terminal of the TFT 353 is connected to a wiring to which low power supply potential VSS (also referred to as GND) is supplied. A first terminal and a gate terminal of the TFT 354 are connected to the wiring to which high power supply potential VDD is supplied, and a second terminal of the TFT 354 is connected to a first terminal of the TFT 355 and a first terminal of the TFT 356. A second terminal of the TFT 355 is connected to the wiring to which low power supply potential VSS is supplied. A gate terminal of the TFT 356 is connected to the wiring 360. A first terminal and a gate terminal of the TFT 357 are connected to the wiring to which high power supply potential VDD is supplied, and a second terminal of the TFT 357 is connected to a first terminal of the TFT 358. Note that the second terminal of the TFT 357 in the pulse output circuit 331 of the first stage is connected to the first terminal of the TFT 351 in the pulse output circuit 332 of a second stage. In a similar manner, the second terminal of the TFT in the pulse output circuit of one stage is sequentially connected to the pulse output circuit of the following stage.

In FIG. 3B, the TFT 351 corresponds to the first switch 301 illustrated in FIG. 3A. The TFT 352 and the TFT 353 correspond to the first inverter circuit 302 illustrated in FIG. 3A, and constitute an EEMOS circuit. The TFT 354 and the TFT 355 correspond to the second inverter circuit 303 illustrated in FIG. 3A, and constitute an EEMOS circuit. The TFT 351 corresponds to the first switch 301 illustrated in FIG. 3A. The TFT 356 corresponds to the second switch 304 illustrated in FIG. 3A. It is preferable that the TFTs 351 and 356 be enhancement type transistors like the TFTs 352 to 355. By using an enhancement type transistor as a switch, off current of the transistor can be reduced, resulting in lower power consumption and simplification of a manufacturing process.

Note that a transistor such as an n-channel transistor or a p-channel transistor is an element which includes at least three terminals of a gate, a drain, and a source. The transistor has a channel region between a drain region and a source region and can supply current through the drain region, the channel region, and the source region. Here, since a source and a drain are switched with each other depending on the structure, operating condition, or the like of the transistor, it is difficult to determine which is the source or the drain in some cases. Accordingly, in this embodiment, one of regions which function as a source and a drain is referred to as a first terminal and the other region is referred to as a second terminal. In addition, a terminal which functions as a gate is referred to as a gate terminal.

Figure 4:
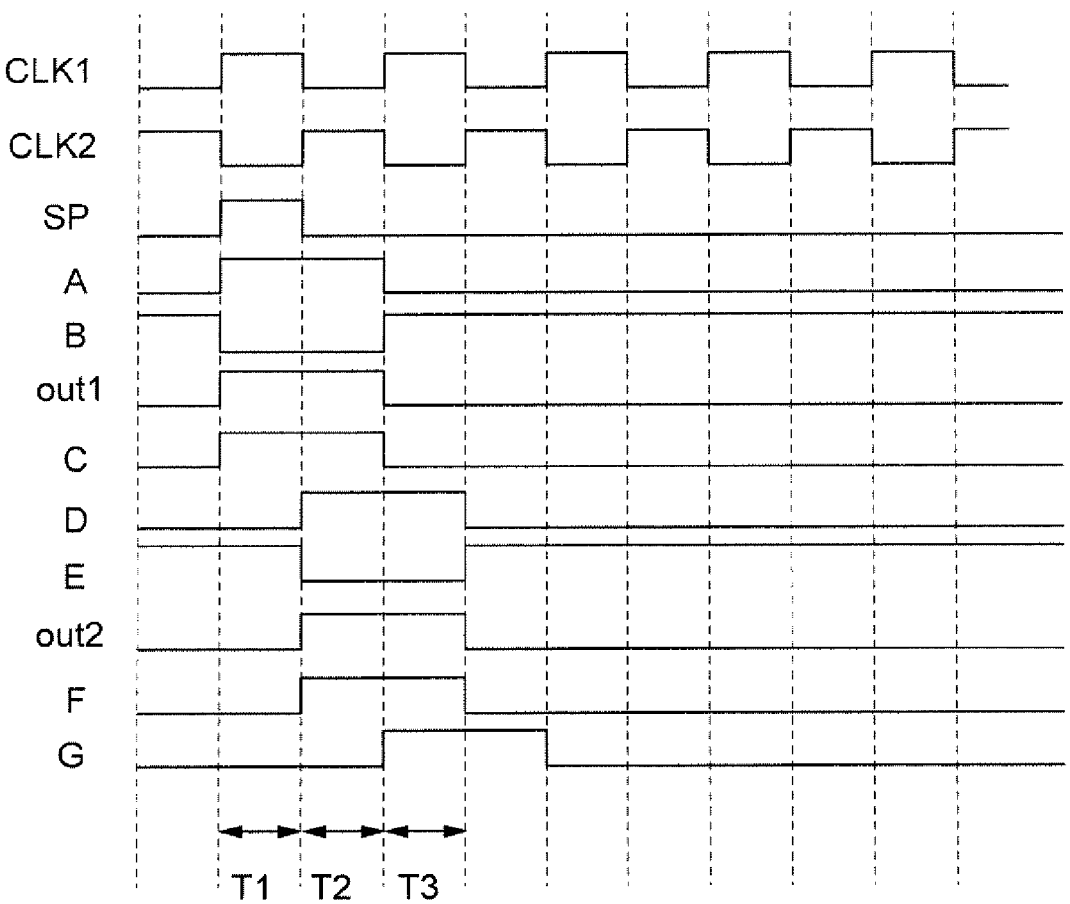
FIG. 4 is a diagram illustrating a display device according to an embodiment of the present invention.

Here, operation of the circuits illustrated in FIGS. 3A and 3B will be described. A timing chart of FIG. 4 is referred to for description. Note that for description of FIG. 4, as the nodes in the pulse output circuit of the first stage illustrated in FIG. 3B, the second terminal of the TFT 351 is referred to as a node A (denoted as A in FIG. 4), the second terminal of the TFT 352 is referred to as a node B (denoted as B in FIG. 4), the second terminal of the TFT 354 is referred to as a node C (denoted as C in FIG. 4), and the second terminal of the TFT 357 is referred to as a node out1 (denoted as out1 in FIG. 4). In addition, as the nodes in the pulse output circuit of the second stage illustrated in FIG. 3B, the second terminal of the TFT 351 is referred to as a node D (denoted as D in FIG. 4), the second terminal of the TFT 352 is referred to as a node E (denoted as E in FIG. 4), the second terminal of the TFT 354 is referred to as a node F (denoted as F in FIG. 4), and the second terminal of the TFT 357 is referred to as a node out2 (denoted as out2 in FIG. 4). Furthermore, as the nodes in the pulse output circuit of the third stage illustrated in FIG. 3B, the second terminal of the TFT 351 is referred to as a node G (denoted as G in FIG. 4).

Operation in a period T1 in FIG. 4 will be described in which the start pulse SP is at H level, the first clock signal CLK1 is at H level, and the second clock signal CLK2 is at L level. When the first clock signal CLK1 becomes H level, the TFT 351 in the pulse output circuit of the first stage is turned on. Then, the voltage at the node A rises to H level due to the start pulse at H level. When the voltage at the node A rises to H level, the TFT 353 in the pulse output circuit of the first stage is turned on. Then, the voltage at the node B drops to L level due to the low power supply potential at L level. When the voltage at the node B drops to L level, the TFT 355 in the pulse output circuit of the first stage is turned off. Then, the voltage at the node C rises to H level due to the high power supply potential at H level. Since the voltage at the node B drops to L level, the TFT 358 in the pulse output circuit of the first stage is turned off. Then, the voltage at the node out1 rises to H level due to the high power supply potential at H level. Note that since the second clock signal CLK2 is at L level, the TFT 356 in the pulse output circuit of the first stage and the TFT 351 in the pulse output circuit of the second stage are turned off.

Next, operation in a period T2 in FIG. 4 will be described in which the start pulse SP is at L level, the first clock signal CLK1 is at L level, and the second clock signal CLK2 is at H level.

When the first clock signal becomes L level, the TFT 351 in the pulse output circuit of the first stage is turned off. On the other hand, the TFT 356 in the pulse output circuit of the first stage is turned on because the second clock signal CLK2 is at H level. Accordingly, the voltage at the node A is kept at H level due to the voltage at the node C which is at H level in the period T1. Thus, in the pulse output circuit of the first stage, operation similar to that in the period T1 is performed. In the period T2, the TFT 351 in the pulse output circuit of the second stage is turned on because the second clock signal CLK2 is at H level. Then, the voltage at the node D rises to H level due to the voltage at the node out 1 which is at H level. When the voltage at the node D rises to H level, the TFT 353 in the pulse output circuit of the second stage is turned on. Then, the voltage at the node E drops to L level due to the low power supply potential at L level. When the voltage at the node E drops to L level, the TFT 355 in the pulse output circuit of the second stage is turned off. The voltage at the node F rises to H level due to the high power supply potential at H level. In addition, when the voltage at the node E drops to L level, the TFT 358 in the pulse output circuit of the second stage is turned off The voltage at the node out2 rises to H level due to the high power supply potential at H level. Note that since the first clock signal CLK1 is at L level, the TFT 356 in the pulse output circuit of the second stage and the TFT 351 in the pulse output circuit of the third stage are turned off.

Next, operation in a period T3 in FIG. 4 will be described in which the start pulse SP is at L level, the first clock signal CLK1 is at H level, and the second clock signal CLK2 is at L level.

When the first clock signal retains H level, the TFT 351 in the pulse output circuit of the first stage is turned on. On the other hand, the TFT 356 in the pulse output circuit of the first stage is turned off due to the second clock signal CLK2 at L level. Accordingly, the voltage at the node A drops to L level. When the voltage at the node A drops to L level, the TFT 353 in the pulse output circuit of the first stage is turned off. Then, the voltage at the node B rises to H level due to the high power supply potential at H level. When the voltage at the node B rises to H level, the TFT 355 in the pulse output circuit of the first stage is turned on. Then, the voltage at the node C drops to L level due to the low power supply potential at L level. In addition, when the voltage at the node B rises to H level, the TFT 358 in the pulse output circuit of the first stage is turned on. Then, the voltage at the node out1 drops to L level due to the low power supply potential which is at L level. Note that since the second clock signal CLK2 is at L level, the TFT 356 in the pulse output circuit of the first stage and the TFT 351 in the pulse output circuit of the second stage are turned off. As in the pulse output circuit of the first stage in the period T2, the TFT 356 in the pulse output circuit of the second stage is turned on, and the voltage at the node F is kept at H level due to the voltage at the node F which is at H level in the period T2. Then, in the pulse output circuit of the second stage, operation similar to that in the period T2 is performed. In the period T3, the TFT 351 in the pulse output circuit of the third stage is turned on because the first clock signal CLK1 is at H level. Then, the voltage at the node G rises to H level due to the voltage at the node out2 which is at H level. When the voltage at the node G rises to H level, the TFT 355 in the pulse output circuit of the third stage is turned on. Subsequently, the transistors are controlled to be on or off in sequence, whereby the circuit illustrated in FIGS. 3A and 3B can operate as a shift register.

Note that in the pulse output circuit illustrated in FIGS. 3A and 3B and FIG. 4, the second switch 304 is provided between the node A and the node C. This structure is adopted because the voltage at the node C which is controlled by the TFT 354 connected to the high power supply potential VDD is equal to or less than (VDD−VthN) (VthN is a threshold voltage of the TFT 354). It is preferable that the node A and the node C be disconnected from each other to be independently driven by the second switch 304, because the TFT 353 can be driven more efficiently by the potential at the node A. Note that the invention in this embodiment can be achieved even if the second switch 304 is not provided.

In addition, in the source line driver circuit, a NAND of a signal output from each pulse output circuit is calculated to generate a signal for driving each source line. Accordingly, in the source line driver circuit, a larger number of pulse output circuits than source lines are preferably provided to generate a signal output to a source line.

Figure 5A:
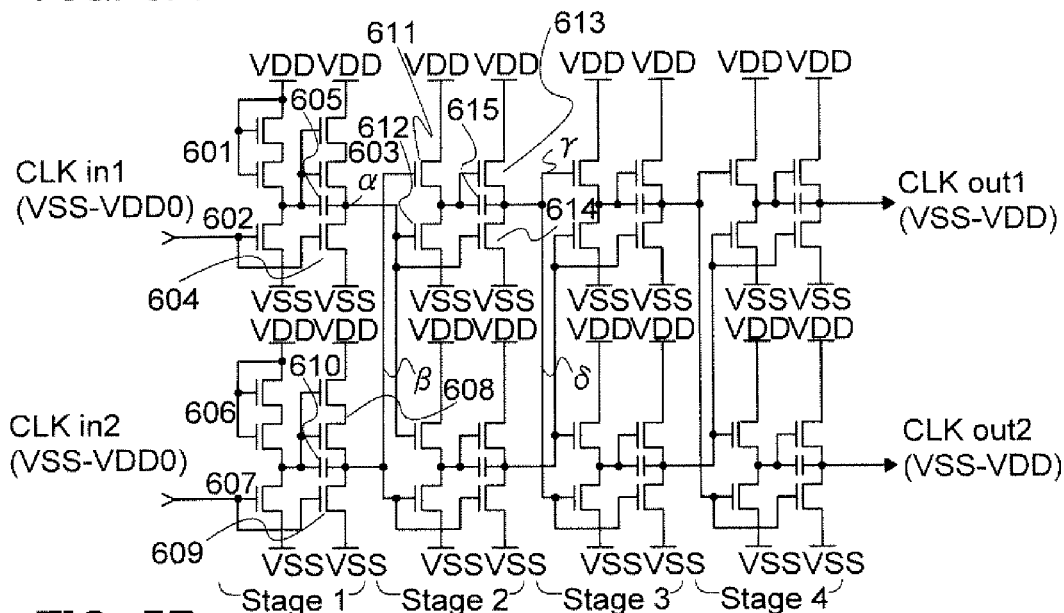
FIGS. 5A to 5D are diagrams illustrating a display device according to an embodiment of the present invention.

FIG. 5A illustrates a structure of the clock signal level shifter 201 illustrated in FIG. 2. In this structure, the amplitude of clock signals (CLK1 and CLK2) having opposite polarities are each converted by one-input level shifter circuits arranged in parallel (Stage 1), and the signals output from the one-input level shifter circuits to the following buffer stage (here, Stage 2) are used as inverted input signals.

Operation of the circuit illustrated in FIG. 5A will be described. It is assumed here that three potentials of VSS, VDD0, and VDD are used and VSS<VDD0<VDD is satisfied. By employing a structure in which the amplitude of the clock signal is level-shifted in an input portion of a source line driver circuit, low power consumption and reduction in noise can be achieved. Further, in FIG. 5A. TFTs 601, 603, 606, and 608 each employ a double-gate structure; however, these may employ a single-gate structure or a multi-gate structure having three or more gate electrodes. Similarly, there is no particular limitation on the number of gate electrodes of the other TFTs.

A first input clock signal (CLK1) having an amplitude of L level/H level=VSS/VDD0 is input to a signal input portion (CLK in1). When the first input clock signal is at H level, TFTs 602 and 604 are turned on. At this time, the voltage at a gate electrode of the TFT 603 is at L level, and the TFT 603 is turned off. Here, the on-resistance of the TFT 602 is set much lower than that of the TFT 601. Thus, a node α becomes L level. When the first input clock signal is at L level, the TFTs 602 and 604 are turned off. Therefore, the voltage at the gate terminal of the TFT 603 rises to VDD through the TFT 601 operating in a saturation region, the TFT 601 is turned off when the potential of the gate terminal of the TFT 603 reaches (VDD−VthN), and the gate electrode of the TFT 603 is in a floating state. Accordingly, the TFT 603 is turned on, and the potential of the node α rises to VDD. Here, by a capacitor 605, the potential of the gate terminal of the TFT 603 which is in a floating state increases in accordance with a rise of the potential of the node α. When the potential of the gate terminal of the TFT 603 becomes higher than VDD and exceeds (VDD+VthN), an H-level signal obtained at the node α is equal to VDD. Therefore, L level of an output signal is VSS, and H level of the output signal is VDD. In this manner, the amplitude conversion is completed.

In a similar manner, a second input clock signal (CLK2) having an amplitude of VSS-VDD0 is input to a signal input portion (CLK in2). By similar operation to the above, amplitude conversion is performed by the one-input level shifter circuits including TFTs 606 to 609 and a capacitor 610, and a signal having an amplitude of VSS-VDD is output to a node β. Note that a signal obtained at the node a has the opposite polarity to the first input clock signal which is input, and a signal obtained at the node β has the opposite polarity to the second input clock signal which is input.

The level shifter illustrated in FIG. 5A is provided with the buffer stages (Stage 2 to Stage 4) which sequentially follow the level shifter circuit (Stage 1) in consideration of load of pulses after amplitude conversion. An inverter circuit included in the buffer stages is a two-input type, and an input signal and an inverted signal of the input signal are needed. The reason why the two-input inverter circuit is used is that low power consumption can be achieved. In the abovementioned level shifter circuit, when the TFT 602 is turned on, through current flows between VSS and VDD through the TFT 601 and the TFT 602. The two-input type is employed so that through current does not flow during the operation.

In FIG. 5A, in an inverter circuit of the Stage 2, a signal input to a gate terminal of a TFT 611 and a signal input to a gate terminal of a TFT 612 have opposite polarities to each other. In view of this, by taking advantage that the first input clock signal and the second input clock signal are signals whose polarities are opposite to each other, an output signal obtained at the node α and an output signal obtained at the node β are used as inverted input signals from each other.

Operation of an inverter circuit will be described. Here, operation of an inverter circuit on one side of the Stage 2 including the TFTs 611 and 612, TFTs 613 and 614, and a capacitor 615 is described. The same can be applied to the operation of other inverter circuits.

When a signal input to the gate terminal of the TFT 611 is at H level, the TFT 611 is turned on and the potential of a gate electrode of the TFT 613 rises to VDD. When the potential of the gate electrode of the TFT 613 reaches (VDD−VthN), the TFT 611 is turned off and the gate terminal of the TFT 613 is in a floating state. On the other hand, since a signal input to the gate electrode of the TFT 612 and a gate electrode of the TFT 614 are at L level, the TFT 612 and the TFT 614 are turned off. Since the potential of the gate electrode of the TFT 613 is (VDD−VthN), the TFT 613 is turned on and the potential of a node γ rises to VDD. Here, in a manner similar to the operation of the abovementioned level shifter circuit, by operation of the capacitor 615, the potential of the gate electrode of the TFT 613 which is in a floating state is raised as the potential of the node γ rises. When the potential of the gate electrode of the TFT 613 gets higher than VDD and exceeds (VDD+VthN), an H-level signal obtained at the node γ is equal to VDD.

On the other hand, when the signal input to the gate terminal of the TFT 611 is at L level, the TFT 611 is turned off. Then, an H-level signal is input to the gate terminal of the TFT 612 and the gate terminal of the TFT 614, whereby the TFT 612 and the TFT 614 are turned on. Accordingly, the potential of the gate electrode of the TFT 613 becomes L level, and an L-level signal is obtained at the node γ.

By similar operation, a pulse is output to a node δ. At this time, a pulse whose polarity is opposite to that of the pulse obtained at the node γ is output to the node δ.

Hereinafter, operation is performed similarly in the Stage 3 and the Stage 4, whereby pulses are finally output to a signal output portion (CLK out1) and a signal output portion (CLK out2).

Figure 5B:
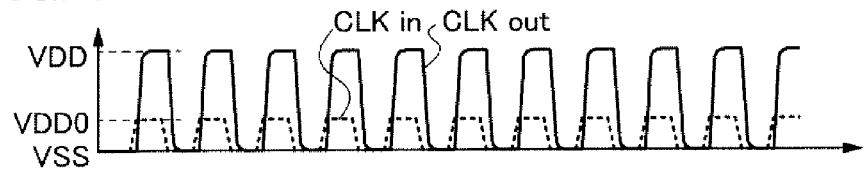

FIG. 5B shows the conversion of the amplitude of a clock signal. The amplitude of an input signal is L level/H level=VSS/VDD0, and the amplitude of an output signal is L level/H level=VSS/VDD.

Figure 5C:
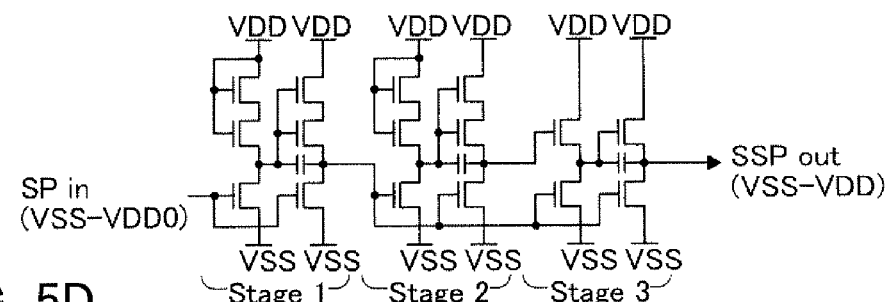

FIG. 5C shows the start pulse (SP) level shifter 202 illustrated in FIG. 2. In the case of a start pulse, which does not have an inverted signal, an output from a one-input level shifter circuit (Stage 1) is input to a one-input inverter circuit (Stage 2), and the output from the Stage 1 and the output from the Stage 2 are used as inputs to a two-input inverter circuit (Stage 3). The one-input level shifter circuit performs circuit operation similar to that in the case of a clock signal. Operation in the circuit of the one-input inverter circuit is similar to that of the one-input level shifter circuit except that the amplitude of a signal input is L level/H level=VSS/VDD and there is no amplitude conversion between input and output pulses. Therefore, description thereof is omitted here.

Figure 5D:

FIG. 5D illustrates the conversion of the amplitude of a start pulse (SP). Like the clock signal, the amplitude of an input signal is L level/H level=VSS/VDD0, and the amplitude of an output signal is L level/H level=VSS/VDD.

Figure 6A:
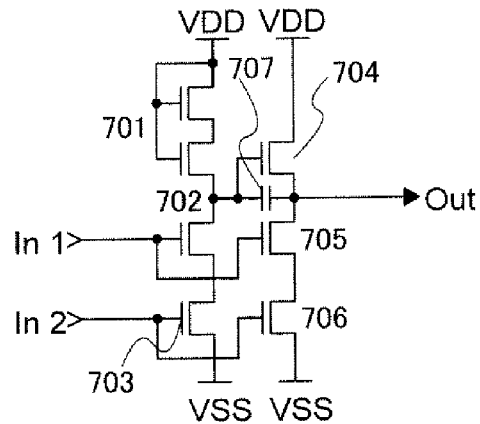
FIGS. 6A to 6C are diagrams illustrating a display device according to an embodiment of the present invention.

FIG. 6A illustrates the two-input NAND circuit 204 which includes TFTs 701, 702, 703, 704, 705, and 706 and a capacitor 707 and is illustrated in FIG. 2. The operation of the NAND circuit 204 is similar to that of the one-input inverter circuit, and is different from the one-input inverter circuit in that the number of signal input portions is two, the TFTs 702 and 703 are connected in series, and the TFTs 705 and 706 are connected in series.

When an H-level signal is input to a signal input portion (In1) and a signal input portion (In2), the TFTs 702, 703, 705, and 706 are turned on, and a gate terminal of the TFT 704 is at an L level to turn off the TFT 704. Then, an L-level signal is obtained at a signal output portion (Out). When an L-level signal is input to at least one or both of the signal input portion (In1) and the signal input portion (In2), the gate terminal of the TFT 704 and low power supply potential VSS are not brought into conduction. Therefore, voltage at the gate terminal of the TFT 704 rises to VDD, and the TFT 704 is turned on. Further, by the capacitor 707, the potential of the gate terminal of the TFT 704 exceeds (VDD+VthN), whereby an H-level signal whose potential is VDD is obtained at the signal output portion (Out).

Figure 6B:
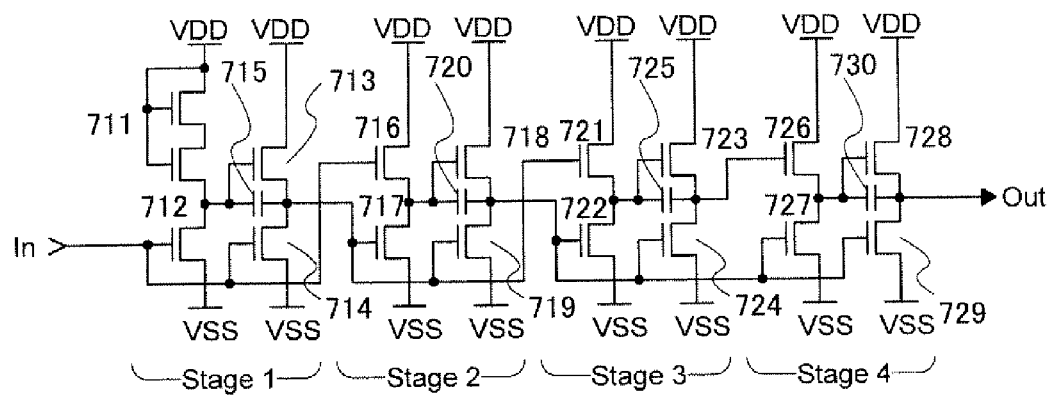

FIG. 6B illustrates a structure of the buffer. The buffer includes a one-input inverter circuit (Stage 1) and two-input inverter circuits (Stage 2 to Stage 4). The operation of the one-input inverter circuit and the two-input inverter circuit is described in the above description on the level shifter, and thus the description thereof is omitted here.

Figure 6C:
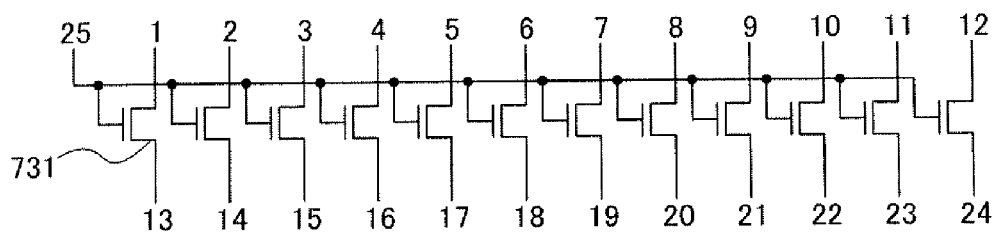

FIG. 6C illustrates a structure of the sampling switch 206 illustrated in FIG. 2. A sampling pulse is input to a signal input portion (25) so that 12 TFTs 731 connected in parallel are simultaneously controlled. An analog video signal is input to input electrodes (1) to (12) of the 12 TFTs 731, whereby the potential of a video signal at the time of input of the sampling pulse is written to a source signal line through output electrodes (13) to (24).

In the display device described in this embodiment, a transistor of a driver circuit for driving a pixel portion is a unipolar transistor having the same conductivity type as a pixel TFT and is an enhancement type TFT. Accordingly, it is possible to omit a step for a complementary circuit configuration, which results in contribution to reduction in manufacturing cost and improvement of a yield.

Figure 7:
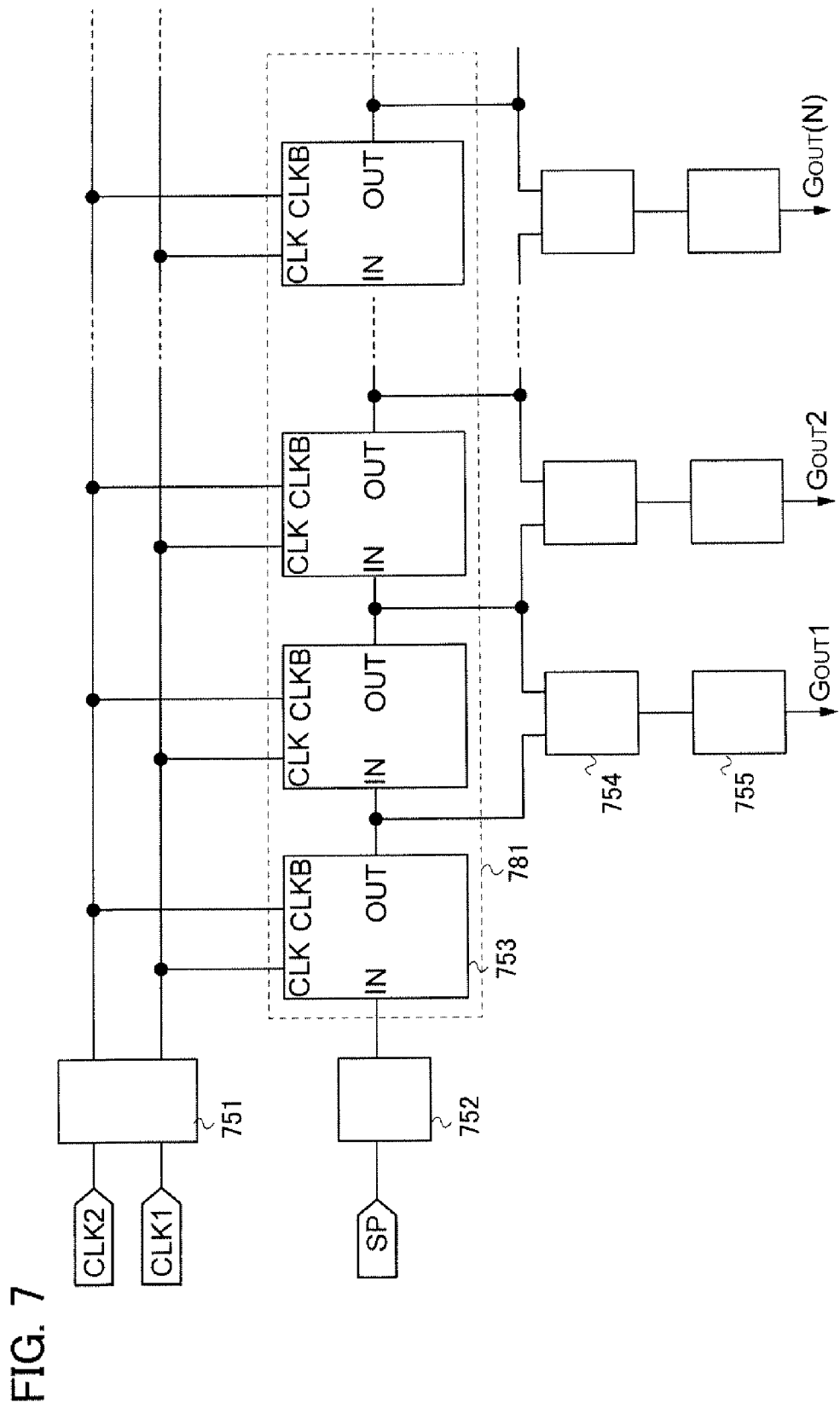
FIG. 7 is a diagram illustrating a display device according to an embodiment of the present invention.

FIG. 7 illustrates a structure of the gate line driver circuit 102 in the display device illustrated in FIG. 1. The gate line driver circuit 102 includes a clock signal level shifter 751, a start pulse level shifter 752, a pulse output circuit 753 forming a shift register 781, a NAND circuit 754, and a buffer 755.

A first clock signal (CLK1), a second clock signal (CLK2), and a start pulse (SP) are input to the gate line driver circuit. The amplitude of these input signals is converted by the clock signal level shifter 751 or the start pulse level shifter 752 immediately after they have been input from the outside as signals with low voltage amplitude, and then the signals are input to the driver circuit as signals with high voltage amplitude.

Note that the structure and operation of the pulse output circuit 753, the buffer 755, the clock signal level shifter 751, the start pulse level shifter 752, and the NAND circuit 754 are similar to those used in the source line driver circuit, and the description thereof is omitted here.

Figure 8:
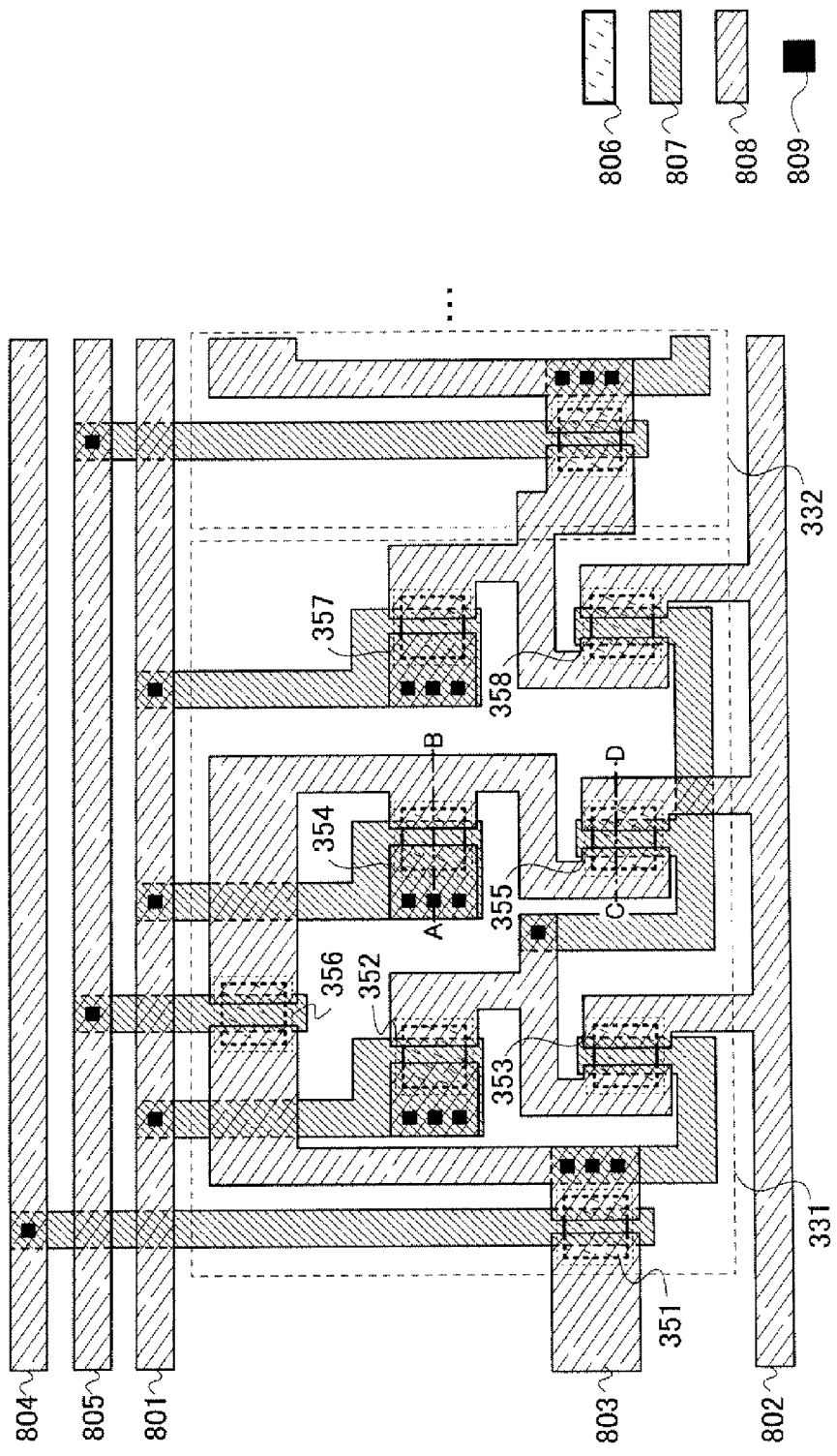
FIG. 8 is a top view illustrating a display device according to an embodiment of the present invention.

Next. FIG. 8 illustrates a layout (a top view) of the pulse output circuit illustrated in FIG. 3B. Note that FIG. 8 illustrates the pulse output circuit of the first stage among the multi-stage pulse output circuits.

The pulse output circuit illustrated in FIG. 8 includes a power supply line 801 to which power supply potential VDD is supplied, a power supply line 802 to which power supply potential GND is supplied, a control signal line 803, a control signal line 804, a control signal line 805, and TFTs 351, 352, 353, 354, 355, 356, 357, and 358.

FIG. 8 illustrates a semiconductor layer 806, a first wiring 807, a second wiring 808, and a contact hole 809. Note that the first wiring 807 functions also as a gate electrode. Further, the second wiring 808 functions also as a source electrode or a drain electrode of a thin film transistor.

The connection relationship of each circuit element in FIG. 8 is similar to that in FIG. 3B. That is, in FIG. 8, the control signal line 803 is a wiring to which a start pulse (SP) is supplied, the control signal line 804 is a wiring to which a first clock signal is supplied, the control signal line 805 is a wiring to which a second clock signal is supplied, the power supply line 801 is a wiring to which high power supply potential VDD is supplied, and the power supply line 802 is a wiring to which low power supply potential VSS is supplied.

In the layout of the pulse output circuit in FIG. 8, the TFTs 351 to 358 each include an EEMOS in this embodiment. Therefore, of current flowing through the TFT can be reduced.

Note that in each layout of the pulse output circuits illustrated in FIG. 8, the TFTs 351 to 358 may have a channel region with a U shape. Although the TFTs have the same size in FIG. 8, the size of the TFTs may be changed as appropriate depending on the amount of load of a subsequent stage.

Figure 9:
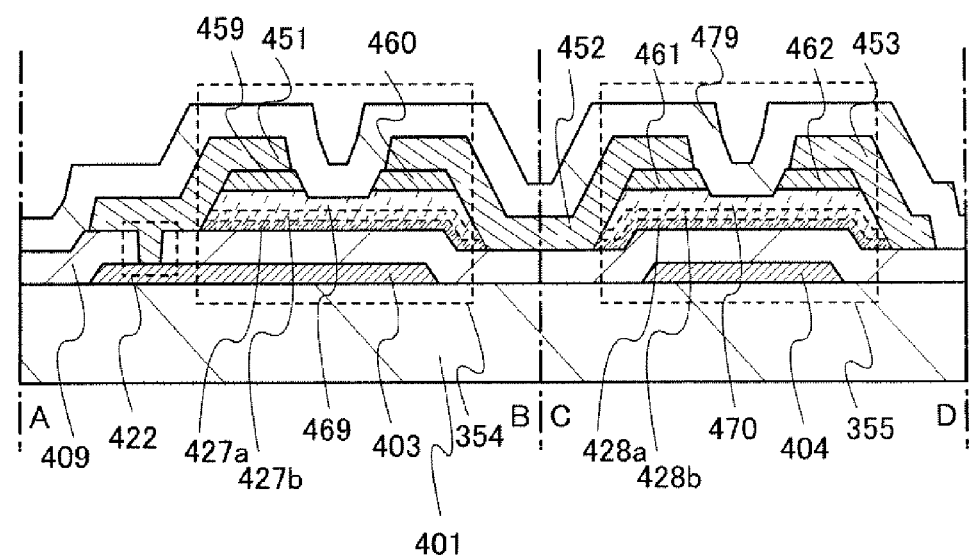
FIG. 9 is a cross-sectional view illustrating a display device according to an embodiment of the present invention.

Next, a structure of the TFT in the layout illustrated in FIG. 8 will be described with reference to FIG. 9. FIG. 9 illustrates cross sections of the TFT 354 and the TFT 355 of FIG. 8, and a manufacturing process of an inverter circuit which constitutes a driver circuit by using two n-channel TFTs will be described below. Note that FIG. 9 illustrates the cross sections of the TFTs 354 and 355 taken along dotted lines A-B and C-D of FIG. 8.

Note that the pixel portion and the driver circuit of the display device in this embodiment are formed over the same substrate. In the pixel portion, on/off of voltage application to a pixel electrode is switched using enhancement type transistors arranged in matrix.

FIG. 9 illustrates a cross-sectional structure of one embodiment of the inverter circuit of the driver circuit.

In FIG. 9, the TFT 354 includes, over a substrate 401, a gate electrode 403, a microcrystalline semiconductor layer 427*a*, a mixed layer 427*b*, a layer including an amorphous semiconductor 469, a gate insulating layer 409 provided between the gate electrode 403 and the microcrystalline semiconductor layer 427*a*, impurity semiconductor layers 459 and 460 which are in contact with the layer including an amorphous semiconductor layer 469 and function as a source and drain regions, and wirings 451 and 452 which are in contact with the impurity semiconductor layers 459 and 460, respectively.

In the TFT 354, the gate electrode 403 and the wiring 451 are directly connected to each other through a contact hole 422 formed in the gate insulating layer 409.

The TFT 355 includes, over the substrate 401, a gate electrode 404, a microcrystalline semiconductor layer 428*a*, a mixed layer 428*b*, a layer including an amorphous semiconductor 470, the gate insulating layer 409 provided between the gate electrode 404 and the microcrystalline semiconductor layer 428*a*, impurity semiconductor layers 461 and 462 which are in contact with the layer including an amorphous semiconductor 470 and function as a source and drain regions, and the wiring 452 and a wiring 453 which are in contact with the impurity semiconductor layers 461 and 462, respectively. In addition, an insulating layer 479 is formed over the TFTs 354 and 355.

As the substrate 401, a glass substrate, a ceramic substrate, a plastic substrate with heat resistance that can withstand a process temperature in this manufacturing process, or the like can be used. In the case where a substrate does not need a light-transmitting property, a substrate in which an insulating layer is provided on a surface of a substrate of a metal such as a stainless steel alloy may be used. As a glass substrate, an alkali-free glass substrate formed using barium borosilicate glass, aluminoborosilicate glass, aluminosilicate glass, or the like may be used. Further, as the glass substrate 401, a glass substrate having any of the following size can be used: 3rd generation (550 mm×650 mm); 3.5th generation (600 mm×720 mm or 620 mm×750 mm); 4th generation (680 mm×880 mm or 730 mm×920 mm); 5th generation (1100 mm×1300 mm); 6th generation (1500 mm×1850 mm); 7th generation (1870 mm×2200 mm); 8th generation (2200 mm×2400 mm); 9th generation (2400 mm×2800 mm or 2450 mm×3050 mm); and 10th generation (2950 mm×3400 mm).

The gate electrodes 403 and 404 can be formed to have a single-layer structure or a stacked-layer structure using a metal material such as molybdenum, titanium, chromium, tantalum, tungsten, aluminum, copper, neodymium, or scandium or an alloy material which contains any of these materials as its main component. Alternatively, an AgPdCu alloy or a semiconductor typified by polycrystalline silicon doped with an impurity element such as phosphorus may be used.

For example, as a stacked-layer structure of the gate electrodes 403 and 404, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably employed. When a metal layer functioning as a barrier layer is stacked over a layer with low electric resistance, electric resistance can be reduced and diffusion of a metal element from the metal layer into the semiconductor layer can be prevented.

Note that, in order to improve adhesion between the substrate 401 and the gate electrodes 403 and 404, a nitride layer of any of the aforementioned metal materials may be provided between the substrate 401 and the gate electrodes 403 and 404.

The gate insulating layer 409 can be formed to have a single-layer structure or a stacked-layer structure using a silicon oxide layer, a silicon nitride layer, a silicon oxynitride layer, or a silicon nitride oxide layer by a CVD method, a sputtering method, or the like. Further, the gate insulating layer 409 is formed using silicon oxide or silicon oxynitride, so that fluctuation in threshold voltage of the thin film transistor can be suppressed.

Note that, in this specification, silicon oxynitride includes more oxygen than nitrogen and, in the case where measurements are conducted using Rutherford backscattering spectrometry (RBS) and hydrogen forward scattering (HFS), includes oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Further, silicon nitride oxide includes more nitrogen than oxygen, and in the case where measurements are conducted using RBS and HFS, preferably includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in silicon oxynitride or silicon nitride oxide is defined as 100 atomic %.

A microcrystalline semiconductor included in the microcrystalline semiconductor layers 427a and 428a is a semiconductor having an intermediate structure between amorphous and crystalline (including single crystalline and polycrystalline) structures. A microcrystalline semiconductor is a semiconductor having a third state that is stable in terms of free energy and is a crystalline semiconductor having short-range order and lattice distortion, in which columnar or needle-like crystals having a grain size of from 2 nm to 200 nm, preferably from 10 nm to 80 nm, more preferably from 20 nm to 50 nm have grown in a direction normal to the substrate surface. Therefore, a crystal grain boundary is formed at the interface of the columnar or needle-like crystals in some cases.

A Raman spectrum of microcrystalline silicon, which is a typical example of a microcrystalline semiconductor, shifts to the lower wavenumber side than 520 cm$^{-1}$ which represents single crystal silicon. That is, a peak of a Raman spectrum of microcrystalline silicon lies between 520 cm$^{-1}$ which represents that of single crystal silicon, and 480 cm$^{-1}$ which represents that of amorphous silicon. Furthermore, microcrystalline silicon includes hydrogen or a halogen at 1 atomic % or more in order to terminate a dangling bond. Moreover, microcrystalline silicon may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

It is preferable that the concentration of oxygen and nitrogen contained in the microcrystalline semiconductor layers 427a and 428a measured by secondary ion mass spectrometry be less than $1 \times 10^{18}$ atoms/cm$^3$ because the crystallinity of the microcrystalline semiconductor layers 427a and 428a can be improved.

The layers including an amorphous semiconductor 469 and 470 have an amorphous structure. Further, the layers including an amorphous semiconductor 469 and 470 may include crystal grains having a grain size of greater than or equal to 1 nm and less than or equal to 10 nm, preferably, greater than or equal to 1 nm and less than or equal to 5 nm. The layer including an amorphous semiconductor here has lower energy at an Urbach edge and a small number of absorption spectra of defects measured by constant photocurrent method (CPM) or photoluminescence spectroscopy, as compared with a conventional amorphous semiconductor layer. That is, compared with the conventional amorphous semiconductor layer, the layer including an amorphous semiconductor here is a well-ordered semiconductor layer which has fewer defects and whose tail of a level at a band edge in the valence band is steep. Since the tail of a level at a band edge in the valence band is steep, the band gap becomes wide, and tunneling current does not easily flow.

Note that an amorphous semiconductor included in the layers including an amorphous semiconductor 469 and 470 is typically amorphous silicon.

The layers including an amorphous semiconductor 469 and 470 may include a halogen, nitrogen, an NH group, or an NH$_2$ group.

Figure 10A:
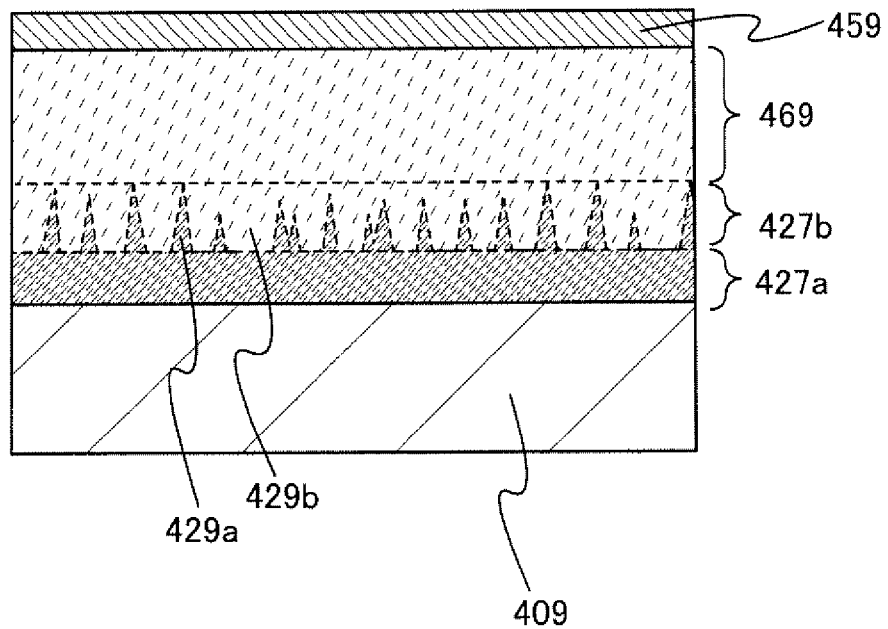
FIGS. 10A and 10B are cross-sectional views each illustrating a display device according to an embodiment of the present invention.
Figure 10B:
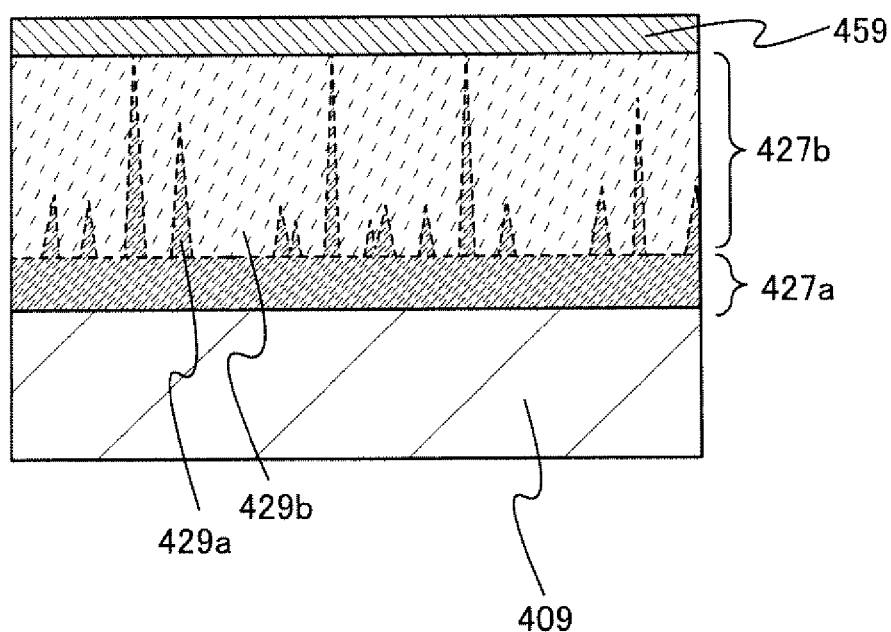

FIGS. 10A and 10B each illustrate an enlarged view of a region between the gate insulating layer 409 and the impurity semiconductor layer 459 functioning as a source or drain region, so that the mixed layer 427b will be described in detail.

As illustrated in FIG. 10A, the mixed layer 427b is provided between the microcrystalline semiconductor layer 427a and the layer including an amorphous semiconductor 469. The mixed layer 427b includes microcrystalline semiconductor regions 429a and amorphous semiconductor regions 429b filling the space except the microcrystalline semiconductor regions 429a. Specifically, the mixed layer 427b includes the microcrystalline semiconductor regions 429a which grow with a convex shape from the microcrystalline semiconductor layer 427a and the amorphous semiconductor regions 429b which are formed using the same kind of semiconductor as the layer including an amorphous semiconductor 469.

The layer including an amorphous semiconductor 469 is formed using a semiconductor layer which has few defects and whose tail of a level at a band edge in the valance band is steep; thus, off current of the thin film transistor can be reduced. Further, the mixed layer 427h includes the conical or pyramidal microcrystalline semiconductor regions 429a. Therefore, resistance, which is in a vertical direction (a film thickness direction) when the thin film transistor is in an on state and voltage is applied to the wiring, that is, resistance between the mixed layer 427b and the source or drain region can be decreased; thus, on current of the thin film transistor can be increased.

Note that the microcrystalline semiconductor regions 429a included in the mixed layer 427b are semiconductors the quality of which is almost the same as the quality of the microcrystalline semiconductor layer 427a, while the amorphous semiconductor regions 429b included in the mixed layer 427b are semiconductors the quality of which is almost the same as the quality of the layer including an amorphous semiconductor 469. Therefore, an interface between the microcrystalline semiconductor layer and the layer including an amorphous semiconductor corresponds to an interface between the microcrystalline semiconductor regions 429a and the amorphous semiconductor regions 429b in the mixed layer; thus, in other words, the interface between the microcrystalline semiconductor layer and the layer including an amorphous semiconductor has asperity.

Alternatively, as illustrated in FIG. 10B, the mixed layer 427b may be provided between the microcrystalline semiconductor layer 427a and the impurity semiconductor layer 459. That is, according to this structure, the layer including an amorphous semiconductor 469 is not formed between the mixed layer 427b and the impurity semiconductor layer 459. In that case, in the structure illustrated in FIG. 10B, the proportion of the microcrystalline semiconductor regions 429a in the mixed layer 427b to that of the amorphous semiconductor regions 429b in the mixed layer 427b is preferably low. As a result, off current of the thin film transistor can be reduced. In addition, resistance which is in a vertical direction (a film thickness direction) when the thin film transistor is in an on state and voltage is applied to the wiring, that is, resistance between the mixed layer 427b and the source or drain region can be decreased. Accordingly, on current of the thin film transistor can be increased.

The microcrystalline semiconductor regions 429a are formed using microcrystalline semiconductors each having a conical or pyramidal shape or a projecting shape whose end is narrowed from the gate insulating layer 409 toward the layer including an amorphous semiconductor 469. Note that the microcrystalline semiconductor regions 429a may be formed using microcrystalline semiconductors each of which has a conical or pyramidal shape or a projecting shape having a width increased from the gate insulating layer 409 toward the layer including an amorphous semiconductor 469.

In the case where the microcrystalline semiconductor regions 429a have projecting portions each of whose end is narrowed from the gate insulating layer 409 toward the layer including an amorphous semiconductor 469, the proportion of the microcrystalline semiconductor regions on the side of the microcrystalline semiconductor layer 427a in the mixed layer 427b is higher than that of the microcrystalline semiconductor regions on the side of the layer including an amorphous semiconductor 469 in the mixed layer 427b. The reason thereof is as follows: The microcrystalline semiconductor regions 429a grow in a film thickness direction from a surface of the microcrystalline semiconductor layer 427a, but, by adding a gas containing nitrogen in a source gas, or by adding a gas containing nitrogen in a source gas and lowering the flow rate of hydrogen to silane than that of hydrogen to silane in forming the microcrystalline semiconductor film, crystal growth of the microcrystalline semiconductor regions 429a is suppressed gradually, and the crystal grains become to have a conical or pyramidal shape, and finally, amorphous semiconductor regions are deposited.

The mixed layer 427b preferably includes nitrogen. This is because defects are reduced in the case where nitrogen, typically an NH group or an $NH_2$ group, is combined with dangling bonds of silicon atoms at the interface between the crystal grains included in the microcrystalline semiconductor regions 429a, and at the interface between the microcrystalline semiconductor regions 429a and the amorphous semiconductor regions 429b. Accordingly, the nitrogen concentration of the mixed layer 427b is set at greater than or equal to $1 \times 10^{19}$ atoms/$cm^3$ and less than or equal to $1 \times 10^{21}$ atoms/$cm^3$, preferably, greater than or equal to $1 \times 10^{20}$ atoms/$cm^3$ and less than or equal to $1 \times 10^{21}$ atoms/$cm^3$, and therefore, the dangling bonds of silicon atoms can be easily combined with nitrogen, preferably an NH group, so that carriers can also flow easily. Alternatively, the dangling bonds of the semiconductor atoms at the aforementioned interface are terminated with the $NH_2$ group, so that the defect level disappears. As a result, resistance in a vertical direction (a film thickness direction) when the thin film transistor is in an on state and voltage is applied between the source electrode and drain electrode is reduced. That is, field effect mobility and on current of the thin film transistor are increased.

Further, by reducing the oxygen concentration of the mixed layer 427b, bonding which interrupts carrier transfer at the interface between the microcrystalline semiconductor regions 429a and the amorphous semiconductor regions 429b and at the interface between the crystal grains can be reduced.

Note that, here, the microcrystalline semiconductor layer 427a refers to a region whose thickness is almost uniform. The interface between the microcrystalline semiconductor layer 427a and the mixed layer 427b refers to a region obtained by extending the nearest region to the gate insulating layer 409 in a flat portion of the interface between the microcrystalline semiconductor regions 429a and the amorphous semiconductor regions 429b.

The off current of the TFTs can be reduced by setting the total thickness of the microcrystalline semiconductor layer 427a and the mixed layer 427b, that is, the distance from the interface between the microcrystalline semiconductor layer 427a and the gate insulating layer 409 to the tip of the projection of the mixed layer 427b, to be greater than or equal to 3 nm and less than or equal to 80 nm, preferably, greater than or equal to 5 nm and less than or equal to 30 nm.

The impurity semiconductor layers 459 to 462 are formed using amorphous silicon to which phosphorus is added, microcrystalline silicon to which phosphorus is added, or the like. Note that, in the case where a p-channel thin film transistor is formed as a thin film transistor, the impurity semiconductor layers 459 to 462 are formed using microcrystalline silicon to which boron is added, amorphous silicon to which boron is added, or the like. Note that, in the case where the mixed layers 427b and 428b, or the layers including an amorphous semiconductor 469 and 470 have an ohmic contact with the wirings 451 to 453, the impurity semiconductor layers 459 to 462 are not necessarily formed.

Further, in the case where the impurity semiconductor layers 459 to 462 are formed using microcrystalline silicon to which phosphorus is added or microcrystalline silicon to which boron is added, a microcrystalline semiconductor layer, typically a microcrystalline silicon layer, is formed between the mixed layers 427b and 428b or the layers including an amorphous semiconductor 469 and 470 and the impurity semiconductor layers 459 to 462, so that characteristics of the interface can be improved. As a result, resistance generated at the interface between the impurity semiconductor layers 459 to 462 and the mixed layers 427b and 428b or the layers including an amorphous semiconductor 469 and 470 can be reduced. As a result, the amount of current flowing through the source region, the semiconductor layer, and the drain region of the thin film transistor can be increased and on current and field effect mobility can be increased.

The wirings 451 to 453 can be formed to have a single-layer structure or a stacked-layer structure using any of aluminum, copper, titanium, neodymium, scandium, molybdenum, chromium, tantalum, tungsten, and the like. Alternatively, an aluminum alloy to which an element to prevent a hillock is added (e.g., an aluminum-neodymium alloy or the like that can be used for the gate electrodes 403 and 404) may be used. Alternatively, crystalline silicon to which an impurity element serving as a donor is added may be used. The wirings 451 to 453 may have a stacked-layer structure in which a layer on the side which is in contact with the crystalline silicon to which an impurity element serving as a donor is added is formed using titanium, tantalum, molybdenum, tungsten, or nitride of any of these elements and aluminum or an aluminum alloy is formed thereover. Alternatively, the wirings 451 to 453 may have a stacked-layer structure in which a top surface and a bottom surface of a layer of aluminum or an aluminum alloy are each covered with titanium, tantalum, molybdenum, tungsten, or nitride of any of these elements.

As illustrated in FIG. 9, the wiring 451 of the TFT 354 is directly connected with the gate electrode 403 of the TFT 354 through the contact hole 422 formed in the gate insulating layer 409. By the direct connection, favorable contact can be obtained, which leads to reduction in contact resistance. In comparison with the case where the gate electrode 403 and the wiring 451 are connected through another conductive layer, e.g., a transparent conductive layer, the number of contact holes can be reduced; therefore, reduction in an area occupied by the TFTs can be achieved.

Next, a structure in which the gate electrode 403 of the TFT 354 and the wiring 451 are connected by a method different from the method illustrated in FIG. 8 and FIG. 9 will be described with reference to FIG. 11 and FIG. 12.

Figure 11:
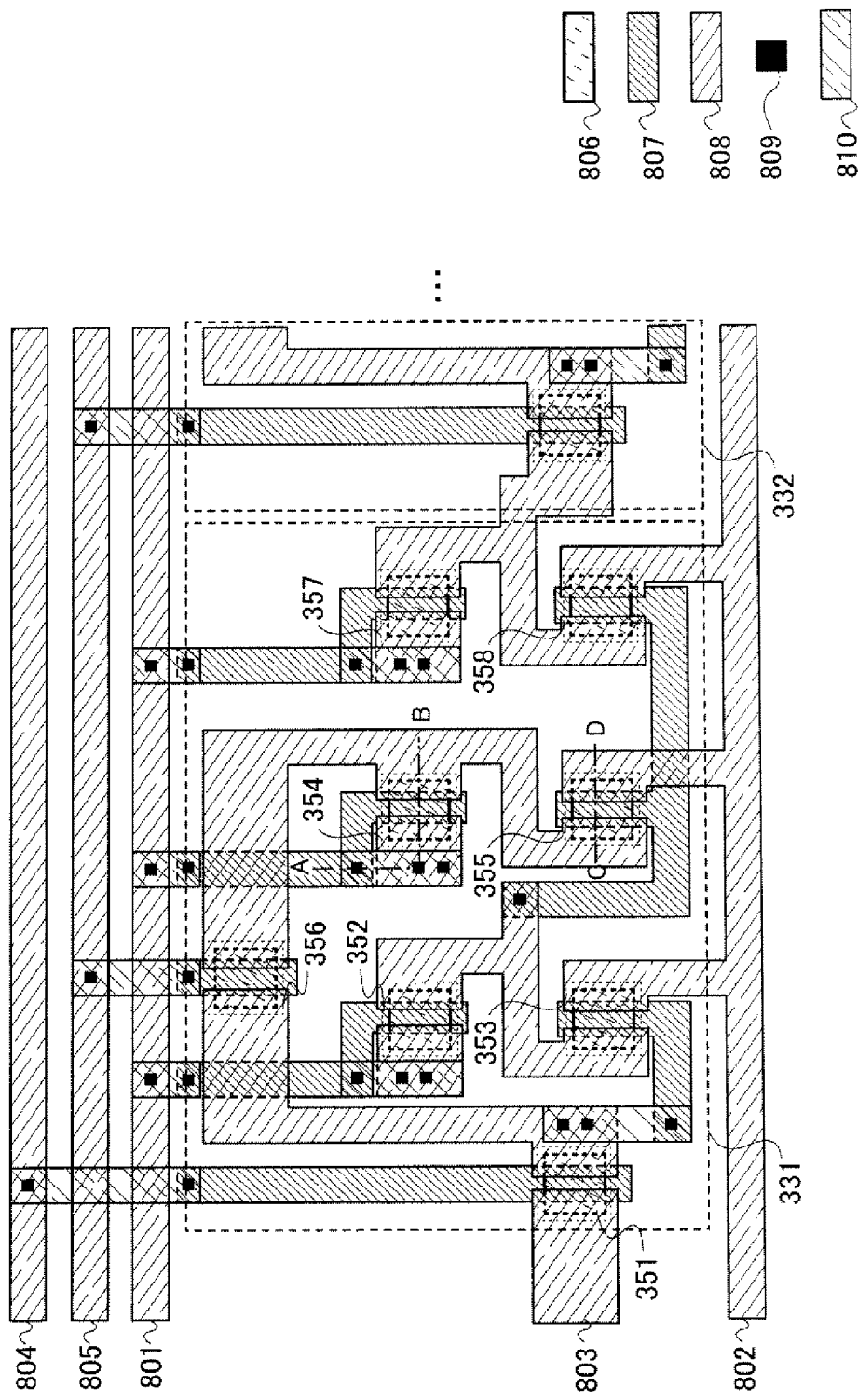
FIG. 11 is a top view illustrating a display device according to an embodiment of the present invention.

FIG. 11 is a layout (a top view) of the pulse output circuit of FIG. 3B. Note that, in FIG. 11, a pulse output circuit of a first stage of plural stages of pulse output circuits is described. Note that description of parts with similar structures to those of FIG. 8 is omitted. In FIG. 11, the first wiring 807 and the second wiring 808 are connected using a third wiring 810. Note that the third wiring 810 is formed at the same time as a pixel electrode in a pixel portion which will be described in Embodiment 4.

Figure 12:
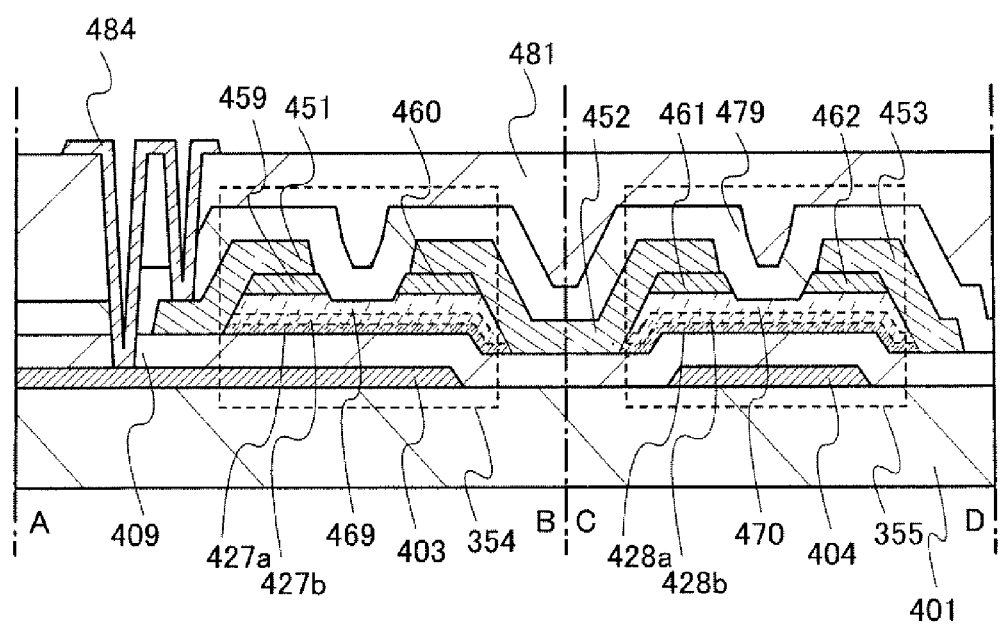
FIG. 12 is a cross-sectional view illustrating a display device according to an embodiment of the present invention.

FIG. 12 illustrates cross sections of the TFT 354 and the TFT 355 of FIG. 11 as an example, and a manufacturing process of an inverter circuit which constitutes a driver circuit by using two n-channel thin film transistors will be described below. Note that FIG. 12 illustrates the cross sections of the TFTs 354 and 355 taken along dotted lines A-B and C-D of FIG. 11.

In FIG. 12, an insulating layer 481 is formed over the insulating layer 479. Further, a wiring 484 is formed so as to connect the gate electrode 403 and the wiring 451 through a contact hole formed in the insulating layers 479 and 481 and a contact hole formed in the gate insulating layer 409 and the insulating layers 479 and 481.

As the insulating layer 481, acrylic, epoxy, polyimide, polyimide, polyvinyl phenol, benzocyclobutene, a silicone resin, or the like can be used. Alternatively, a siloxane polymer can be used. For the insulating layer 481, a photosensitive resin or a non-photosensitive resin can be used as appropriate. Note that the insulating layer 481 is not necessarily provided.

The wiring 484 can be formed at the same time as formation of a pixel electrode 1143 which will be described in Embodiment 4; thus, the wiring 484 which connects the gate electrode 403 and the wiring 451 can be formed without addition of the number of photomasks. Therefore, the number of manufacturing steps can be reduced, which leads to cost reduction.

Next, a structure different from the TFTs 354 and 355 illustrated in FIG. 8, FIG. 9, FIGS. 10A and 10B, FIG. 11, and FIG. 12 will be described with reference to FIG. 13 and FIGS. 14A and 14B.

Figure 13:
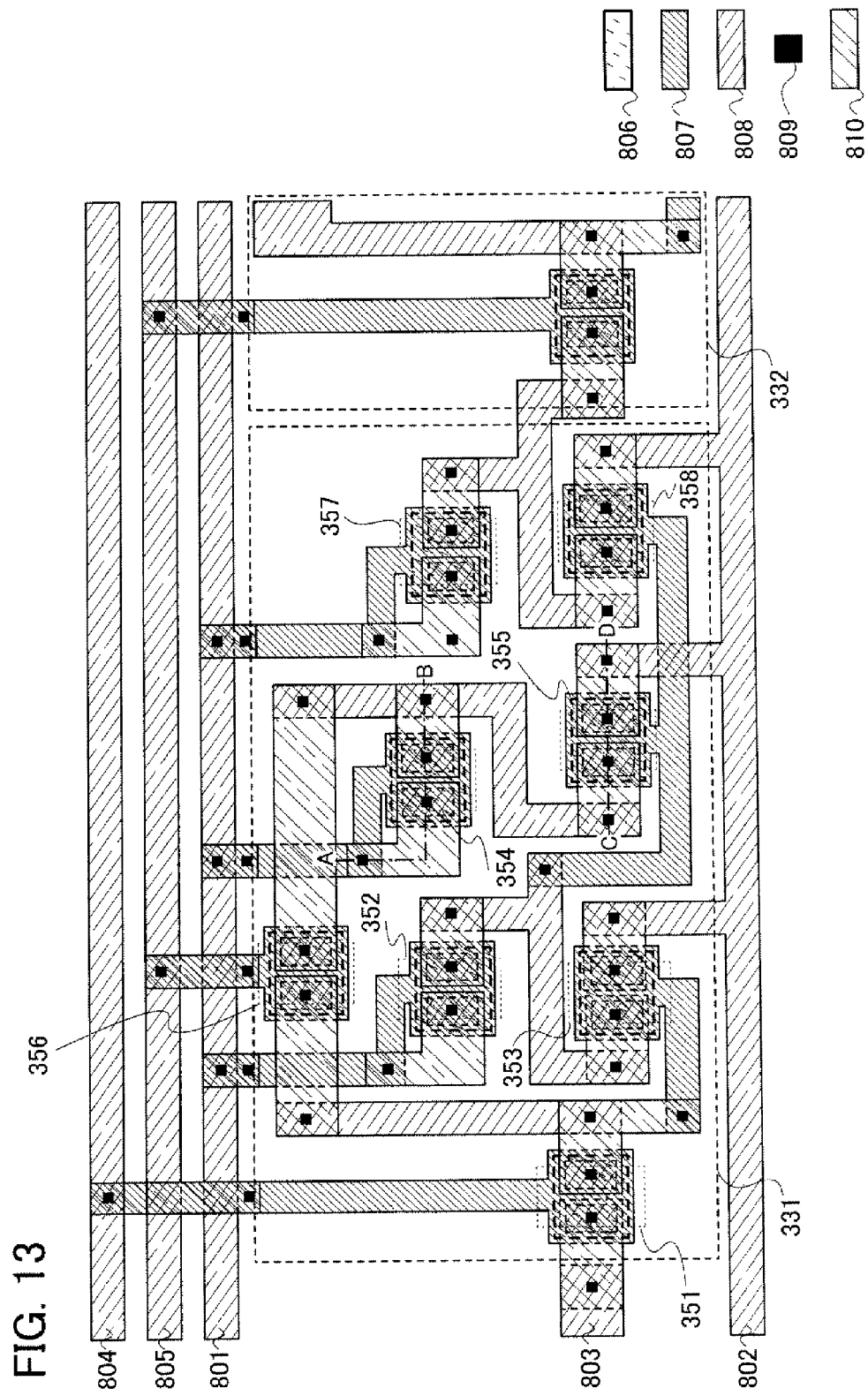
FIG. 13 is a top view illustrating a display device according to an embodiment of the present invention.

FIG. 13 is a layout (a top view) of the pulse output circuit of FIG. 3B. Note that, in FIG. 13, a pulse output circuit of a first stage of plural stages of pulse output circuits is described. Note that description of parts with similar structures to those of FIG. 8 is omitted. In FIG. 13, the first wiring 807 and the second wiring 808 are connected using the third wiring 810. Part of the second wiring 808 in a formation region of TFTs and the other part of the second wiring 808 in a region other than the formation region of the TFTs are connected through the third wiring 810. Note that the third wiring 810 is formed at the same time as a pixel electrode in a pixel portion which will be described in Embodiment 4. The area of the semiconductor layer 806 is smaller than that of the first wiring 807.

Figure 14A:
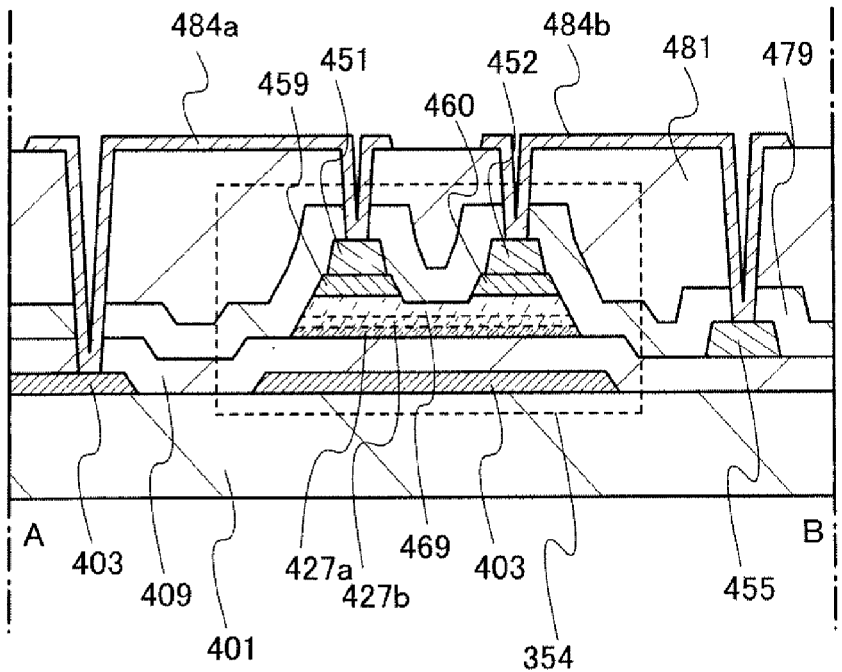
FIGS. 14A and 14B are cross-sectional views illustrating a display device according to an embodiment of the present invention.
Figure 14B:
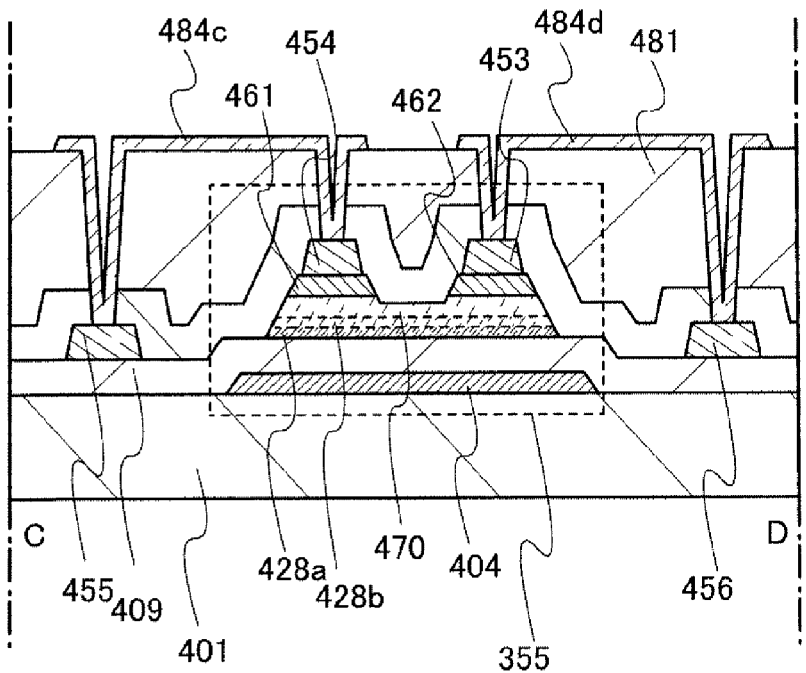

FIGS. 14A and 14B illustrate cross sections of the TFT 354 and the TFT 355 of FIG. 13, and a manufacturing process of an inverter circuit which forms a driver circuit by using two n-channel thin film transistors will be described below. Note that FIGS. 14A and 14B illustrate the cross sections of the TFTs 354 and 355 taken along dotted lines A-B and C-D of FIG. 13.

In FIG. 14A, the TFT 354 has a structure in which respective areas of the microcrystalline semiconductor layer 427a, the mixed layer 427b, and the layer including an amorphous semiconductor 469 are smaller than the area of the gate electrode 403, and the microcrystalline semiconductor layer 427a, the mixed layer 427b, and the layer including an amorphous semiconductor 469 are provided on the inner side of the gate electrode 403; while in FIG. 14B, the TFT 355 has a structure in which respective areas of the microcrystalline semiconductor layer 428a, the mixed layer 428b, and the layer including an amorphous semiconductor 470 are smaller than the area of the gate electrode 404, and the microcrystalline semiconductor layer 428a, the mixed layer 428b, and the layer including an amorphous semiconductor 470 are provided on the inner side of the gate electrode 404.

The wirings 451, 452, 453, and 454 are in contact with the impurity semiconductor layers 459, 460, 462, and 461, respectively. The wirings 451 and 452 are not in contact with the microcrystalline semiconductor layer 427a, the mixed layer 427b, and the layer including an amorphous semiconductor 469, while the wirings 453 and 454 are not in contact with the microcrystalline semiconductor layer 428a, the mixed layer 428b, and the layer including an amorphous semiconductor 470. The wirings 451, 452, 453, and 454 each function as a source electrode or a drain electrode, and a wiring 455 which electrically connects the wiring 452 and the wiring 454, and a wiring 456 which functions as a leading wiring are provided over the gate insulating layer 409.

A wiring 484a which connects the gate electrode 403 and the wiring 451, a wiring 484b which connects the wiring 452 and the wiring 455, a wiring 484c which connects the wiring 454 and the wiring 455, and a wiring 484d which connects the wiring 453 and the wiring 456 are formed over the insulating layer 481. Note that the wirings 484a to 484d may be formed over the insulating layer 479 without the insulating layer 481 being formed.

In FIG. 13 and FIGS. 14A and 14B, the TFT 354 has a structure in which respective areas of the microcrystalline semiconductor layer 427a, the mixed layer 427b, and the layer including an amorphous semiconductor 469 are smaller than the area of the gate electrode 403, and the microcrystalline semiconductor layer 427a, the mixed layer 427b, and the layer including an amorphous semiconductor 469 are provided on the inner side of the gate electrode 403; while the TFT 355 has a structure in which respective areas of the microcrystalline semiconductor layer 428a, the mixed layer 428b, and the layer including an amorphous semiconductor 470 are smaller than the area of the gate electrode 404, and the microcrystalline semiconductor layer 428a, the mixed layer 428b, and the layer including an amorphous semiconductor 470 are provided on the inner side of the gate electrode 404. Therefore, the microcrystalline semiconductor layers 427a and 428a, the mixed layers 427b and 428b, and the layers including an amorphous semiconductor 469 and 470 are not irradiated with light of a backlight of a liquid crystal display device, and increase in off current can be suppressed. Further, in the case where the microcrystalline semiconductor layers 427a and 428a are in contact with a wiring, when voltage is applied to the gate electrodes 403 and 404, Schottky junction is formed between the microcrystalline semiconductor layers 427a and 428a and the wiring, and leakage current flows; however, in FIGS. 14A and 14B, the TFT 354 has a structure in which the microcrystalline semiconductor layer 427a is not in contact with the wirings 451 and 452, and the TFT 355 has a structure in which the microcrystalline semiconductor layer 428a is not in contact with the wirings 453 and 454. Accordingly, leakage current can be reduced; thus, off current of the thin film transistor can be reduced.

As described above with reference to FIG. 9, FIGS. 10A and 10B, FIG. 11, FIG. 12, FIG. 13, and FIGS. 14A and 14B, a driver circuit can be formed using a thin film transistor whose on current is high and off current is suppressed. In addition, a driver circuit is formed by using an enhancement type transistor whose leakage current is low, whereby power consumption can be reduced.

Next, a manufacturing process of an inverter circuit illustrated in the cross-sectional view of FIG. 9 in which a driver circuit is formed using two n-channel transistors will be described with reference to FIGS. 15A to 15D. Note that cross sections of the TFTs 354 and 355 are taken along dotted lines A-B and C-D in FIG. 8.

Figure 15A:
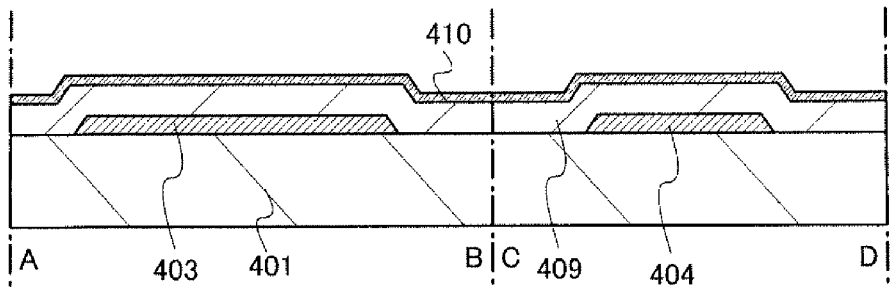
FIGS. 15A to 15D are cross-sectional views illustrating a method for manufacturing a display device according to an embodiment of the present invention.

As illustrated in FIG. 15A, the gate electrodes 403 and 404 are formed over the substrate 401. Next, the gate insulating layer 409 and a first semiconductor layer 410 are formed so as to cover the gate electrodes 403 and 404.

The gate electrodes 403 and 404 can be formed in such a manner that a conductive layer is formed over the substrate 401 with the use of the above material by a sputtering method or a vacuum evaporation method, a mask is formed over the conductive layer by a photolithography method, an inkjet method, or the like, and the conductive layer is etched using the mask. Alternatively, the gate electrodes 403 and 404 can be formed by discharging a conductive nanopaste of silver, gold, copper, or the like on the substrate by an inkjet method and baking the conductive nanopaste. Note that as barrier metal which increases adhesion between the gate electrodes 403 and 404 and the substrate 401 and prevents diffusion into a base, a nitride layer of any of the above-described metal materials may be provided between the substrate 401 and the gate electrodes 403 and 404. Here, the gate electrodes 403 and 404 are formed by forming the conductive layer over the substrate 401 and etching the conductive layer by using a resist mask formed using a photomask.

Note that, in a photolithography step, a resist may be applied to an entire surface over a substrate. Alternatively, a resist is printed by a printing method on a region in which a resist mask is to be formed, and then, the resist is be exposed to light, whereby a resist can be saved, and cost can be reduced. Further alternatively, instead of exposing a resist to light by using a light-exposure machine, a laser beam direct drawing apparatus may be used to expose a resist to light.

Note that side surfaces of the gate electrodes 403 and 404 are preferably tapered. This is in order to prevent disconnection at a step portion because the semiconductor layer and the wiring layer are to be formed over the gate electrodes 403 and 404 in a later step. In order that the side surfaces of the gate electrodes 403 and 404 are tapered, etching may be performed while the resist mask is made to recede.

Through the step of forming the gate electrodes 403 and 404, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, without limitation thereto, the gate electrodes 403 and 404 and one or both of a gate wiring and a capacitor wiring may be formed separately.

The gate insulating layer 409 can be formed using a CVD method, a sputtering method, or the like. Further, the gate insulating layer 409 may be formed using a microwave plasma CVD apparatus with a high frequency (1 GHz or more). When the gate insulating layer 409 is formed by a microwave plasma CVD apparatus with a high frequency, the withstand voltage between a gate electrode and a drain electrode or a source electrode can be improved; therefore, a highly reliable thin film transistor can be obtained. Further, by forming a silicon oxide layer as the gate insulating layer 409 by a CVD method using an organosilane gas, the amount of hydrogen contained in the gate insulating layer can be reduced and fluctuation in threshold voltage of the thin film transistor can be reduced. As the organosilane gas, the following compound containing silicon can be used: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

The first semiconductor layer 410 is formed using microcrystalline silicon, microcrystalline silicon germanium, microcrystalline germanium, or the like. The first semiconductor layer 410 is formed to have a thickness of greater than or equal to 1 nm and less than or equal to 20 nm, preferably, greater than or equal to 3 nm and less than or equal to 10 nm.

The first semiconductor layer 410 is formed by glow discharge plasma with a mixture of a deposition gas including silicon or germanium and hydrogen in a reaction chamber of a plasma CVD apparatus. Alternatively, the first semiconductor layer 410 is formed by glow discharge plasma with a mixture of a deposition gas including silicon or germanium, hydrogen, and a rare gas such as helium, neon, or krypton. The microcrystalline silicon, the microcrystalline silicon germanium, the microcrystalline germanium, or the like is formed using a mixture of the deposition gas including silicon or germanium and hydrogen, which is obtained by diluting the deposition gas with hydrogen whose flow rate is 10 to 2000 times, preferably 10 to 200 times that of the deposition gas.

As typical examples of the deposition gas including silicon or germanium, $SiH_4$, $Si_2H_6$, $GeH_4$, $Ge_2H_6$ and the like can be given.

A rare gas such as helium, argon, neon, krypton, or xenon is used as a source gas for the first semiconductor layer 410, whereby the deposition rate of the first semiconductor layer 410 can be increased. In addition, as the deposition rate of the first semiconductor layer 410 is increased, the amount of impurities contained in the first semiconductor layer 410 is reduced; thus, the crystallinity of the first semiconductor layer 410 can be increased. Therefore, on current and field effect mobility of the thin film transistor can be increased, and the display device can be manufactured with high productivity.

Note that before the first semiconductor layer 410 is formed, impurity elements in the treatment chamber of the CVD apparatus are removed by introducing a deposition gas including silicon or germanium while exhausting the air in the treatment chamber, so that impurity elements in the gate insulating layer 409 and the first semiconductor layer 410 to be formed later of the thin film transistor can be reduced and thus, electrical characteristics of the thin film transistor can be improved.

Figure 15B:
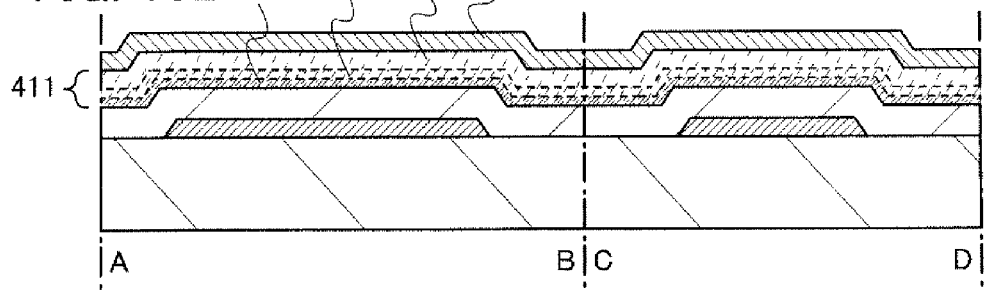

Next, as illustrated in FIG. 15B, a semiconductor layer is stacked over the first semiconductor layer 410 to form a second semiconductor layer 411. Here, the second semiconductor layer 411 including a microcrystalline semiconductor layer 411a, a mixed layer 411b, and a layer including an amorphous semiconductor 411c is formed under a condition in which part of the crystal region grows with the first semiconductor layer 410 as a seed crystal. Note that, here, for convenience, a structure in which the second semiconductor layer 411 includes the first semiconductor layer 410, that is, a structure in which the first semiconductor layer 410 is included in the microcrystalline semiconductor layer 411a is described.

The second semiconductor layer 411 is formed by glow discharge plasma with a mixture of a deposition gas including silicon or germanium, hydrogen, and a gas including nitrogen in a reaction chamber of a plasma CVD apparatus. Ammonia, nitrogen, nitrogen fluoride, and nitrogen chloride can be given as examples of the gas including nitrogen; however, without limitation thereto, any gas can be employed as long as it includes nitrogen.

At this time, a condition for forming a microcrystalline semiconductor layer is used for the flow rate ratio of the deposition gas including silicon or germanium to hydrogen in a manner similar to formation of the first semiconductor layer 410, and in addition, the gas including nitrogen is used for a source gas, whereby crystal growth can be reduced as compared with the case of forming the first semiconductor layer 410. As a result, the mixed layer 411b and the layer including an amorphous semiconductor 411c, which is formed with a semiconductor layer having a small number of defects and a steep tail slope of a level at a band edge in the valence band, can be formed in the second semiconductor layer 411.

Here, a typical example of a condition for forming a microcrystalline semiconductor layer is as follows: The flow rate ratio of hydrogen is 10 to 2000 times, preferably, 10 to 200 times that of the deposition gas including silicon or germanium. Note that a typical example of a condition for forming an amorphous semiconductor layer normally is as follows: The flow rate ratio of hydrogen is 0 to 5 times that of the deposition gas including silicon or germanium.

A rare gas such as helium, neon, argon, xenon, or krypton is introduced into a source gas for the second semiconductor layer 411, whereby the deposition rate of the second semiconductor layer 411 can be increased.

In an early stage of deposition of the second semiconductor layer 411, the first semiconductor layer 410 serves as a seed crystal and a microcrystalline semiconductor layer is deposited over the entire area over the first semiconductor layer 410 (an early stage of deposition). After that, crystal growth is partially suppressed and conical or pyramidal microcrystalline semiconductor regions are formed (a middle stage of deposition). Further, crystal growth of the conical or pyramidal microcrystalline semiconductor regions is suppressed and a layer including an amorphous semiconductor is formed (a later stage of deposition).

Accordingly, the microcrystalline semiconductor layers 427a and 428a illustrated in FIG. 9, FIGS. 10A and 10B, FIG. 12, and FIGS. 14A and 14B correspond to the first semiconductor layer 410 in FIG. 15A and a microcrystalline semiconductor layer which is formed in an early stage of deposition of the second semiconductor layer 411, i.e., the microcrystalline semiconductor layer 411a in FIG. 15B.

Further, the mixed layers 427b and 428b illustrated in FIG. 9, FIGS. 10A and 10B, FIG. 12, and FIGS. 14A and 14B correspond to a layer which includes the conical or pyramidal microcrystalline semiconductor regions and regions filling the space except the conical or pyramidal microcrystalline regions and is formed in a middle stage of deposition of the second semiconductor layer 411 in FIG. 15B, i.e., the mixed layer 411b.

The layers including an amorphous semiconductor 469 and 470 illustrated in FIG. 9, FIGS. 10A and 10B, FIG. 12, and FIGS. 14A and 14B correspond to the layer including an amorphous semiconductor 411c, which is formed in a later stage of deposition of the second semiconductor layer 411 illustrated in FIG. 15B.

The layer including an amorphous semiconductor 411c is a semiconductor layer that is similar to the layers including an amorphous semiconductor 469 and 470 illustrated in FIG. 9, and is formed using a well-ordered semiconductor layer which has a small number of defects and whose tail of a level at a band edge in the valence band is steep; therefore, the slope of a band tail is steeper as compared with the band tail of amorphous silicon, the band gap gets wider, and tunneling current does not easily flow. Accordingly, off current of the thin film transistor can be reduced. In addition, a degree of shift of the threshold voltage of the thin film transistor can be reduced.

Next, as illustrated in FIG. 15B, an impurity semiconductor layer 417 is formed over the second semiconductor layer 411.

The impurity semiconductor layer 417 is formed by glow discharge plasma with a mixture of a deposition gas including silicon or germanium, hydrogen, and phosphine (diluted with hydrogen or silane) in a reaction chamber of a plasma CVD apparatus. Amorphous silicon to which phosphorus is added, microcrystalline silicon to which phosphorus is added, amorphous silicon germanium to which phosphorus is added, microcrystalline silicon germanium to which phosphorus is added, amorphous germanium to which phosphorus is added, microcrystalline germanium to which phosphorus is added, or the like is formed by diluting the deposition gas including silicon or germanium with hydrogen.

Next, after a resist mask is formed over the impurity semiconductor layer 417 by a photolithography step, the second semiconductor layer 411 and the impurity semiconductor layer 417 are separated into each element by using the resist mask, whereby a second semiconductor layer 427 (a stacked-layer body of the microcrystalline semiconductor layer 427a, the mixed layer 427b, and the layer including an amorphous semiconductor 427c), a second semiconductor layer 428 (a stacked-layer body of the microcrystalline semiconductor layer 428a, the mixed layer 428b, and the layer including an amorphous semiconductor 428c), and impurity semiconductor layers 423 and 424 are formed. After that, the resist mask is removed.

Next, a resist mask is formed over the gate insulating layer 409 by a photolithography step, and then, the contact hole 422 is formed in the gate insulating layer 409 by using the resist mask. Next, a conductive layer 419 is formed.

Note that the contact hole 422 may be formed before the first semiconductor layer 410 is formed.

The conductive layer 419 can be formed using a material similar to that of the wirings 451 to 453 illustrated in FIG. 9. The conductive layer 419 is formed by a CVD method, a sputtering method, or a vacuum evaporation method. Further, the conductive layer 419 may be formed by discharging a conductive nanopaste of silver, gold, copper, or the like by a screen printing method, an inkjet method, or the like and baking the conductive nanopaste.

The conductive layer 419 is etched using a resist mask which is formed by a photolithography step, so that the wirings 451 to 453 are formed. The etching of the conductive layer 419 is preferably performed by wet etching. By wet etching, the conductive layer 419 is isotropically etched. As a result, the wirings 451 to 453 are made to recede to an inner side than the side surface of the resist mask. The wirings 451 to 453 serve not only as source and drain electrodes but also as a signal line. However, without limitation thereto, the wirings 451 to 453 may be provided separately from the signal line and the source and drain electrodes.

Next, each of the impurity semiconductor layers 423 and 424 and the layers including an amorphous semiconductor 427c and 428c is partially etched using a resist mask. Here, dry etching is employed. The layers including an amorphous semiconductor 469 and 470 which function as electric-field relaxation buffer layers, and the impurity semiconductor layers 459 to 462 are formed through the process up to this step. After that, the resist mask is removed.

Note that, here, after the conductive layer 419 is etched by wet etching, each of the layers including an amorphous semiconductor 427e and 428c and the impurity semiconductor layers 423 and 424 is partially etched by dry etching while the resist mask remains. Thus, the conductive layer 419 is isotropically etched, and side surfaces of the wirings 451 to 453 are not aligned with side surfaces of the impurity semiconductor layers 459 to 462 functioning as source and drain regions. In other words, the side surfaces of the impurity semiconductor layers 459 to 462 are formed on the outer side of the side surfaces of the wirings 451 to 453. However, after the conductive layer 419 is etched by wet etching, the resist mask is removed and each of the layers including an amorphous semiconductor 427c and 428c and the impurity semiconductor layers 423 and 424 is partially etched by dry etching using the wirings 451 to 453 as a mask, whereby end portions of the wirings 451 to 453 are almost aligned with end portions of the impurity semiconductor layers 423 and 424.

Next, dry etching is preferably performed after the resist mask is removed. A condition of dry etching is set so that exposed regions of the layers including an amorphous semiconductor 469 and 470 are not damaged and the etching rate with respect to the layers including an amorphous semiconductor 469 and 470 is low. In other words, a condition which gives almost no damages to surfaces of the exposed regions of the semiconductor layers including an amorphous semiconductor 469 and 470 and hardly reduces the thicknesses of the exposed regions of the layers including an amorphous semiconductor 469 and 470 is applied. As an etching gas, $Cl_2$, $CF_4$, $N_2$, or the like is used. There is no particular limitation on an etching method and an inductively coupled plasma (ICP) method, a capacitively coupled plasma (CCP) method, an electron cyclotron resonance (ECR) method, or a reactive ion etching (RIE) method, or the like can be used.

Next, the surfaces of the layers including an amorphous semiconductor 469 and 470 may be irradiated with water plasma, ammonia plasma, nitrogen plasma, or the like.

Water plasma treatment can be performed in such a manner that a gas including water typified by water vapor ($H_2O$ vapor) as its main component is introduced into a reaction space to generate plasma.

As described above, after the layers including an amorphous semiconductor 469 and 470 are formed, dry etching is performed under a condition where the layers including an amorphous semiconductor 469 and 470 are not damaged, whereby impurities such as residues on the layers including an amorphous semiconductor 469 and 470 can be removed. Further, after dry etching, water plasma treatment is performed, whereby residues of the resist mask can also be removed. By water plasma treatment, insulation between the source region and the drain region can be secured, and thus, in a thin film transistor which is completed, off current can be reduced, and variation in electrical characteristics can be reduced.

Figure 15C:
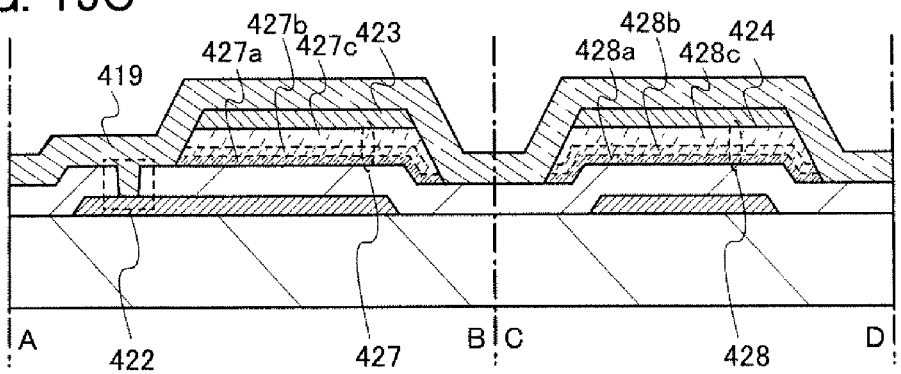
Figure 15D:
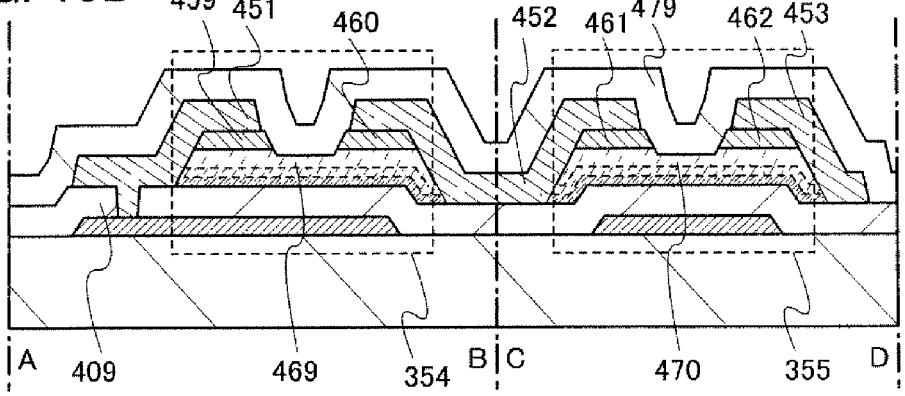
Figure 16A:
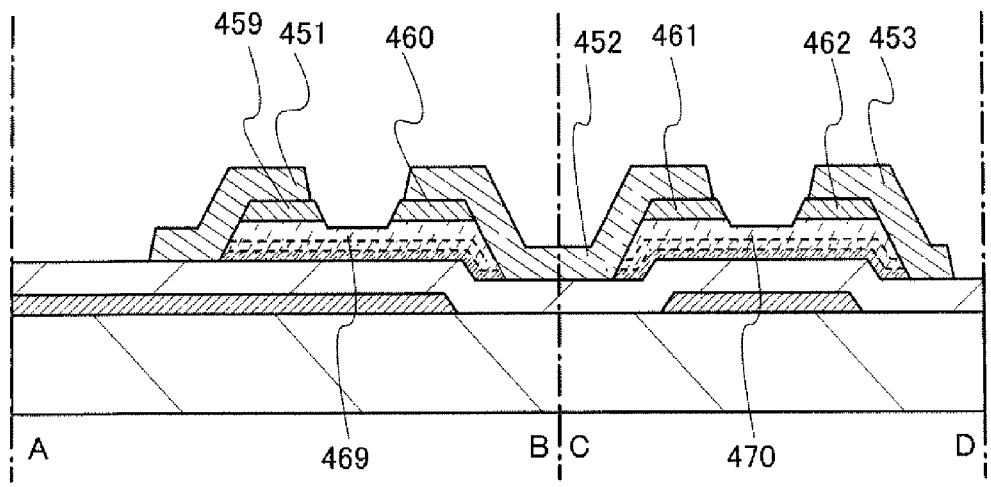
FIGS. 16A and 16B are cross-sectional views illustrating a method for manufacturing a display device according to an embodiment of the present invention.
Figure 16B:
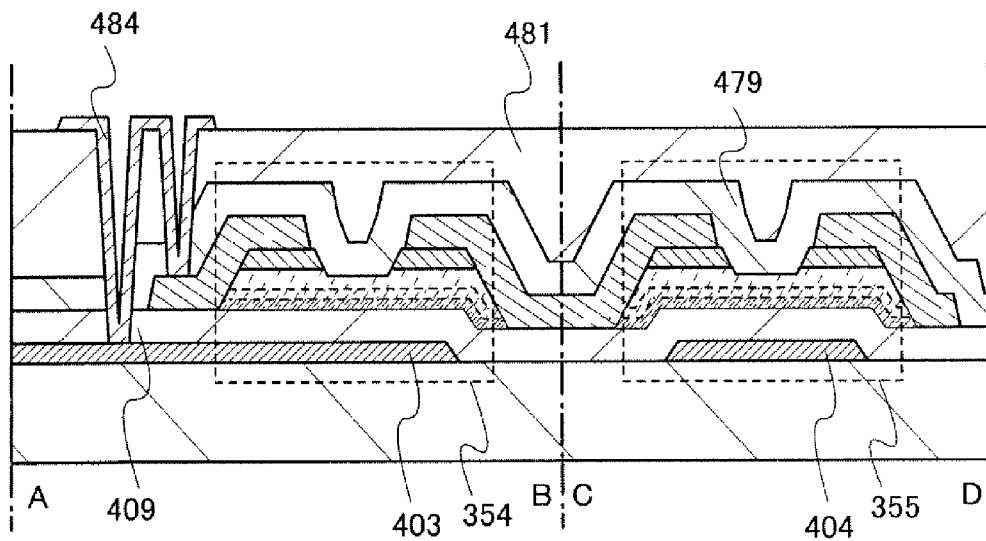

Next, the insulating layer 479 is formed (see FIG. 15D).

The insulating layer 479 can be formed in a manner similar to formation of the gate insulating layer 409.

Through the above-described steps, the thin film transistor can be manufactured. Further, an EEMOS circuit including the TFT 354 and the TFT 355 can be formed. Note that a cross-sectional view taken along lines A-B and C-D of FIG. 15D corresponds to a cross-sectional view taken along lines A-B and C-D of FIG. 9 which is a cross-sectional view of a driver circuit.

A manufacturing process of a driver circuit illustrated in FIG. 12 will be described with reference to FIGS. 15A to 15D and FIGS. 16A and 16B. The driver circuit illustrated in FIG. 12 is different from the driver circuit in FIG. 9 in that the gate electrode 403 and the wiring 451 are not in direct contact with each other, and are electrically connected through a conductive layer.

Through the steps illustrated in FIGS. 15A to 15C, after the second semiconductor layers 427 and 428 and the impurity semiconductor layers 423 and 424 are formed over the gate insulating layer 409, the conductive layer 419 is formed. Note that, here, before the conductive layer 419 is formed, a contact hole exposing the gate electrode 403 is not formed in the gate insulating layer 409.

Next, with use of a resist mask formed by a photolithography step, the conductive layer 419 is etched to form the wirings 451 to 453. Next, each of the impurity semiconductor layers 423 and 424 and the layers including an amorphous semiconductor 427c and 428c is partially etched, whereby the impurity semiconductor layers 459 to 462 functioning as source and drain regions and the layers including an amorphous semiconductor 469 and 470 which function as field-effect relaxation buffer layers are formed (see FIG. 16A).

Next, the insulating layer 479 is formed, and then, the insulating layer 481 is formed. Since the insulating layer 481 functions as a planarization layer, the insulating layer 481 is preferably provided; however, it is not necessarily provided.

Next, with use of a resist mask formed by a photolithography step, the insulating layer 481 and the insulating layer 479 are etched to form contact holes. Next, the wiring 484 connecting the gate electrode 403 and the wiring 451 is formed. Since the wiring 484 can be formed at the same time as formation of a pixel electrode in a pixel portion which will be described in Embodiment 4, the wiring 484 which connects the gate electrode 403 and the wiring 451 can be formed without addition of the number of photomasks. Note that, in the case where a photosensitive resin is used for the insulating layer 481, the insulating layer 481 is exposed to light and developed, whereby openings can be formed in the insulating layer 481. The insulating layer 479 and the gate insulating layer 409 are etched using the insulating layer 481 including the openings as a mask, so that contact holes can be formed.

Through the above-described steps, the thin film transistor can be manufactured. Further, an EEMOS circuit including the TFT 354 and the TFT 355 can be formed. Note that a cross-sectional view taken along lines A-B and C-D of FIG. 16D corresponds to a cross-sectional view taken along lines A-B and C-D of FIG. 11 which is a plane view of a driver circuit.

Next, a manufacturing process of a driver circuit will be described with reference to FIGS. 14A and 14B and FIGS. 15A to 15D. The driver circuit illustrated in FIGS. 14A and 14B is different from the driver circuit in FIG. 9 in that the area of the microcrystalline semiconductor layer 427a is smaller than that of the gate electrode 403, the wirings 451 and 452 are not in contact with the microcrystalline semiconductor layer 427a, the mixed layer 427b, and the layer including an amorphous semiconductor 469, the area of the microcrystalline semiconductor layer 428a is smaller than that of the gate electrode 404, and the wirings 453 and 454 are not in contact with the microcrystalline semiconductor layer 428a, the mixed layer 428b, and the layer including an amorphous semiconductor 470. In addition, the driver circuit illustrated in FIGS. 14A and 14B is different from the driver circuit in FIG. 9 in that the source electrode and the source wiring are separated from each other.

Through the steps illustrated in FIGS. 15A to 15C, after the second semiconductor layers 427 and 428 and the impurity semiconductor layers 423 and 424 are formed over the gate insulating layer 409, the conductive layer 419 is formed. Note that, here, before the conductive layer 419 is formed, a contact hole exposing the gate electrode 403 is not formed in the gate insulating layer 409.

Next, with use of a resist mask formed by a photolithography step, the conductive layer 419 is etched to form the wirings 451 to 456. Note that, in this step, the wirings 451, 452, 454, and 453 are formed only on top surfaces of the impurity semiconductor layers 459, 460, 461, and 462, respectively. Further, the wirings 455 and 456 separated from the wirings 451 to 454 are formed over the gate insulating layer 409 (see FIGS. 14A and 14B).

Next, through the step of FIG. 15D, the impurity semiconductor layers 459 to 462 functioning as source and drain regions, and the layers including an amorphous semiconductor 469 and 470 which function as field-effect relaxation buffer layers are formed.

Next, the insulating layer 479 is formed, and then, the insulating layer 481 is formed. Next, with use of a resist mask formed by a photolithography step, the insulating layers 481 and 479 are etched to form contact holes. Next, the wiring 484a which connects the gate electrode 403 and the wiring 451, the wiring 484b which connects the wiring 452 and the wiring 455, the wiring 484c which connects the wiring 454 and the wiring 455, and the wiring 484d which connects the wiring 453 and the wiring 456 are formed.

Through the above-described steps, the thin film transistor can be manufactured. Further, an EEMOS circuit including the TFT 354 and the TFT 355 can be formed. The TFT 354 in FIG. 14A has a structure in which respective areas of the microcrystalline semiconductor layer 427a, the mixed layer 427b, and the layer including an amorphous semiconductor 469 are smaller than the area of the gate electrode 403, and the microcrystalline semiconductor layer 427a, the mixed layer 427b, and the layer including an amorphous semiconductor 469 are provided on the inner side of the gate electrode 403; while the TFT 355 in FIG. 14B has a structure in which respective areas of the microcrystalline semiconductor layer 428a, the mixed layer 428b, and the layer including an amorphous semiconductor 470 are smaller than the area of the gate electrode 404, and the microcrystalline semiconductor layer 428a, the mixed layer 428b, and the layer including an amorphous semiconductor 470 are provided on the inner side of the gate electrode 404. Therefore, the microcrystalline semiconductor layers 427a and 428a, the mixed layers 427b and 428b, and the layers including an amorphous semiconductor 469 and 470 are not irradiated with light of a backlight of a liquid crystal display device, and increase in off current can be suppressed. Further, in the case where the microcrystalline semiconductor layers 427a and 428a are in contact with a wiring, when voltage is applied to the gate electrodes 403 and 404, Schottky junction is formed between the microcrystalline semiconductor layers 427a and 428a and the wiring, and leakage current flows; however, in FIGS. 14A and 14B, the TFT 354 has a structure in which the microcrystalline semiconductor layer 427a is not in contact with the wirings 451 and 452, and the TFT 355 has a structure in which the microcrystalline semiconductor layer 428a is not in contact with the wirings 453 and 454. Accordingly, leakage current can be reduced; thus, off current of the TFT can be reduced.

Note that after the contact hole 422 illustrated in FIG. 15C is formed and before the conductive layer 419 is formed, reverse sputtering where an argon gas is introduced and plasma is generated is preferably performed to remove dust attached to a surface of the gate insulating layer 409, surfaces of the impurity semiconductor layers 423 and 424, and a bottom surface of the contact hole 422. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

Note that the contents described in each drawing in this embodiment can be freely combined with or replaced with the contents described in any of the other embodiments as appropriate.

According to this embodiment, a driver circuit including thin film transistors having the same conductivity type can be formed in a display device; thus, manufacturing cost of the display device can be reduced, and display characteristics of an image can be improved. Since a driver circuit is formed using an EEMOS circuit, a display device consuming lower power can be manufactured.

Further, a thin film transistor in which a microcrystalline semiconductor is used for a channel formation region has higher field effect mobility, higher on current, and superior electrical characteristics as compared with a thin film transistor in which amorphous silicon is used for a channel formation region; therefore, the area occupied by thin film transistors in a driver circuit can be reduced without deterioration in performance. Accordingly, the frame size of a display device can be narrowed.

Embodiment 2

In the above embodiment, one example of a shift register formed using a static circuit as a shift register in a driver circuit of a display device is described. In this embodiment, one example of a driver circuit including a shift register formed using a dynamic circuit will be described.

A structure of a pulse output circuit included in a shift register formed using a dynamic circuit will be described with reference to FIGS. 17A to 17D. A pulse output circuit 1400 illustrated in FIG. 17A includes, as one example, an inverter circuit 1401 to which a start pulse SP is input from an input terminal, a switch 1402 whose one terminal is connected to an output terminal of the inverter circuit 1401, and a capacitor 1403 which is connected to the other terminal of the switch 1402. Note that on/off of the switch 1402 of the pulse output circuits of odd-numbered stages is controlled by the first clock signal (CLK1). Further, on/off of the switch 1402 of the pulse output circuits of even-numbered stages is controlled by the second clock signal (CLK2).

Figure 17A:
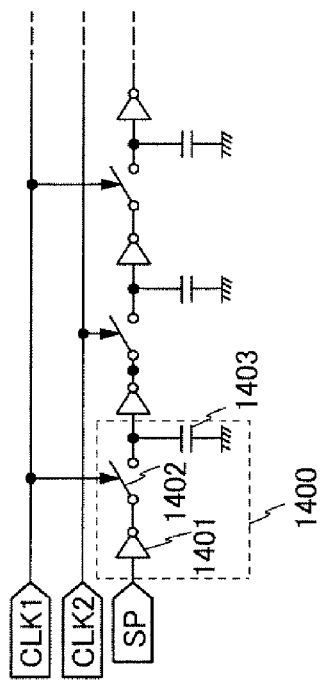
FIGS. 17A to 17D are diagrams illustrating a display device according to an embodiment of the present invention.
Figure 17C:
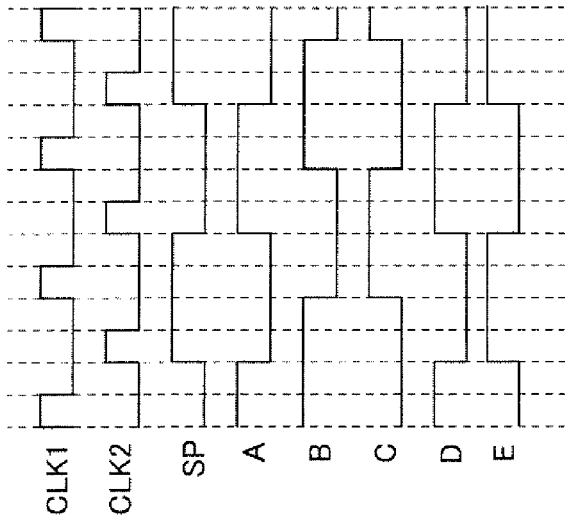
Figure 17D:
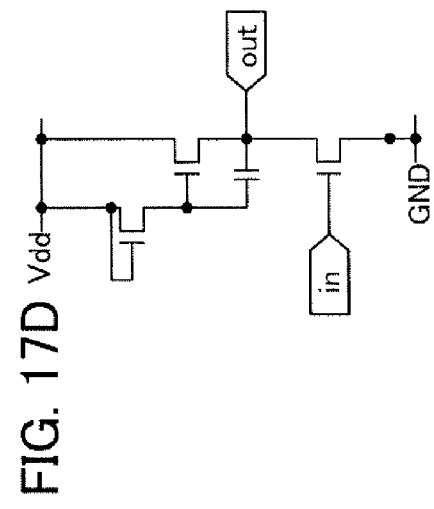
Figure 17B:
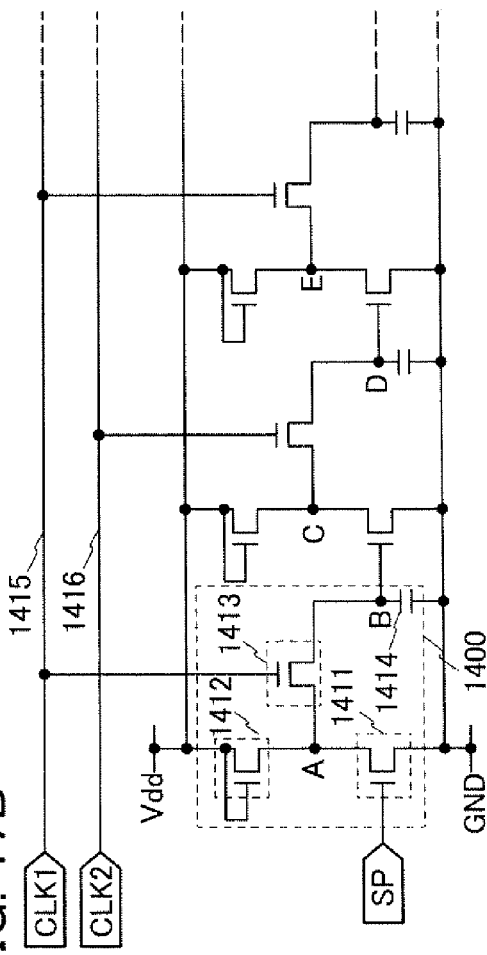

FIG. 17B illustrates a circuit configuration of a pulse output circuit in detail. The pulse output circuit 1400 includes a TFT 1411, a TFT 1412, a TFT 1413, and a capacitor 1414. The pulse output circuits of odd-numbered stages are connected to a wiring 1415 for supplying the first clock signal CLK1, and the pulse output circuits of even-numbered stages are connected to a wiring 1416 for supplying the second clock signal CLK2. In the pulse output circuit 1400, the TFT 1411 and the TFT 1412 correspond to the inverter circuit 1401 in FIG. 17A, and the inverter circuit 1401 is constituted by an EEMOS circuit. The TFT 1413 corresponds to the switch 1402 illustrated in FIG. 17A. The capacitor 1414 corresponds to the capacitor 1403 illustrated in FIG. 17A. Note that the TFT 1413 is preferably an enhancement type transistor in the same manner as the TFT 1411 and the TFT 1412. By using an enhancement type transistor as a switch, off current of a transistor can be reduced; therefore, power consumption can be reduced, and a manufacturing process can be simplified.

FIG. 17C is a timing chart illustrating an operation of the circuit illustrated in FIGS. 17A and 17B. Note that, in FIG. 17C, references A to E are used for showing nodes in the circuit in FIG. 17B for description. First, the start pulse SP is input to the TFT 1411, and an inverted signal of the start pulse SP is obtained at a node A. A signal of the node A transfers to a node B when the first clock signal CLK1 is at H level, and the signal of the node A is reflected to and obtained at the node B. Then, the signal of the node B is inverted by an inverter circuit, and the inverted signal of the node B is obtained at a node C. The signal of the node C is not obtained at a node D because the second clock signal CLK2 is at L level and a switch is turned off. Next, when the first clock signal CLK1 is at L level and the second clock signal CLK2 is at H level, the signal of the node C transfers to the node D, and the signal of the node C is reflected to and obtained at the node D. Then, the signal of the node D is inverted by an inverter circuit, and the inverted signal of the node D is obtained at a node E. Then, the first clock signal CLK1 and the second clock signal CLK2 are at H level alternately, so that the circuit illustrated in FIGS. 17A and 17B can function as a shift register.

Note that, in the example of the circuit configuration of a pulse output circuit described with reference to FIG. 17B, a potential of the output signal may be lowered by a threshold voltage of a transistor. Therefore, the inverter circuit using a bootstrap method illustrated in FIG. 17D constitutes a pulse output circuit, whereby the pulse output circuit can function as a shift register without the potential of the signal being lowered.

Figure 18A:
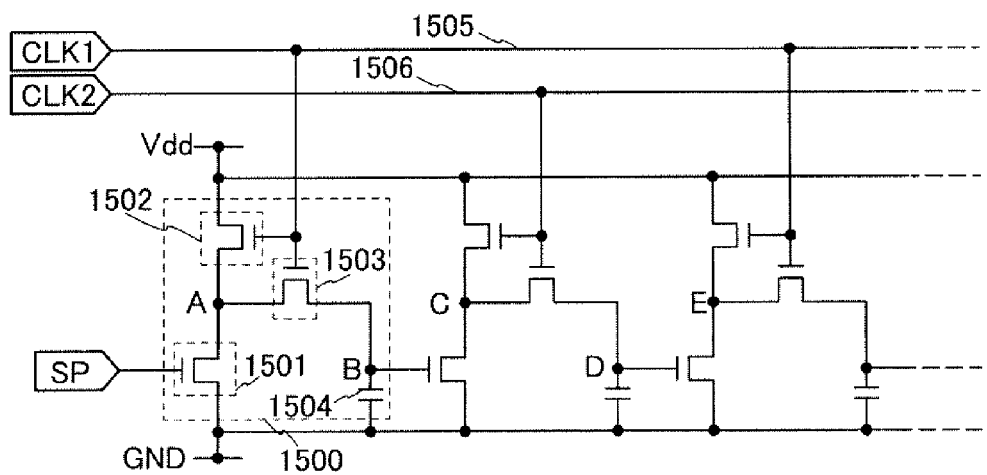
FIGS. 18A and 18B are diagrams illustrating a display device according to an embodiment of the present invention.

A structure which is different from FIG. 17B is shown in FIG. 18A. A pulse output circuit 1500 illustrated in FIG. 18A includes a TFT 1501, a TFT 1502, a TFT 1503, and a capacitor 1504. The pulse output circuits of odd-numbered stages are connected to a wiring 1505 for supplying the first clock signal CLK1, and the pulse output circuits of even-numbered stages are connected to a wiring 1506 for supplying the second clock signal CLK2. In the pulse output circuit 1500, the TFT 1501 and the TFT 1502 correspond to the inverter circuit 1401 in FIG. 17A, and the inverter circuit 1401 is constituted by an EEMOS circuit. The TFT 1503 corresponds to the switch 1402 illustrated in FIG. 17A. The capacitor 1504 corresponds to the capacitor 1403 illustrated in FIG. 17A. Note that the TFT 1503 is preferably an enhancement type transistor in the same manner as the TFT 1501 and the TFT 1502. By using an enhancement type transistor as a switch, off current of a transistor can be reduced; therefore, power consumption can be reduced, and a manufacturing process can be simplified.

Figure 18B:
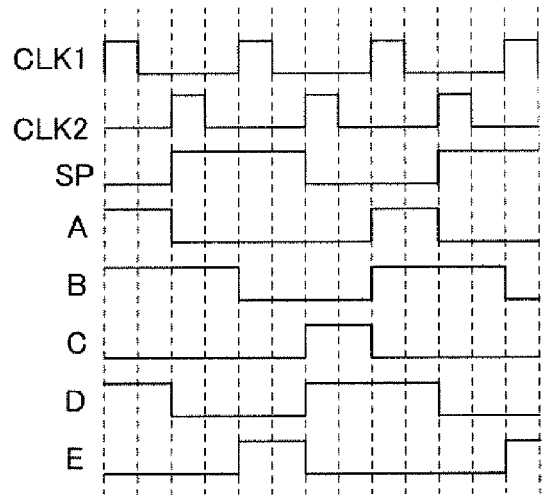

The pulse output circuit in FIG. 18A is different from the pulse output circuit in FIG. 17B in that a gate terminal of the TFT 1502 is connected to the wiring 1505 for supplying the first clock signal CLK1. The pulse output circuit 1500 in FIG. 18A operates in accordance with the timing chart of FIG. 18B as follows. When the first clock signal CLK1 is at H level, both the node A and the node B are at L level if the start pulse SP is at H level, and both the node A and the node B are at H level if the start pulse SP is at L level. Then, when the first clock signal CLK1 is at L level, potential of the node B can be held. In other words, on/off of the TFT 1502 is controlled by the first clock signal CLK1, whereby on/off of the TFT 1502 can be controlled to be synchronized with on/off of the TFT 1503. Therefore, current can be reduced that flows between a wiring to which high power supply potential is supplied and a wiring to which low power supply potential is supplied when TFTs constituting an inverter circuit are turned on, so that power consumption can be reduced.

Note that a shift register including a pulse output circuit described in this embodiment can be used for a source line driver circuit and a gate line driver circuit. Note that a structure may be employed in which a signal output from the shift register is output through a logic circuit or the like and a desired signal is obtained.

Note that an inverter circuit forming a dynamic circuit described in this embodiment can be formed using a thin film transistor which is similar to that in Embodiment 1; therefore, a driver circuit constituted by thin film transistors having the same conductivity type can be formed, manufacturing cost of a display device can be reduced, and display characteristics of an image can be improved. Since a driver circuit is formed using an EEMOS circuit, a display device consuming lower power can be manufactured.

Further, a thin film transistor in which a microcrystalline semiconductor is used for a channel formation region has higher field effect mobility, higher on current, and superior electrical characteristics as compared with a thin film transistor in which amorphous silicon is used for a channel formation region; therefore, the area occupied by thin film transistors in a driver circuit can be reduced. Accordingly, the frame size of a display device can be narrowed.

This embodiment can be combined with any of the structures described in other embodiments as appropriate.

Embodiment 3

Figure 19:
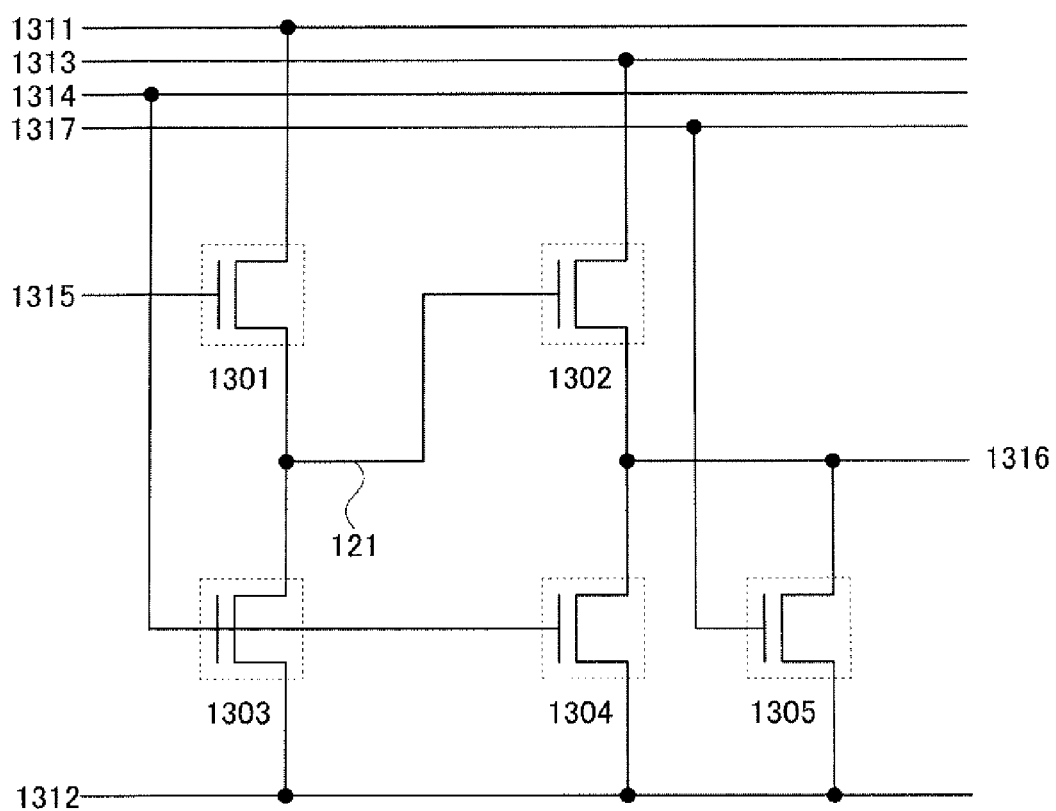
FIG. 19 is a diagram illustrating a display device according to an embodiment of the present invention.

In this embodiment, a basic structure of a shift register of a display device with less variation in a threshold voltage will be described with reference to drawings. FIG. 19 illustrates a flip-flop of one stage (e.g., a first stage), which is one of a plurality of flip-flops included in a shift register.

The flip-flop shown in FIG. 19 includes a first thin film transistor 1301, a second thin film transistor 1302, a third thin film transistor 1303, a fourth thin film transistor 1304, and a fifth thin film transistor 1305. Note that the flip-flop is connected to a first wiring 1311, a second wiring 1312, a third wiring 1313, a fourth wiring 1314, a fifth wiring 1315, a sixth wiring 1316, and a seventh wiring 1317. In this embodiment, the fifth thin film transistor 1305 is an n-channel thin film transistor and is turned on when gate-source voltage (Vgs) exceeds the threshold voltage (Vth). Note that the seventh wiring 1317 may be called a third signal line.

A first terminal (one of a source terminal and a drain terminal) of the first thin film transistor 1301 is connected to the first wiring 1311; a second terminal (the other thereof) of the first thin film transistor 1301 is connected to a gate terminal of the second thin film transistor 1302; and a gate terminal of the first thin film transistor 1301 is connected to the fifth wiring 1315. A first terminal of the third thin film transistor 1303 is connected to the gate terminal of the second thin film transistor 1302; a second terminal of the third thin film transistor 1303 is connected to the second wiring 1312; and a gate terminal of the third thin film transistor 1303 is connected to the fourth wiring 1314. A first terminal of the second thin film transistor 1302 is connected to the third wiring 1313, and a second terminal of the second thin film transistor 1302 is connected to the sixth wiring 1316. A first terminal of the fourth thin film transistor 1304 is connected to the sixth wiring 1316; a second terminal of the fourth thin film transistor 1304 is connected to the second wiring 1312; and a gate terminal of the fourth thin film transistor 1304 is connected to the fourth wiring 1314. A first terminal of the fifth thin film transistor 1305 is connected to the sixth wiring 1316; a second terminal of the fifth thin film transistor 1305 is connected to the second wiring 1312; and a gate terminal of the fifth thin film transistor 1305 is connected to the seventh wiring 1317.

Note that the second terminal of the third thin film transistor 1303, the second terminal of the fourth thin film transistor 1304, and the second terminal of the fifth thin film transistor 1305 are not necessarily connected to the second wiring 1312 and may be connected to different wirings. In addition, the gate terminal of the third thin film transistor 1303 and the gate terminal of the fourth thin film transistor 1304 are not necessarily connected to the fourth wiring 1314 and may be connected to different wirings.

Next, operations of the flip-flop shown in FIG. 19 will be described with reference to a timing chart shown in FIG. 20. Note that a set period A, a selection period B, and a non-selection period in FIG. 20 will be described. Note also that the non-selection period is divided into a first non-selection period C, a second non-selection period D, and a third non-selection period E, and the first non-selection period C, the second non-selection period D, and the third non-selection period E are sequentially repeated.

Note that a potential of V1 is supplied to the first wiring 1311 and a potential of V2 is supplied to the second wiring 1312. Note also that V1>V2 is satisfied.

Further, the potential of V1 is not necessarily supplied to the first wiring 1311. Another potential may be supplied to the first wiring 1311, or a digital signal or an analog signal may be input to the first wiring 1311. Further, the potential of V2 is not necessarily supplied to the second wiring 1312. Another potential may be supplied to the second wiring 1312, or a digital signal or an analog signal may be input to the second wiring 1312.

Note that a signal is input to each of the third wiring 1313, the fourth wiring 1314, and the fifth wiring 1315. The signal input to the third wiring 1313 is a first clock signal; the signal input to the fourth wiring 1314 is a second clock signal; and the signal input to the fifth wiring 1315 is a start signal. In addition, the signal input to each of the third wiring 1313, the fourth wiring 1314, and the fifth wiring 1315 is a digital signal in which a potential of an H-level signal is at V1 (hereinafter also referred to as H level) and a potential of an L-level signal is at V2 (hereinafter also referred to as L level).

Note also that the first clock signal is not necessarily input to the third wiring 1313. Another signal may be input to the third wiring 1313, or a constant potential or current may be input to the third wiring 1313. In addition, the second clock signal is not necessarily input to the fourth wiring 1314. Another signal may be input to the fourth wiring 1314, or a constant potential or current may be input to the fourth wiring 1314. Further, the start signal is not necessarily input to the fifth wiring 1315. Another signal may be input to the fifth wiring 1315, or a constant potential or current may be input to the fifth wiring 1315.

Further, the potential of the H-level signal of the signal input to each of the third wiring 1313, the fourth wiring 1314, and the fifth wiring 1315 is not limited to V1 and the potential of the L-level signal thereof is not limited to V2. The potentials are not particularly limited as long as the potential of the H-level signal is higher than the potential of the L-level signal.

Note that a signal is output from the sixth wiring 116. The signal output from the sixth wiring 1316 is an output signal of the flip-flop and is also a start signal of the flip-flop of the next stage. In addition, the signal output from the sixth wiring 1316 is input to the fifth wiring 1315 of the flip-flop of the next stage. Further, the signal output from the sixth wiring 1316 is a digital signal in which a potential of an H-level signal is at V1 (hereinafter also referred to as H level) and a potential of an L-level signal is at V2 (hereinafter also referred to as L level).

Note that a signal is input to the seventh wiring 1317. The signal input to the seventh wiring 1317 is a third clock signal. In addition, the signal input to the seventh wiring 1317 is a digital signal in which a potential of an H-level signal is at V1 (hereinafter also referred to as H level) and a potential of an L-level signal is at V2 (hereinafter also referred to as L level).

Note also that the third clock signal is not necessarily input to the seventh wiring 1317. Another signal may be input to the seventh wiring 1317, or a constant potential or current may be input to the seventh wiring 1317.

In FIG. 20, a signal 1323 is a signal input to the third wiring 1313; a signal 1324 is a signal input to the fourth wiring 1314; a signal 1325 is a signal input to the fifth wiring 1315; a signal 1326 is a signal output from the sixth wiring 1316; and a signal 1327 is a signal input to the seventh wiring 1317. In addition, a potential 1331 is a potential of the node 121 in FIG. 19.

First, in the set period shown in period A of FIG. 20, the signal 1323 is at L level, the signal 1324 gets into L level, and the signal 1325 is at H level. Therefore, the third thin film transistor 1303 and the fourth thin film transistor 1304 are turned off and the first thin film transistor 1301 is turned on. At this time, the second terminal of the first thin film transistor 1301 corresponds to the source terminal and the potential of the node 121 (the potential 1331) becomes V1-Vth1301 because it becomes a value obtained by subtracting the threshold voltage of the first thin film transistor 1301 (Vth1301) from a potential of the fifth wiring 1315. Thus, the second thin film transistor 1302 is turned on and a potential of the sixth wiring 1316 becomes V2 because it becomes equal to a potential of the third wiring 1313. In this manner, in the set period, L level is output from the sixth wiring 1316 while keeping the second thin film transistor 1302 on in the flip-flop.

In the selection period shown in period B of FIG. 20, the signal 1323 becomes H level, the signal 1324 remains at L level, and the signal 1325 becomes L level. Therefore, the third thin film transistor 1303 and the fourth thin film transistor 1304 remain off and the first thin film transistor 1301 is turned off. At this time, the second terminal of the second thin film transistor 1302 corresponds to the source terminal and the potential of the sixth wiring 1316 starts to rise. Since the node 121 is in a floating state, the potential of the node 121 (the potential 1331) rises at the same time as the potential of the sixth wiring 1316 by capacitive coupling of parasitic capacitance between the gate terminal and the second terminal of the second thin film transistor 1302 (also referred to as a bootstrap operation). Thus, the gate-source voltage Vgs of the second thin film transistor 1302 becomes Vth1302+α (Vth1302 corresponds to the threshold voltage of the second thin film transistor 1302 and cc corresponds to a given positive number) and the potential of the sixth wiring 1316 becomes H level (V1). In this manner, in the selection period, H level can be output from the sixth wiring 1316 by setting the potential of the node 121 to be V1+Vth1302+α in the flip-flop.

In the first non-selection period shown in period C of FIG. 20, the signal 1323 gets into L level, the signal 1324 gets into H level, and the signal 1325 remains at L level. Therefore, the third thin film transistor 1303 and the fourth thin film transistor 1304 are turned on and the first thin film transistor 1301 remains off. The node 121 and the sixth wiring 1316 get into L level because a potential of the second wiring 1312 is supplied to the node 121 and the sixth wiring 1316 through the third thin film transistor 1303 and the fourth thin film transistor 1304, respectively.

In the second non-selection period shown in period D of FIG. 20, the signal 1323 remains at L level, the signal 1324 gets into L level, and the signal 1325 remains at L level. Therefore, the third thin film transistor 1303 and the fourth thin film transistor 1304 are turned off and the first thin film transistor 1301 remains off. Thus, the node 121 and the sixth wiring 1316 remain at L level.

In the third non-selection period shown in period E of FIG. 20, the signal 1323 gets into H level, and the signal 1324 and the signal 1325 remain at L level. Therefore, the first thin film transistor 1301, the third thin film transistor 1303, and the fourth thin film transistor 1304 remain off. Thus, the node 121 and the sixth wiring 1316 remain at L level.

Here, a function of the fifth thin film transistor 1305 is described. The fifth thin film transistor 1305 has a function of selecting timing for supplying the potential of the second wiring 1312 to the sixth wiring 1316 and functions as a switching thin film transistor.

In the flip-flop in FIG. 19, the fifth thin film transistor 1305 is turned on in a set period and a second non-selection period. In addition, the sixth wiring 1316 remains at L level because a potential of the second wiring 1312 is supplied to the sixth wiring 1316 through the fifth thin film transistor 1305.

Note that arrangement, the number, and the like of the thin film transistors are not limited to those of FIG. 19 as long as operations which are similar to those of FIG. 19 are performed. Thus, a thin film transistor, other elements (e.g., a resistor, a capacitor, and the like), a diode, a switch, any logic circuit, and the like may be additionally provided.

As described above, in the flip-flop in FIG. 19, V2 is supplied to the sixth wiring 1316 in the first non-selection period and the second non-selection period from the first non-selection period, the second non-selection period, and the third non-selection period. Therefore, a malfunction of the flip-flop can be further suppressed. This is because V2 is supplied to the sixth wiring 1316 at regular intervals (in the first non-selection period and the second non-selection period) in the non-selection period, and thus a potential of the sixth wiring 1316 can be stabilized at V2.

Further, since the fifth thin film transistor 1305 of the flip-flop in FIG. 19 is turned on only in the set period and the second non-selection period, deterioration in characteristics of the fifth thin film transistor 1305 can be suppressed.

Note that in the flip-flop in FIG. 19, the first thin film transistor 1301, the second thin film transistor 1302, the third thin film transistor 1303, the fourth thin film transistor 1304, and the fifth thin film transistor 1305 are all n-channel thin film transistors. Thus, a manufacturing process can be simplified, so that manufacturing cost can be reduced and a yield can be improved. Further, a display device such as a large display panel can be formed.

Further, since deterioration in characteristics of each thin film transistor can be suppressed in the flip-flop in FIG. 19, a display device such as a long-life display panel can be manufactured.

This embodiment can be combined with any of the structures described in other embodiments as appropriate.

Embodiment 4

In this embodiment, a manufacturing process of a pixel portion in a display device which includes a driver circuit will be described with reference to FIGS. 21A to 21C, FIGS. 22A to 22C, FIGS. 23A and 23B, FIG. 24, FIGS. 25A and 25B, and FIGS. 26A and 26B.

First, a method for manufacturing an element substrate of a display device having a top view structure of a pixel in FIG. 24 will be described with reference to FIGS. 21A to 21C, FIGS. 22A to 22C, and FIGS. 23A and 23B.

First, a gate electrode 1103 and a capacitor wiring 1105 are formed over a substrate 1101 (see FIG. 21A).

As the substrate 1101, the substrate 401 described in Embodiment 1 can be used as appropriate.

For the gate electrode 1103 and the capacitor wiring 1105, the material and formation method of the gate electrodes 403 and 404 described in Embodiment 1 are used as appropriate. In order to improve adhesion between the gate electrode 1103 and the substrate 1101 and between the capacitor wiring 1105 and the substrate 1101, a layer of a nitride of any of the aforementioned metal materials may be provided between the substrate 1101 and the gate electrode 1103 and between the substrate 1101 and the capacitor wiring 1105. Here, a conductive layer is formed over the substrate 1101, and the conductive layer is etched using a resist mask formed using a photomask.

Note that it is preferable that side surfaces of the gate electrode 1103 and the capacitor wiring 1105 have a tapered shape. This is in order to prevent disconnection at a step portion because a semiconductor layer and a wiring layer are to be formed over the gate electrode 1103 in a later step. In order that the side surfaces of the gate electrode 1103 and the capacitor wiring 1105 have a tapered shape, etching may be performed while the resist mask is made to recede. For example, by making an oxygen gas included in an etching gas, etching can be performed while the resist mask is made to recede.

Further, through the step of forming the gate electrode 1103, a gate wiring (a scan line) can also be formed. Note that a "scan line" means a wiring which selects a pixel, while a "capacitor wiring" means a wiring which is connected to one of electrodes of a capacitor in a pixel. However, without limitation thereto, the gate electrode 1103 and one or both of a gate wiring and a capacitor wiring may be formed separately.

Next, a gate insulating layer 1107 and a first semiconductor layer 1109 are formed so as to cover the gate electrode 1103.

For the gate insulating layer 1107, the material and formation method of the gate insulating layer 409 described in Embodiment 1 can be used as appropriate.

The first semiconductor layer 1109 is formed using the first semiconductor layer 410 described in Embodiment 1.

Next, as illustrated in FIG. 21B, a semiconductor layer is formed over the first semiconductor layer 1109 to form a second semiconductor layer 1111. Here, the second semiconductor layer 1111 including a microcrystalline semiconductor layer 1111*a*, a mixed layer 1111*b*, and a layer including an amorphous semiconductor 1111*c* is formed under a condition in which part of the crystal region grows with the first semiconductor layer 1109 as a seed crystal. An impurity semiconductor layer 1115 is formed over the second semiconductor layer 1111.

The second semiconductor layer 1111 is formed using the second semiconductor layer 411 described in Embodiment 1.

The impurity semiconductor layer 1115 is formed using the impurity semiconductor layer 417 described in Embodiment 1.

Next, the second semiconductor layer 1111 and the impurity semiconductor layer 1115 are etched with use of a resist mask formed by a photolithography step using a second photomask, so that a second semiconductor layer 1117 including a microcrystalline semiconductor layer 1117*a*, a mixed layer 1117*b*, and a layer including an amorphous semiconductor 1117*e*, and an impurity semiconductor layer 1121 are formed. After that, the resist mask is removed (see FIG. 21C).

Next, a conductive layer 1123 is formed so as to cover the second semiconductor layer 1117 and the impurity semiconductor layer 1121 (see FIG. 22A).

For the conductive layer 1123, the material and formation method of the conductive layer 419 described in Embodiment 1 can be used as appropriate. Note that, as illustrated in FIG. 15C, before the conductive layer 419 is formed, the contact hole 422 may be formed in the gate insulating layer 409.

Next, with use of a resist mask formed by a photolithography step using a third photomask, the conductive layer 1123 is etched to form wirings 1125 and 1127. Note that the wiring 1127 functions also as a capacitor electrode (see FIG. 22B).

Note that, although not illustrated here, as illustrated in FIG. 15B, in the case where the contact hole 422 is formed in the gate insulating layer 409 before the conductive layer 419 is formed, a source wiring or a drain wiring of the TFT 354 of the driver circuit described in Embodiments 1 and 2 and a gate electrode thereof are directly connected through the same steps as described above.

Next, with use of a resist mask, the impurity semiconductor layer 1121 is partially etched. Here, dry etching is employed. Impurity semiconductor layers 1131 functioning as a source and drain regions are formed through the process up to this step. Note that, in this step, the layer including an amorphous semiconductor 1111*c* is also partially etched. The layer including an amorphous semiconductor 1111*c* which is partially etched is referred to as a layer including an amorphous semiconductor 1133 (see FIG. 22C).

Through the above-described steps, a thin film transistor 1128 and a capacitor 1129 can be manufactured.

The thin film transistor according to this embodiment can be applied to a switching transistor provided in a pixel of a display device typified by a liquid crystal display device, a light-emitting display device, and electronic paper. Therefore, an insulating layer 1137 is formed so as to cover this thin film transistor (see FIG. 23A). The insulating layer 1137 can be formed in a manner similar to formation of the gate insulating layer 1107. Further, it is preferable to provide the insulating layer 1137 using dense silicon nitride such that a contaminant impurity element such as an organic substance, a metal, or water vapor in the air can be prevented from entering through the insulating layer 1137.

Next, a contact hole 1141 is formed in the insulating layer 1137 to reach the wiring 1127. This contact hole 1141 can be formed by partially etching the insulating layer 1137 with use of a resist mask formed by a photolithography method using a fourth photomask. After that, the pixel electrode 1143 which is connected to the wiring 1127 through the contact hole 1141 is provided. FIG. 24 is a plane view of FIG. 23B at this stage.

Further, the pixel electrode 1143 can be formed using indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like.

The pixel electrode 1143 may be etched using a resist mask formed by a photolithography method to be patterned as in the case of the wirings 1125 and 1127 or the like.

Alternatively, the pixel electrode 1143 can be formed using a conductive composition containing a light-transmitting conductive high molecule (also referred to as a "conductive polymer"). The pixel electrode 1143 preferably has a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As a conductive high molecule, a so-called π electron conjugated high molecule can be used. For example, polyaniline and/or a derivative thereof, polypyrrole and/or a derivative thereof, polythiophene and/or a derivative thereof, and a copolymer of two or more kinds of these materials can be given.

Note that although not illustrated, an insulating layer fanned using an organic resin by a spin coating method or the like may be formed between the insulating layer 1137 and the pixel electrode 1143.

After that, in a vertical alignment (VA) liquid crystal display device, in the case of employing a multi-domain vertical alignment mode (so-called MVA mode) in which a pixel is divided into a plurality of portions and the alignment of liquid crystal molecules is made different depending on each portion of the pixel for viewing angle expansion, a protrusion having a predetermined shape is preferably formed over the pixel electrode 1143. The protrusion is formed using an insulating layer.

When the protrusion is formed over the pixel electrode, in the case where voltage is not applied to the pixel electrode, liquid crystal molecules are aligned perpendicularly to a surface of an alignment film; however, liquid crystal molecules in the vicinity of the protrusion are aligned to be inclined slightly to the substrate surface. When the voltage is applied to the pixel electrode, first, the liquid crystal molecules in the vicinity of the protrusion which are aligned to be inclined slightly are inclined. Further, the liquid crystal molecules other than those in the vicinity of the protrusion are also affected by the liquid crystal molecules in the vicinity of the protrusion to be sequentially aligned in the same direction. As a result, stable alignment can be obtained in all the pixels. That is, alignment of the liquid crystal molecules in the entire display portion is controlled based on the protrusion.

Instead of the protrusion provided over the pixel electrode, a slit may also be provided for the pixel electrode. In this case, when voltage is applied to the pixel electrode, electric field distortion is generated near the slit and electric field distribution and alignment of the liquid crystal molecules can be controlled similarly to the case where the protrusion is provided over the pixel electrode.

Through the steps described above, an element substrate that can be used for a display device and that has a thin film transistor with high on current as compared with a thin film transistor in which an amorphous semiconductor is included in a channel formation region and with low off current as compared with a thin film transistor in which a microcrystalline semiconductor is included in a channel formation region can be manufactured.

Next, a method for manufacturing an element substrate of a display device having a top view structure of a pixel in FIG. 27 will be described with reference to FIGS. 25A and 25B and FIGS. 26A and 26B.

Through the steps of FIGS. 21A to 21C and FIG. 22A, the conductive layer 1123 is formed.

Next, with use of the resist mask formed by a photolithography step using the third photomask, the conductive layer 1123 is etched to form wirings 1151, 1153, 1155, and 1157. The wiring 1151 functions as a source line, the wiring 1153 functions as a source electrode, the wiring 1155 functions as a drain electrode, and the wiring 1157 functions as a capacitor electrode (see FIG. 25A).

Next, the impurity semiconductor layer 1121 is partially etched to form the impurity semiconductor layers 1131 functioning as a source and drain regions. Note that, in this step, the layer including an amorphous semiconductor 1117c is also partially etched. The layer including an amorphous semiconductor 1117c which is partially etched is referred to as the layer including an amorphous semiconductor 1133 (see FIG. 25B).

Through the above-described steps, a thin film transistor 1158 and a capacitor 1160 can be manufactured.

Figure 26A:
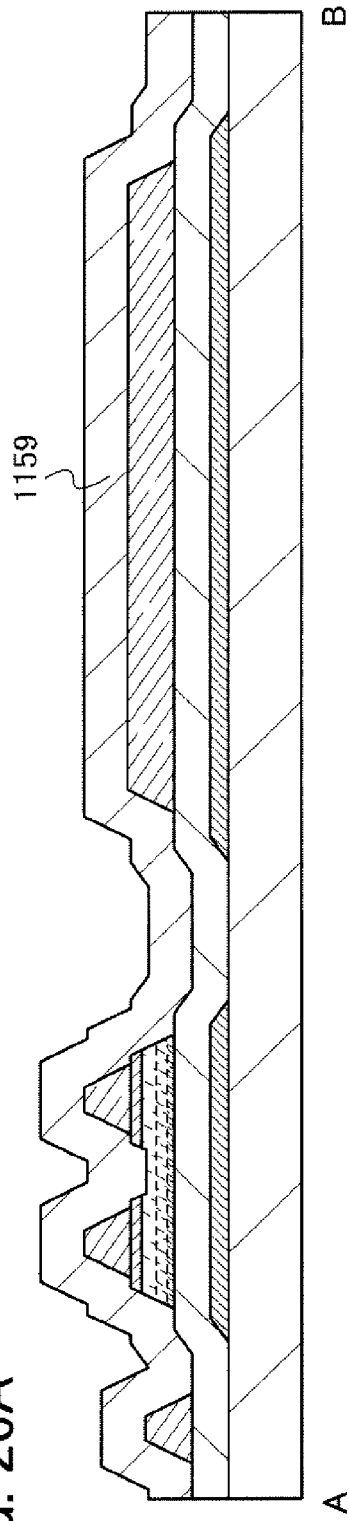
FIGS. 26A and 26B are cross-sectional views illustrating a method for manufacturing a display device according to an embodiment of the present invention.
Figure 26B:
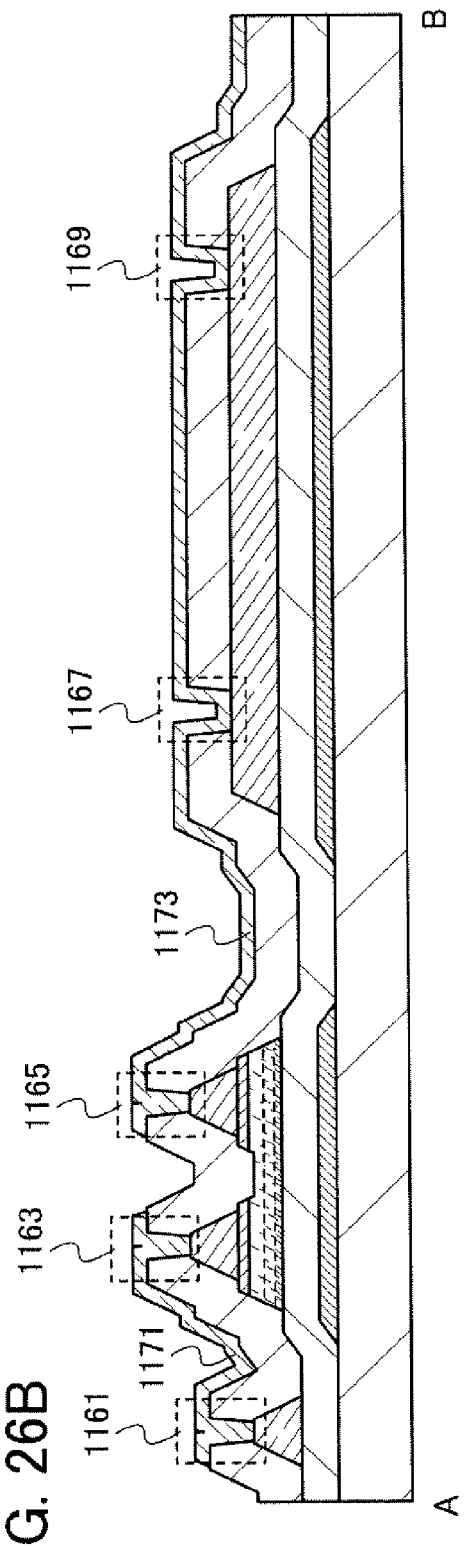

Next, an insulating layer 1159 is formed (see FIG. 26A). The insulating layer 1159 can be formed in a manner similar to formation of the insulating layer 1137.

Next, contact holes 1161, 1163, and 1165 are formed in the insulating layer 1159 to reach the wirings 1151, 1153, and 1155, respectively, and a contact hole 1167 and 1169 are formed in the insulating layer 1159 to reach the wiring 1157. These contact holes 1161, 1163, 1165, 1167, and 1169 can be formed by partially etching the insulating layer 1159 with use of a resist mask formed by a photolithography method using a photomask.

Next, a wiring 1171 connecting the wiring 1151 and the wiring 1153 through the contact holes 1161 and 1163, and a pixel electrode 1173 connecting the wiring 1155 and the wiring 1157 are formed at the same time. Note that, in this step, the wirings 484 and 484a connecting the wiring 451 and the gate electrode 403, the wiring 484b connecting the wiring 452 and the wiring 455, the wiring 484c connecting the wiring 454 and the wiring 455, and the wiring 484d connecting the wiring 453 and the wiring 456 are formed, which are illustrated in FIG. 12 and FIGS. 14A and 14B.

Note that although not illustrated, an insulating layer formed using an organic resin by a spin coating method or the like may be formed between the insulating layer 1159 and the wiring 1171 and between the insulating layer 1159 and the pixel electrode 1173.

Though the steps described above, a thin film transistor serving as a switch in a pixel of a display device can be manufactured. FIG. 27 is a plane view of FIG. 26B at this stage.

The thin film transistor described here has a structure in which leakage current can be reduced as illustrated in FIGS. 14A and 14B; therefore, by using the element substrate for a display device, a display device with high contrast and high image quality can be manufactured.

Further, by use of a resist mask having regions with plural thicknesses (typically, two different thicknesses) which is formed using a multi-tone mask, the number of photomasks can be reduced, resulting in simplified process and lower costs.

FIGS. 28A1 and 28A2 are a cross-sectional view and a top view of a gate wiring terminal portion of the element substrate, respectively. FIG. 28A1 is a cross-sectional view taken along line X1-X2 of FIG. 28A2. In FIG. 28A1, a transparent conductive layer 545 formed over the insulating layers 1137 and 1159 is a connection terminal electrode which functions as an input terminal. Furthermore, in FIG. 28A1, in the terminal portion, a first terminal 540 formed from the same material as the gate wiring and a connection electrode 543 formed from the same material as the source wiring overlap with each other with the gate insulating layer 1107 interposed therebetween so that the first terminal 540 and the connection electrode 543 are electrically connected through the transparent conductive layer 545. In addition, the connection electrode 543 and the transparent conductive layer 545 are in direct contact with each other through a contact hole provided in the insulating layers 1137 and 1159.

Further, FIGS. 28B1 and 28B2 are a cross-sectional view of a source wiring terminal portion and a top view thereof, respectively. FIG. 28B1 is a cross-sectional view taken along line Y1-Y2 of FIG. 28B2. In FIG. 28B1, the transparent conductive layer 545 formed over the insulating layers 1137 and 1159 is a connection terminal electrode which functions as an input terminal. Furthermore, in FIG. 28B1, in the terminal portion, an electrode 547 formed from the same material as the gate wiring is formed below a second terminal 541 electrically connected to the source wiring and overlaps with the second terminal 541 with the gate insulating layer 1107 interposed therebetween. The electrode 547 is not electrically connected to the second terminal 541. When the electrode 547 is set to, for example, floating, GND, or 0 V such that the potential of the electrode 547 is different from the potential of the second terminal 541, a capacitor for preventing noise or static electricity can be formed. The second terminal 541 is electrically connected to the transparent conductive layer 545 through the insulating layers 1137 and 1159.

A plurality of gate wirings, source wirings, and capacitor wirings are provided in accordance with pixel density. In the terminal portion, a plurality of first terminals at the same potential as the gate wiring, second terminals at the same potential as the source wiring, third terminals at the same potential as the capacitor wiring, or the like are arranged. There is no particular limitation on the number of each of the terminals, and the number of the terminals may be determined by a practitioner as appropriate.

In accordance with this embodiment, a pixel including a thin film transistor and a capacitor can be manufactured. The thin film transistor and the capacitor are arranged in matrix in respective pixels so that a pixel portion is formed, whereby an element substrate used as one of substrates for manufacturing an active matrix display device can be manufactured.

When an active matrix liquid crystal display device is manufactured, an element substrate and a counter substrate provided with a counter electrode are bonded to each other with a liquid crystal layer interposed therebetween. Note that a common electrode electrically connected to the counter electrode on the counter substrate is provided over the element substrate, and a terminal electrically connected to the common electrode is provided in the terminal portion. This terminal is a terminal for setting the common electrode at a fixed potential such as GND or 0 V.

Figure 24:
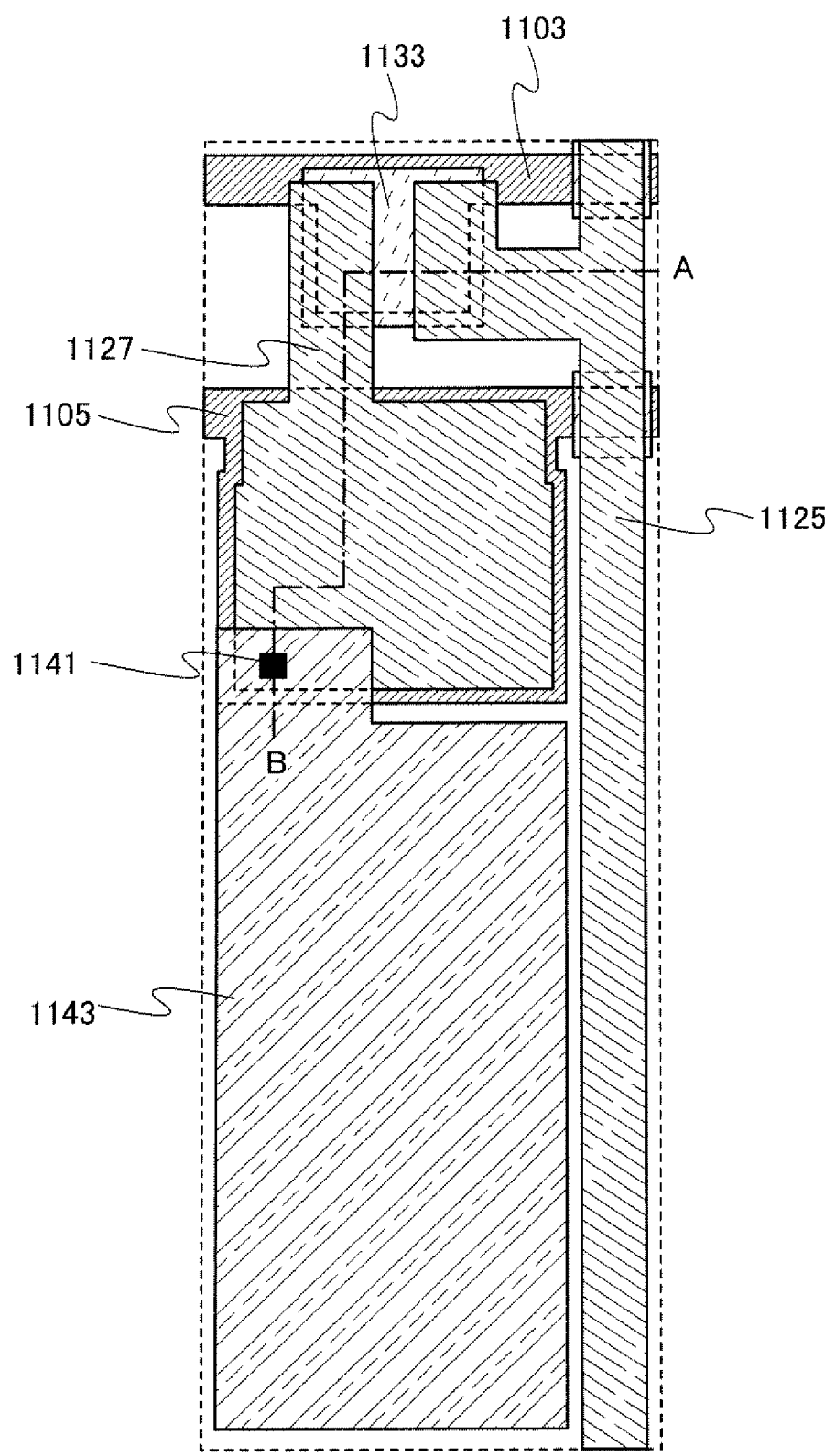
FIG. 24 is a top view illustrating a method for manufacturing a display device according to an embodiment of the present invention.
Figure 27:
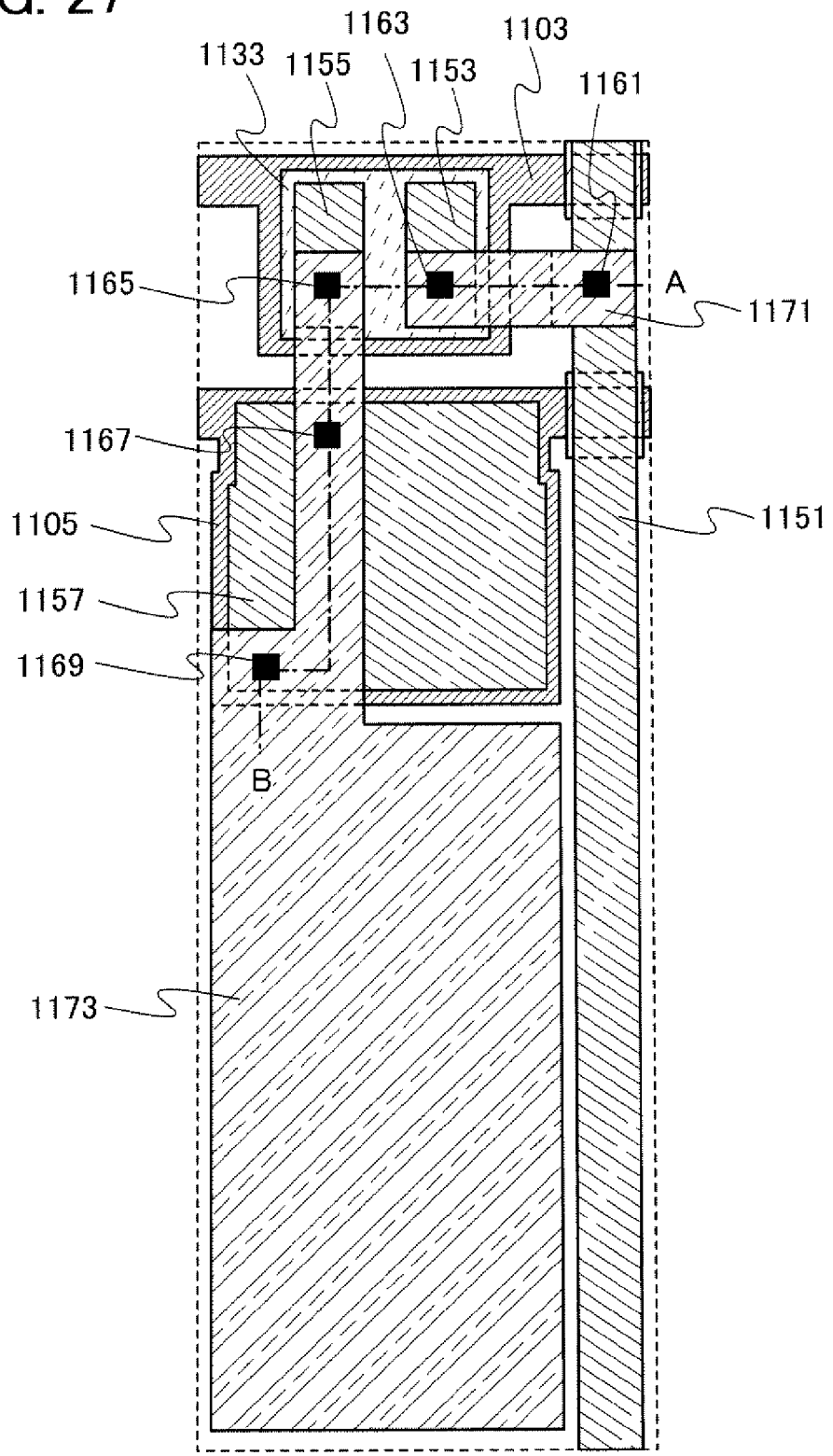
FIG. 27 is a top view illustrating a method for manufacturing a display device according to an embodiment of the present invention.

Further, without being limited to a pixel structure illustrated in FIG. 24 and FIG. 27, a structure may be employed in which a capacitor wiring is not provided and a capacitor is formed using a pixel electrode and a gate wiring of an adjacent pixel which overlap with each other with an insulating film and a gate insulating layer interposed therebetween. In this case, the capacitor wiring can be omitted, whereby the aperture ratio of a pixel can be increased.

In an active matrix liquid crystal display device, display patterns are formed on a screen by driving pixel electrodes arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique which is so-called black insertion by which an entirely black image is displayed every other frame.

Further, there is another driving technique which is so-called double-frame rate driving. In the double-frame rate driving, a vertical synchronizing frequency is set 1.5 times or more, preferably, 2 times or more as high as a usual vertical synchronizing frequency, whereby moving image characteristics are improved.

Furthermore, as a technique for improving moving image characteristics of a liquid crystal display device, there is another driving technique in which, as a backlight, an area light source including a plurality of LED (light-emitting diode) light sources or a plurality of EL light sources is used, and each light source included in the area light source is independently driven so as to perform intermittent lightning in one frame period. As the area light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

Further, by providing light-emitting elements over an element substrate, a light-emitting display device and a light-emitting device can be manufactured. As light-emitting elements used for light-emitting display devices or light-emitting devices, typically, light-emitting elements utilizing electroluminescence can be given. Light-emitting elements utilizing electroluminescence are roughly classified according to whether a light-emitting material is an organic compound or an inorganic compound. In general, the former is referred to as organic EL elements and the latter as inorganic EL elements.

Note that, when a light-emitting display device is manufactured, one electrode (also referred to as a cathode) of a light-emitting element is set to a low power supply potential such as GND or 0 V; therefore, a terminal portion is provided with a terminal for setting the cathode to a low power supply potential such as GND or 0 V. In addition, when a light-emitting display device is manufactured, a power supply line is provided in addition to a source wiring and a gate wiring. Therefore, a terminal portion is provided with a terminal electrically connected to the power supply line.

Further, spherical particles each colored in black or white, or a microcapsule having a diameter of about 10 μm to 200 μm in which transparent liquid, positively or negatively charged white microparticles, and black microparticles charged with the polarity opposite to that of the white microparticles are encapsulated is sandwiched between an element substrate and a counter substrate provided with an electrode, whereby electronic paper can be manufactured.

A thin film transistor forming a pixel of a display device, which is obtained according to this embodiment, can have a long-lasting effect of reducing off current because of an enhancement type transistor. Further, by employing the thin film transistor described in this embodiment, off current can be reduced. Furthermore, by employing the thin film transistor described in this embodiment, on current and field effect mobility can be increased, and electrical characteristics are excellent as compared with the case of employing a thin film transistor in which amorphous silicon is used for a channel region. Therefore, the area occupied by thin film transistors in a driver circuit can be reduced without deterioration in performance. Therefore, a display device, such as a liquid crystal display device, a light-emitting display device, or electronic paper which uses an element substrate described in this embodiment, has favorable image quality (for example, high contrast) and low power consumption, and the frame size thereof can be narrowed.

This embodiment can be combined with any of the structures described in other embodiments as appropriate.

Embodiment 5

In this embodiment, a structure and a manufacturing method of a thin film transistor that can be used in any of Embodiments 1 to 4 will be described with reference to FIG. 29.

FIG. 29 is a cross-sectional view of a thin film transistor according to this embodiment. In the thin film transistor illustrated in FIG. 29, the gate electrode 403 is formed over the substrate 401, the gate insulating layer 409 is formed to cover the gate electrode 403, a microcrystalline semiconductor layer 431 functioning as a channel formation region is formed in contact with the gate insulating layer 409, a pair of buffer layers 433 are formed over the microcrystalline semiconductor layer 431, and the impurity semiconductor layers 459 and 460 functioning as a source and drain regions are formed in contact with the pair of buffer layers 433. The wirings 451 and 452 are formed in contact with the impurity semiconductor layers 459 and 460. The wirings 451 and 452 function as a source and drain electrodes. The wirings 451 and 452 are formed in contact with side surfaces of the microcrystalline semiconductor layer 431 and side surfaces of the pair of buffer layers 433. A first insulating layer 435a is formed on a surface of a second microcrystalline semiconductor layer 431b. Second insulating layers 435c are formed on side surfaces of the pair of buffer layers 433 and surfaces and side surfaces of the impurity semiconductor layers 459 and 460. Third insulating layers 435e are formed on surfaces of the wirings 451 and 452.

A first microcrystalline semiconductor layer 431a in contact with the gate insulating layer 409, and the second microcrystalline semiconductor layer 431b having a plurality of conical or pyramidal protrusions (projections) are formed in the microcrystalline semiconductor layer 431.

The microcrystalline semiconductor layer 431 is formed using a microcrystalline semiconductor which is similar to the microcrystalline semiconductor layers 427a and 428a described in Embodiment 1. The second microcrystalline semiconductor layer 431b can be formed in a manner similar to formation of the microcrystalline semiconductor regions 429a included in the mixed layer 427b described in Embodiment 1.

In a manner similar to formation of the layer including an amorphous semiconductor 469 described in Embodiment 1, the pair of buffer layers 433 can be formed using a well-ordered semiconductor which has a small number of defects and whose tail slope of a level at a band edge in the valence band is steep, as compared with a conventional amorphous semiconductor layer.

The first insulating layer 435a is formed using an oxide layer formed by oxidizing the second microcrystalline semiconductor layer 431b or a nitride layer formed by nitriding the second microcrystalline semiconductor layer 431b.

The second insulating layers 435c are formed using an oxide layer formed by oxidizing the pair of buffer layers 433 and the impurity semiconductor layers 459 and 460 or a nitride layer formed by nitriding the pair of buffer layers 433 and the impurity semiconductor layers 459 and 460.

The third insulating layers 435e are formed using an oxide layer formed by oxidizing the wirings 451 and 452 or a nitride layer formed by nitriding the wirings 451 and 452. Note that the third insulating layers 435c are formed on top surfaces and side surfaces of the wirings 451 and 452 here; however, in some cases, the third insulating layers 435e are formed only on the side surfaces of the wirings 451 and 452 and are not formed on the top surfaces of the wirings 451 and 452.

The buffer layers 433 include an amorphous semiconductor, so the buffer layers 433 impart a weak n-type. In addition, the buffer layers 433 have lower density than the microcrystalline semiconductor layer. Therefore, the second insulating layers 435c formed by oxidizing or nitriding the amorphous semiconductor layer are nondense insulating layers having low density and a low insulating property. However, in the thin film transistor described in this embodiment, the first insulating layer 435a formed by oxidizing the second microcrystalline semiconductor layer 431b is formed on a back channel side. The microcrystalline semiconductor layer has higher density than the amorphous semiconductor layer, so the first insulating layer 435a has also high density and a high insulating property. Further, the second insulating layer 431b has a plurality of conical or pyramidal protrusions (projections), so a surface of the second microcrystalline semiconductor layer 431b has asperity. Therefore, a leak path between the source region and the drain region has a long distance. With such structures, leakage current and off current of the thin film transistor can be reduced.

In the thin film transistor described in this embodiment, a microcrystalline semiconductor layer having a plurality of conical or pyramidal protrusions is used for a channel formation region, and a pair of buffer layers are formed in contact with the microcrystalline semiconductor layer; therefore, on current of the thin film transistor can be increased as compared with a thin film transistor in which an amorphous semiconductor is used for a channel formation region, and off current of the thin film transistor can be decreased as compared with a thin film transistor in which a microcrystalline semiconductor is used for a channel formation region.

Next, a method for manufacturing the thin film transistor of FIG. 29 will be described with reference to FIGS. 30A to 30D.

Figure 30A:
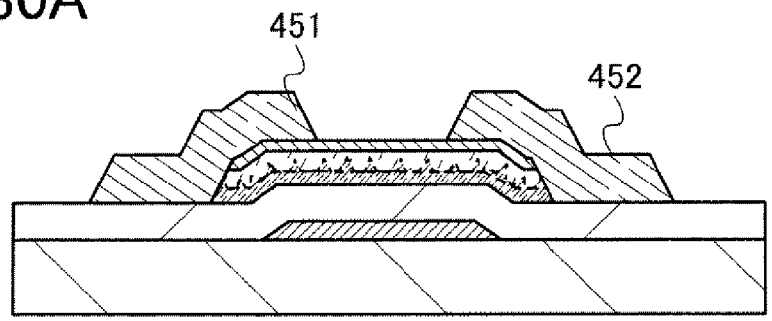
FIGS. 30A to 30D are cross-sectional views illustrating a method for manufacturing a display device according to an embodiment of the present invention.

As in Embodiment 1, through the steps of FIGS. 15A to 15D, the wirings 451 and 452 are formed as illustrated in FIG. 30A.

Figure 30B:
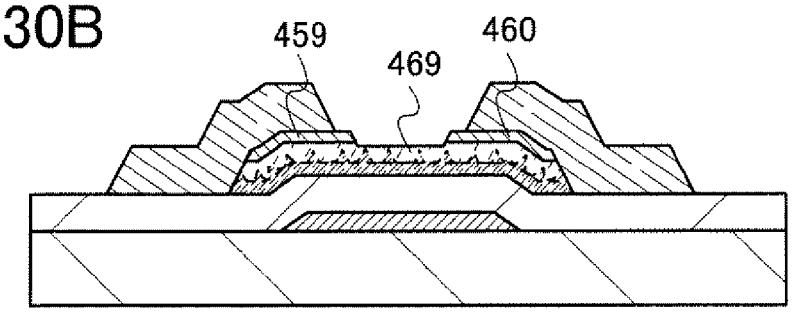

Next, as illustrated in FIG. 30B, the impurity semiconductor layer 423 is etched to form the impurity semiconductor layers 459 and 460. In addition, the layer including an amorphous semiconductor 469 and having depressions on its surface is formed.

Figure 30C:
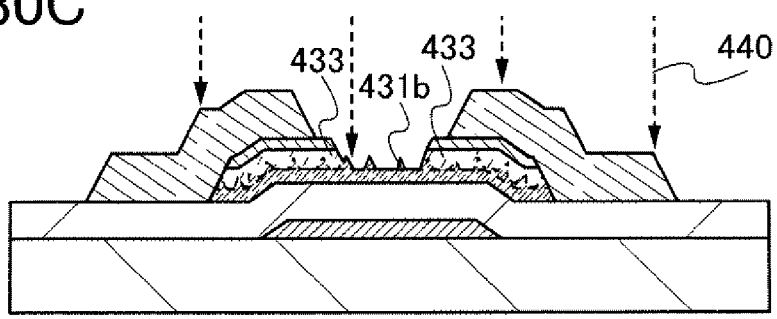

Next, the layer including an amorphous semiconductor 469 is etched to expose the second microcrystalline semiconductor layer 431b and to form the pair of buffer layers 433 (see FIG. 30C). Here, a condition is employed as appropriate under which the layer including an amorphous semiconductor 469 is selectively etched by wet etching or dry etching to expose the second microcrystalline semiconductor layer 431b. As an etchant of wet etching, typically, hydrazine can be given. When dry etching is employed, the amorphous semiconductor layer can be selectively etched using hydrogen.

Figure 30D:
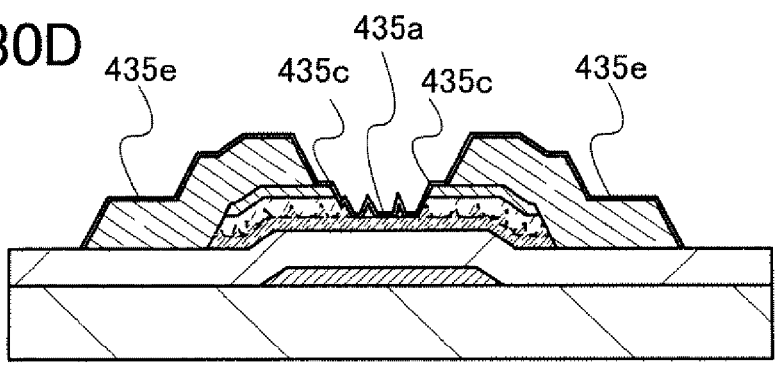

After that, a resist mask is removed, and plasma treatment 440 by which the surface of the second microcrystalline semiconductor layer 431b is oxidized or nitrided is performed, whereby the first insulating layer 435a, the second insulating layers 435c, and the third insulating layers 435e illustrated in FIG. 30D are formed.

Note that, here, after the wirings 451 and 452 are formed, the layer including an amorphous semiconductor 469 is etched to expose the second microcrystalline semiconductor layer 431b. However, the following may be performed: the wirings 451 and 452 are formed; the resist mask is removed; each of the impurity semiconductor layer 423 and the layer including an amorphous semiconductor 469 is partially etched by dry etching; and the plasma treatment 440 by which the surface of the second microcrystalline semiconductor layer 431b is oxidized or nitrided is performed. In that case, since the impurity semiconductor layer 423 and the layer including an amorphous semiconductor 469 are etched using the wirings 451 and 452 as a mask, the side surfaces of the wirings 451 and 452 and the side surfaces of the impurity semiconductor layers 459 and 460 functioning as a source and drain regions are almost aligned with each other.

As described above, after the second microcrystalline semiconductor layer 431b having conical or pyramidal protrusions is exposed, an insulating layer is formed on the surface of the second microcrystalline semiconductor layer 431b by plasma treatment; thus, a leak path between the source region and the drain region can have a long distance, and an insulating layer having a high insulating property can be formed. Therefore, off current of the thin film transistor can be reduced.

This embodiment can be combined with any of the structures described in other embodiments as appropriate.

Embodiment 6

In this embodiment, a structure and a manufacturing method of a thin film transistor that can be used in any of Embodiments 1 to 5 will be described with reference to FIG. 31.

Figure 31:
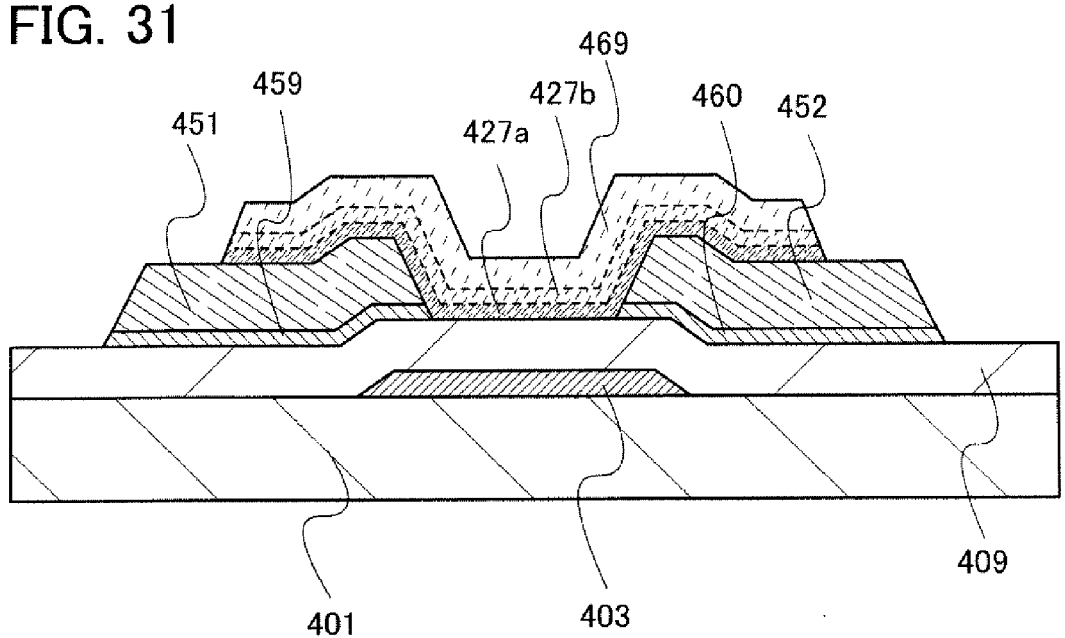
FIG. 31 is a cross-sectional view illustrating a display device according to an embodiment of the present invention.

FIG. 31 is a cross-sectional view of a thin film transistor according to this embodiment. In the thin film transistor illustrated in FIG. 31, the gate electrode 403 is formed over the substrate 401, the gate insulating layer 409 is formed to cover the gate electrode 403, the impurity semiconductor layers 459 and 460 are formed over the gate insulating layer 409, and the wirings 451 and 452 are formed over the impurity semiconductor layers 459 and 460. Further, the microcrystalline semiconductor layer 427a, the mixed layer 427b, and the layer including an amorphous semiconductor 469 are stacked over the gate insulating layer 409 and the wirings 451 and 452.

This embodiment can be combined with any of the structures described in other embodiments as appropriate.

Embodiment 7

In this embodiment, one mode that can be applied to the gate insulating layer 409, the first semiconductor layer 410, the second semiconductor layer 411, and the impurity semiconductor layer 417 which are described in Embodiment 1, Embodiment 5, and Embodiment 6, and the gate insulating layer 1107, the first semiconductor layer 1109, the second semiconductor layer 1110, and the impurity semiconductor layer 1115 which are described in Embodiment 3 will be described.

The gate insulating layer 409, the first semiconductor layer 410, the second semiconductor layer 411, and the impurity semiconductor layer 417 which are described in Embodiment 1, Embodiment 5, and Embodiment 6, and the gate insulating layer 1107, the first semiconductor layer 1109, the second semiconductor layer 1110, and the impurity semiconductor layer 1115 which are described in Embodiment 3 can be formed by a plasma CVD method.

Glow discharge plasma which is used in a plasma CVD method is generated by applying high-frequency power in the HF band with a frequency of 3 MHz to 30 MHz, typically 13.56 MHz or 27.12 MHz, or high-frequency power in the VHF band with a frequency of 30 MHz to about 300 MHz, typically 60 MHz. Alternatively, glow discharge plasma is generated by applying a microwave with a frequency of 1 GHz or more. Note that the deposition rate can be increased by using high-frequency power in the VHF band or a microwave. In addition, by superimposing high-frequency power in the HF band and high-frequency power in the VHF band on each other, plasma can be prevented from being applied with unevenness even over a large-sized substrate, so that uniformity can be improved, and the deposition rate can be increased.

Further, pulse modulation may be performed such that an output waveform with high-frequency power for glow discharge plasma has a rectangular shape. Typically, an on state where a predetermined high-frequency power is applied and an off state where power is not substantially applied are alternately repeated. At this time, the time of the on state and the time of the off state are each set to 5 μsec to 500 μsec, preferably, 10 μsec to 100 μsec, whereby the deposition rate can be increased. In addition, a film thickness and uniformity of a deposition film over a large-sized substrate can be increased. Further, since a radical causing a particle decays in the off state, a particle can be prevented from being generated during deposition. Furthermore, the amount of ultraviolet can be reduced at the time of generation of plasma, whereby defects of a deposition film can be reduced.

The gate insulating layer 409, the first semiconductor layer 410, the second semiconductor layer 411, and the impurity semiconductor layer 417 which are described in Embodiment 1, and the gate insulating layer 1107, the first semiconductor layer 1109, the second semiconductor layer 1110, and the impurity semiconductor layer 1115 which are described in Embodiment 3 may be successively formed in the same treatment chamber in a plasma CVD apparatus. As a result, the size of a plasma CVD apparatus can be reduced.

Alternatively, different treatment chambers may be used for respective layers in a multi-chamber plasma CVD apparatus. Since each film has an optimum temperature for formation, each film is formed in a different reaction chamber, so that formation temperatures can be easily controlled. Furthermore, since the same kind of film can be repeatedly formed, influence of residual impurities can be eliminated.

Further alternatively, the gate insulating layer may be formed in one reaction chamber and the first semiconductor layer 410, the second semiconductor layer 411, and the impurity semiconductor layer 417 may be formed in another reaction chamber. As a result, impurities in the first semiconductor layer 410, the second semiconductor layer 411, and the impurity semiconductor layer 417 can be reduced.

This embodiment can be combined with any of the structures described in other embodiments as appropriate.

Embodiment 8

A display device according to any of the above embodiments can be applied to a variety of electronic devices (including an amusement machine). Examples of electronic devices include a television set (also referred to as a television or a television receiver), a monitor of a computer, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

The electronic paper which is one mode of a display device according to any of the embodiments can be used for electronic devices of a variety of fields as long as they can display data. For example, electronic paper can be applied to an electronic book (e-book) reader, a poster, an advertisement in a vehicle such as a train, displays of various cards such as a credit card, and the like. Examples of the electronic devices are illustrated in FIG. 32A.

Figure 32A:
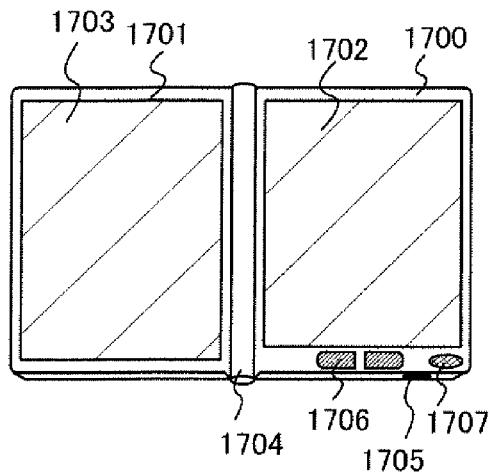
FIGS. 32A to 32D are diagrams each illustrating an electronic device including a display device according to an embodiment of the present invention.

FIG. 32A illustrates an example of an electronic book reader. The electronic book reader illustrated in FIG. 32A includes two housings, a housing 1700 and a housing 1701. The housing 1700 and the housing 1701 are combined with a hinge 1704 so that the electronic book reader can be opened and closed. With such a structure, the electronic book reader can operate like a paper book.

A display portion 1702 and a display portion 1703 are incorporated in the housing 1700 and the housing 1701, respectively. The display portion 1702 and the display portion 1703 may be configured to display one image or different images. In the case where the display portion 1702 and the display portion 1703 display different images, for example, a display portion on the right side (the display portion 1702 in FIG. 32A) can display text and a display portion on the left side (the display portion 1703 in FIG. 32A) can display graphics.

FIG. 32A illustrates an example in which the housing 1700 is provided with an operation portion and the like. For example, the housing 1700 is provided with a power supply input terminal 1705, an operation key 1706, a speaker 1707, and the like. With the operation key 1706, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as a USB cable, or the like), a recording medium insert portion, or the like may be provided on the back surface or the side surface of the housing. Further, the electronic book reader illustrated in FIG. 32A may have a function of an electronic dictionary.

The electronic book reader illustrated in FIG. 32A may be configured to transmit and receive data wirelessly. Through wireless communication, desired book data or the like can be purchased and downloaded from an electronic book server.

Figure 32B:
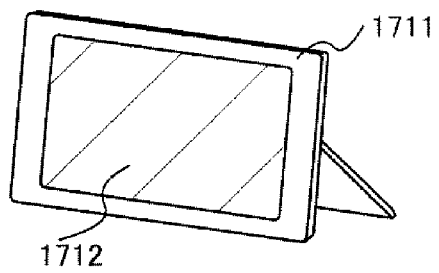

FIG. 32B illustrates an example of a digital photo frame using a display device such as electronic paper, a liquid crystal display device, or a light-emitting display device. For example, in the digital photo frame illustrated in FIG. 32B, a display portion 1712 is incorporated in a housing 1711. The display portion 1712 can display various images. For example, the display portion 1712 can display data of an image taken with a digital camera or the like and function as a normal photo frame.

Note that the digital photo frame illustrated in FIG. 32B is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing data of an image taken with a digital camera is inserted in the recording medium insertion portion of the digital photo frame, whereby the image data can be transferred and then displayed on the display portion 1712.

The digital photo frame illustrated in FIG. 32B may be configured to transmit and receive data wirelessly. The structure may be employed in which desired image data is transferred wirelessly to be displayed.

Figure 32C:
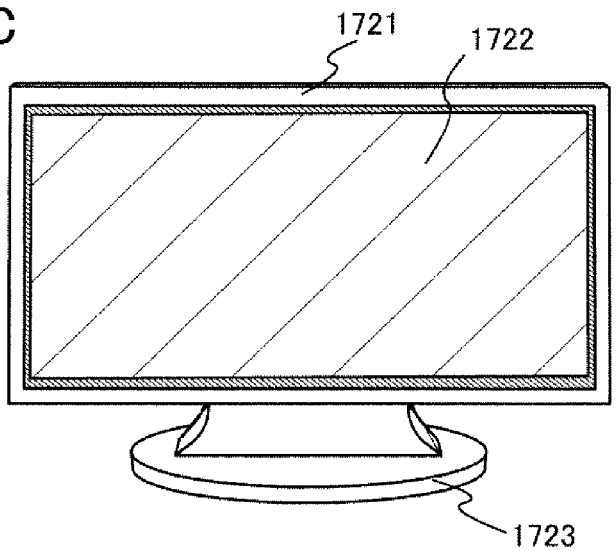

FIG. 32C illustrates an example of a television set in which a display device such as a liquid crystal display device or a light-emitting display device is used. In the television set illustrated in FIG. 32C, a display portion 1722 is incorporated in a housing 1721. The display portion 1722 can display an image. Further, the housing 1721 is supported by a stand 1723 here. The display device described in Embodiment 4 can be applied to the display portion 1722.

The television set illustrated in FIG. 32C can be operated with an operation switch of the housing 1721 or a separate remote controller. Channels and volume can be controlled with an operation key of the remote controller so that an image displayed on the display portion 1722 can be controlled. Further, the remote controller may be provided with a display portion for displaying data output from the remote controller.

Note that the television set illustrated in FIG. 32C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver or between receivers) data communication can be performed.

Figure 32D:
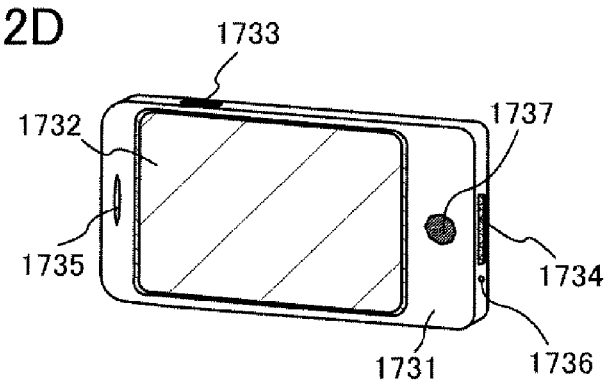

FIG. 32D illustrates an example of a mobile phone handset in which a display device such as electronic paper, a liquid crystal display device, or a light-emitting display device is used. The mobile phone handset illustrated in FIG. 32D is provided with a display portion 1732 incorporated in a housing 1731, an operation button 1733, an operation button 1737, an external connection port 1734, a speaker 1735, a microphone 1736, and the like.

The display portion 1732 of the mobile phone handset illustrated in FIG. 32D is a touchscreen. When the display portion 1732 is touched with a finger or the like, contents displayed on the display portion 1732 can be controlled. Further, operations such as making calls and texting can be performed by touching the display portion 1732 with a finger or the like.

There are mainly three screen modes of the display portion 1732. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1732 so that characters displayed on a screen can be inputted. In that case, it is preferable to display a keyboard or number buttons on a large area of the screen of the display portion 1732.

When a detection device including a sensor for detecting inclination, such as a gyroscope or an acceleration sensor, is provided inside the mobile phone handset illustrated in FIG. 32D, display on the screen of the display portion 1732 can be automatically changed by determining the orientation of the mobile phone handset (whether the mobile phone handset is placed horizontally or vertically for a landscape mode or a portrait mode).

The screen modes are changed by touching the display portion 1732 or using the operation button 1737 of the housing 1731. Alternatively, the screen modes may be changed depending on kinds of images displayed on the display portion 1732. For example, when a signal of an image displayed on the display portion is the one of moving image data, the screen mode is changed to the display mode. When the signal is the one of text data, the screen mode is changed to the input mode.

Further, in the input mode, when input by touching the display portion 1732 is not performed for a certain period while a signal detected by the optical sensor in the display portion 1732 is detected, the screen mode may be controlled so as to be changed from the input mode to the display mode.

The display portion 1732 may function as an image sensor. For example, an image of the palm print, the fingerprint, or the like is taken by an image sensor when the display portion 1732 is touched with a palm or a finger, whereby personal authentication can be performed. Further, by providing a backlight or a sensing light source which emits a near-infrared light in the display portion, an image of a finger vein, a palm vein, or the like can be taken.

This embodiment can be combined with any of the structures described in other embodiments as appropriate.

This application is based on Japanese Patent Application serial no. 2008-315525 filed with Japan Patent Office on Dec. 11, 2008, the entire contents of which are hereby incorporated by reference.

What is claimed is:

1. A display device comprising:
   a driver circuit comprising an inverter circuit including a first thin film transistor and a second thin film transistor, the first thin film transistor and the second thin film transistor each comprising:
      a microcrystalline semiconductor layer on and in contact with a gate insulating layer;
      a layer including an amorphous semiconductor and a microcrystalline semiconductor having a conical or pyramidal shape or a projecting shape on and in contact with the microcrystalline semiconductor layer, the layer having a flat top surface; and
      a pair of impurity semiconductor layers over the layer including the amorphous semiconductor and the microcrystalline semiconductor,
   wherein the first thin film transistor and the second thin film transistor are enhancement type thin film transistors and have a same conductivity type, wherein the first thin film transistor comprises a gate terminal and a first terminal, which are electrically connected to a first power supply line,
wherein the second thin film transistor comprises a gate terminal configured to be supplied with an input signal, a first terminal electrically connected to a second terminal of the first thin film transistor, and a second terminal electrically connected to a second power supply line, and
wherein potential of the first power supply line is higher than potential of the second power supply line.

2. The display device according to claim 1,
wherein the driver circuit comprises a switch comprising a third thin film transistor, and
wherein the third thin film transistor is an enhancement type thin film transistor.

3. The display device according to claim 2,
wherein on/off of the switch is controlled by a clock signal or an inverted clock signal.

4. The display device according to claim 1, further comprising a pixel provided with a fourth thin film transistor configured to be driven by the driver circuit,
wherein the pixel and the driver circuit are formed over a same substrate.

5. The display device according to claim 4,
wherein the substrate is a glass substrate.

6. The display device according to claim 1,
wherein the layer including the amorphous semiconductor and the microcrystalline semiconductor having a conical or pyramidal shape or a projecting shape includes nitrogen.

7. A display device comprising:
a driver circuit comprising an inverter circuit including a first thin film transistor and a second thin film transistor, the first thin film transistor and the second thin film transistor each comprising:
a microcrystalline semiconductor layer on and in contact with a gate insulating layer;
a layer including an amorphous semiconductor and a microcrystalline semiconductor having a conical or pyramidal shape or a projecting shape on and in contact with the microcrystalline semiconductor layer, the layer having a flat top surface; and
a pair of impurity semiconductor layers over the layer including the amorphous semiconductor and the microcrystalline semiconductor,
wherein the first thin film transistor and the second thin film transistor are enhancement type thin film transistors and have a same conductivity type wherein one of the pair of impurity semiconductor layers is in contact with the microcrystalline semiconductor having a conical or pyramidal shape or a projecting shape.

8. The display device according to claim 7,
wherein the first thin film transistor comprises a gate terminal and a first terminal, which are electrically connected to a first power supply line, and
wherein the second thin film transistor comprises a gate terminal configured to be supplied with an input signal, a first terminal electrically connected to a second terminal of the first thin film transistor, and a second terminal electrically connected to a second power supply line, and
wherein potential of the first power supply line is higher than potential of the second power supply line.

9. The display device according to claim 7,
wherein the driver circuit comprises a switch comprising a third thin film transistor, and
wherein the third thin film transistor is an enhancement type thin film transistor.

10. The display device according to claim 9,
wherein on/off of the switch is controlled by a clock signal or an inverted clock signal.

11. The display device according to claim 7, further comprising a pixel provided with a fourth thin film transistor configured to be driven by the driver circuit,
wherein the pixel and the driver circuit are formed over a same substrate.

12. The display device according to claim 11,
wherein the substrate is a glass substrate.

13. The display device according to claim 7,
wherein the layer including the amorphous semiconductor and the microcrystalline semiconductor having a conical or pyramidal shape or a projecting shape includes nitrogen.

14. A display device comprising:
a driver circuit comprising an inverter circuit including a first thin film transistor and a second thin film transistor, the first thin film transistor and the second thin film transistor each comprising:
a microcrystalline semiconductor layer on and in contact with a gate insulating layer;
a layer including an amorphous semiconductor and a microcrystalline semiconductor having a conical or pyramidal shape or a projecting shape on and in contact with the microcrystalline semiconductor layer, the layer having a flat top surface; and
a pair of impurity semiconductor layers over the layer including the amorphous semiconductor and the microcrystalline semiconductor,
wherein the first thin film transistor and the second thin film transistor are enhancement type thin film transistors and have a same conductivity type, and
wherein part of the layer including the amorphous semiconductor and the microcrystalline semiconductor is in contact with an insulating layer provided over the pair of impurity semiconductor layers.

15. The display device according to claim 14,
wherein the first thin film transistor comprises a gate terminal and a first terminal, which are electrically connected to a first power supply line,
wherein the second thin film transistor comprises a gate terminal configured to be supplied with an input signal, a first terminal electrically connected to a second terminal of the first thin film transistor, and a second terminal electrically connected to a second power supply line, and
wherein potential of the first power supply line is higher than potential of the second power supply line.

16. The display device according to claim 14,
wherein the driver circuit comprises a switch comprising a third thin film transistor, and
wherein the third thin film transistor is an enhancement type thin film transistor.

17. The display device according to claim 16,
wherein on/off of the switch is controlled by a clock signal or an inverted clock signal.

18. The display device according to claim 14, further comprising a pixel provided with a fourth thin film transistor configured to be driven by the driver circuit,
wherein the pixel and the driver circuit are formed over a same substrate.

19. The display device according to claim 18,
wherein the substrate is a glass substrate.

20. The display device according to claim 14, wherein the layer including the amorphous semiconductor and the microcrystalline semiconductor having a conical or pyramidal shape or a projecting shape includes nitrogen.

* * * * *